US012604655B2

(12) United States Patent
Weng et al.

(10) Patent No.: US 12,604,655 B2
(45) Date of Patent: Apr. 14, 2026

(54) POLYMER, QUANTUM DOT COMPOSITION AND LIGHT-EMITTING DEVICE EMPLOYING THE SAME

(71) Applicant: INDUSTRIAL TECHNOLOGY RESEARCH INSTITUTE, Hsinchu (TW)

(72) Inventors: Chin-Cheng Weng, Kaohsiung City (TW); Po-Jung Hsu, Taipei City (TW); Han-Cheng Yeh, Taipei City (TW); Yong-Jay Lee, Taipei City (TW); Tzu-Hsing Yang, New Taipei City (TW); Jia-Lun Liou, Zhubei City (TW); Chin-Hui Chou, Zhudong Township (TW); Chun-Neng Ku, Tainan City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1021 days.

(21) Appl. No.: 17/733,441

(22) Filed: Apr. 29, 2022

(65) Prior Publication Data

US 2022/0384728 A1 Dec. 1, 2022

Related U.S. Application Data

(60) Provisional application No. 63/181,426, filed on Apr. 29, 2021.

(51) Int. Cl.
*H01L 51/50* (2006.01)
*C08G 61/12* (2006.01)
(Continued)

(52) U.S. Cl.
CPC ......... *H10K 85/113* (2023.02); *C08G 61/126* (2013.01); *C08G 73/026* (2013.01);
(Continued)

(58) Field of Classification Search
None
See application file for complete search history.

(56) References Cited

U.S. PATENT DOCUMENTS 10,224,483 B2 3/2019 Li et al.
10,581,007 B2 3/2020 Angioni et al.
(Continued)

FOREIGN PATENT DOCUMENTS

CN 103797801 A 5/2014
CN 104903421 A 9/2015
(Continued)

OTHER PUBLICATIONS

Chinese Office Action and Search Report for Chinese Application No. 202210474023.0, dated Jul. 20, 2023.
(Continued)

*Primary Examiner* — Gregory D Clark
(74) *Attorney, Agent, or Firm* — Birch, Stewart, Kolasch & Birch, LLP

(57) ABSTRACT

A polymer, a quantum dot composition, and a light-emitting device employing the same are provided. The polymer includes a first repeat unit that has a structure represented by Formula (I):
(Continued)

10

Formula (I)

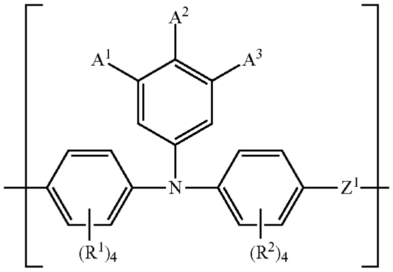

wherein the definitions of $R^1$, $R^2$, $A^1$, $A^2$, $A^3$, and $Z^1$ and n are as defined in the specification.

16 Claims, 1 Drawing Sheet

(51) Int. Cl.

| | |
|---|---|
| ***C08G 73/02*** | (2006.01) |
| ***C09K 11/62*** | (2006.01) |
| ***C09K 11/64*** | (2006.01) |
| ***C09K 11/66*** | (2006.01) |
| ***C09K 11/88*** | (2006.01) |
| ***C09K 11/89*** | (2006.01) |
| ***H10K 50/115*** | (2023.01) |
| ***H10K 85/10*** | (2023.01) |
| *B82Y 20/00* | (2011.01) |
| *B82Y 30/00* | (2011.01) |
| *B82Y 40/00* | (2011.01) |
| *H10K 102/00* | (2023.01) |

(52) U.S. Cl.

CPC .......... *C09K 11/621* (2013.01); *C09K 11/641* (2013.01); *C09K 11/661* (2013.01); *C09K 11/883* (2013.01); *C09K 11/892* (2013.01); *H10K 50/115* (2023.02); *H10K 85/10* (2023.02); *H10K 85/111* (2023.02); *B82Y 20/00* (2013.01); *B82Y 30/00* (2013.01); *B82Y 40/00* (2013.01); *H10K 2102/00* (2023.02)

(56) References Cited

U.S. PATENT DOCUMENTS

| | | | | |
|---|---|---|---|---|
| 2011/0017983 | A1* | 1/2011 | Mizuki ................ | H10K 85/113 528/380 |
| 2016/0254457 | A1 | 9/2016 | Ma et al. | |
| 2019/0359764 | A1 | 11/2019 | Pan et al. | |
| 2020/0123314 | A1 | 4/2020 | Koenemann et al. | |
| 2021/0288258 | A1* | 9/2021 | Tsuji ...................... | C09K 11/06 |

FOREIGN PATENT DOCUMENTS

| | | | | | |
|---|---|---|---|---|---|
| CN | 105315792 | A | | 2/2016 | |
| CN | 106654068 | A | | 5/2017 | |
| CN | 107112438 | A | | 8/2017 | |
| CN | 108003365 | A | | 5/2018 | |
| CN | 109309891 | A | | 2/2019 | |
| CN | 107359264 | B | | 12/2019 | |
| CN | 110590549 | A | | 12/2019 | |
| CN | 110628417 | A | | 12/2019 | |
| CN | 110760056 | A | * | 2/2020 | ............. H01L 51/50 |
| CN | 130760056 | A | | 2/2020 | |
| CN | 110957436 | A | | 4/2020 | |
| CN | 111029474 | A | | 4/2020 | |
| CN | 111117357 | A | | 5/2020 | |
| CN | 112236410 | A | | 1/2021 | |
| CN | 112680211 | A | | 4/2021 | |
| CN | 115246922 | A | | 10/2022 | |
| KR | 10-2018-0076294 | A | | 7/2018 | |
| KR | 20190048098 | A | * | 5/2019 | ............. H01L 51/50 |
| KR | 10-2019-0085461 | A | | 7/2019 | |
| KR | 10-2184715 | B1 | | 11/2020 | |
| TW | I705297 | B | | 9/2020 | |
| TW | 202035651 | A | | 10/2020 | |
| WO | WO 2017/080316 | A1 | | 5/2017 | |
| WO | WO 2020/066510 | A1 | | 4/2020 | |

OTHER PUBLICATIONS

Nakanishi et al., "Active-Matrix QD-LED with Top-Emission Structure by UV-Lithography for RGB Patterning", SID 2020, Session 58-2, Aug. 7, 2020, total 20 pages.

TW Office Action for the corresponding application No. 110115493 issued on Jan. 11, 2022.

Taiwanese Office Action and Search Report fo Taiwanese Application No. 111116531, dated May 9, 2023.

* cited by examiner

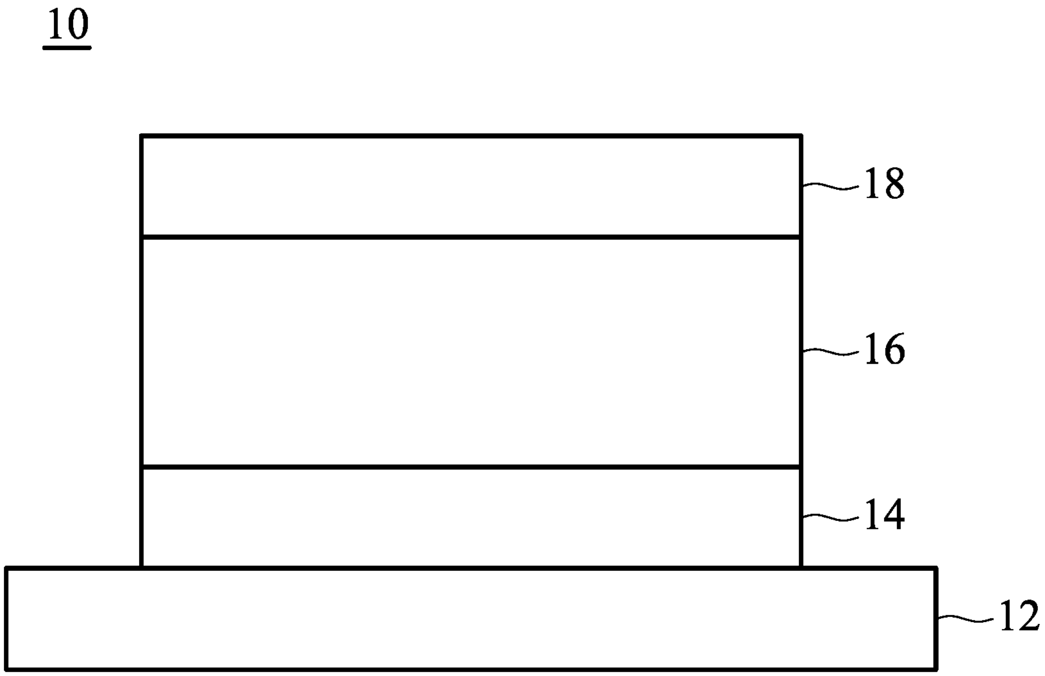
10
18
16
14
12

POLYMER, QUANTUM DOT COMPOSITION AND LIGHT-EMITTING DEVICE EMPLOYING THE SAME

CROSS REFERENCE TO RELATED APPLICATIONS

This application claims the benefit of U.S. Provisional Application No. 63/181,426, filed on Apr. 29, 2021, which is hereby incorporated herein by reference.

TECHNICAL FIELD

The disclosure relates to a polymer, a quantum dot composition and a light-emitting device employing the same.

BACKGROUND

The quantum dot is a material having good light absorption and light-emission properties, and has properties such as a narrow Full-Width-of-Half Maximum (FWHM) value, a high luminous efficiency, a wide absorption spectrum, and high color purity and saturation, and is therefore suitable for application in display panel techniques. For example, light-emitting layers of quantum dot light-emitting diodes (QLED) can be fabricated by using quantum dots as light-emitting materials.

Since quantum dots are not small molecule organic materials, it is impossible for them to form films by evaporation. At present, a quantum dot composition prepared by mixing organic materials with quantum dot materials is used in the industry to form a quantum dot layer. However, in order to increase the dispersion of quantum dot materials in the composition, traditional quantum dot compositions use modified quantum dot materials. However, quantum dot quenching is easily produced by modifying quantum dot materials, resulting in poor luminous efficiency of the display devices.

SUMMARY

According to embodiments of the disclosure, the disclosure provides a polymer, wherein the polymer includes a first repeating unit, wherein the first repeating unit has a structure represented by Formula (I).

Formula (I)

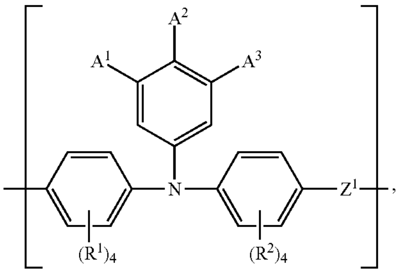

, wherein $A^1$ and $A^3$ are hydrogen; $A^2$ is vinyl,

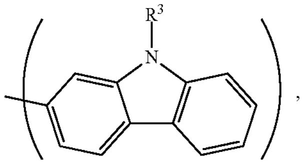

,

-continued

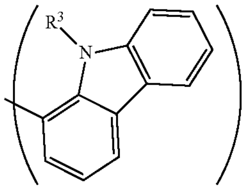

,

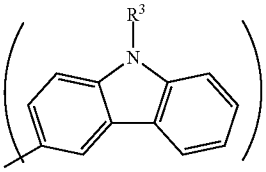

,

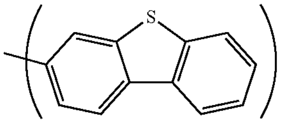

or

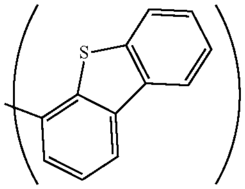

;

$R^1$ and $R^2$ are independently hydrogen, halogen, or $C_{1-2}$ alkyl group; $R^3$ is hydrogen phenyl group, biphenyl group, or naphthyl group; $Z^1$ is

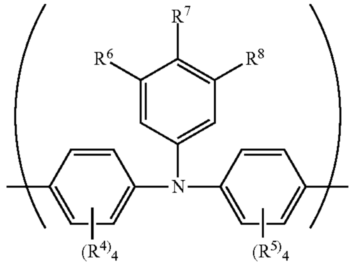

,

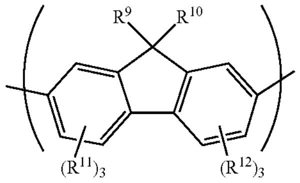

,

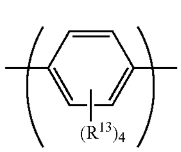

,

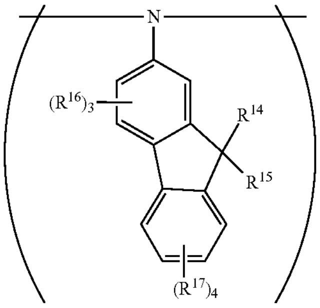

, or

-continued

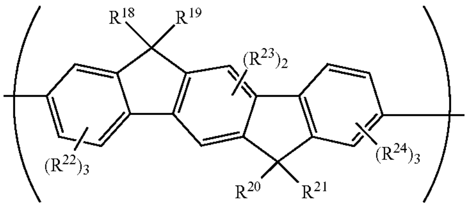

;

$R^4$, $R^5$, $R^{11}$, $R^{12}$, $R^{16}$, $R^{17}$, $R^{22}$, $R^{23}$, and $R^{24}$ are independently hydrogen, halogen, or $C_{1-2}$ alkyl group; $R^6$, $R^7$ and $R^8$ are independently hydrogen,

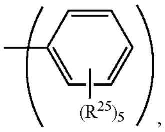

, $C_{3-10}$ alkyl group, or $C_{2-10}$ alkenyl group, and at least one of $R^6$, $R^7$ and $R^8$ is $C_{2-10}$ alkenyl group, or

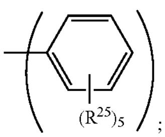

;

$R^9$ and $R^{10}$ are independently $C_{2-10}$ alkenyl group; $R^{13}$ is independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to another embodiment of the disclosure, the disclosure provides a quantum dot composition, includes: 25-80 parts by weight of quantum dot material; 15-70 parts by weight of polymer as claimed in Claims 1-9; and 2-20 parts by weight of crosslinked-monomer, wherein the crosslinked-monomer has at least one $C_{2-8}$ alkenyl group, at least one of acrylate group, or at least one of methacrylate group.

According to another embodiment of the disclosure, the disclosure provides a light-emitting device, and the device include a pair of electrodes; and a light-emitting element, disposed between the electrodes, wherein the light-emitting element includes a layer prepared from the quantum dot composition.

A detailed description is given in the following embodiments.

BRIEF DESCRIPTION OF THE DRAWINGS

FIGURE is a cross-sectional view of the light-emitting device according to an embodiment of the disclosure.

DETAILED DESCRIPTION

Polymer

According to embodiments of the disclosure, the polymer of the disclosure has a specific first repeating unit. The main structure of the first repeating unit may additionally have a fluorene moiety, benzene moiety, 6,12-dihydroindeno[1,2-B]fluorene moiety, or amine moiety having carbazolyl group, besides at least one triarylamine moiety. In addition, the triarylamine moiety main structure of the first repeating unit can also have a dibenzothiophenyl group, or carbazolyl group. As a result, the polymer of the disclosure can serve as charge transport material used in the light-emitting device, enhancing the luminescent efficiency of the light-emitting device. In addition, the main structure of the polymer has at least one terminal vinyl. As a result, the polymer disclosed in the disclosure can be further cross-linked with a crosslinked-monomer with a reaction functional group. Therefore, the quantum dot composition containing the polymer can be used to prepare a patterned film via a lithography process. Furthermore, according to embodiments of the disclosure, the polymer of the disclosure can further have a second repeating unit (wherein the first repeating unit is distinct from the second repeating unit) in order to adjust the optoelectronic properties of the Polymer (such as energy gap (Eg), triplet state energy level ($E_T$), highest occupied molecular orbital (HOMO) energy level, and lowest unoccupied molecular orbital (LUMO) energy level), thereby facilitating the polymer to be suitable for use in concert with other light-emitting material.

According to embodiments of the disclosure, the polymer includes first repeating unit, wherein the first repeating unit has a structure represented by Formula (I)

Formula (I)

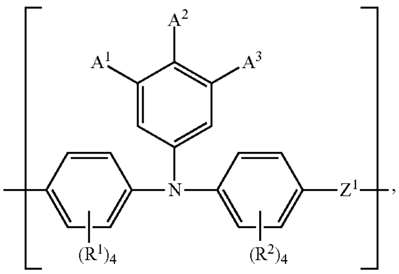

, wherein $A^1$, $A^2$, and $A^3$ are independently hydrogen, vinyl,

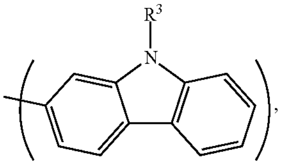

,

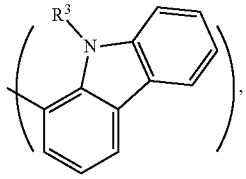

,

-continued

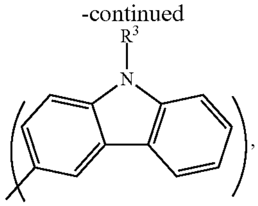

,

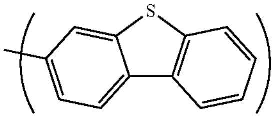

or

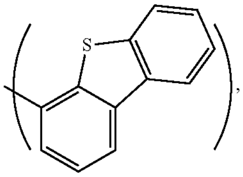

, and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, or naphthyl group; $Z^1$ is

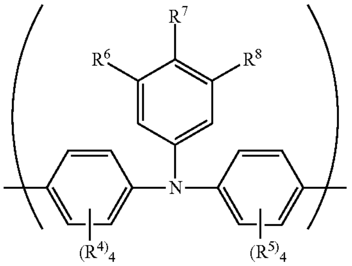

,

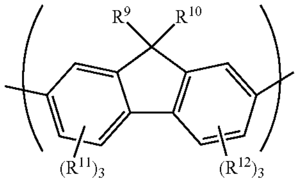

,

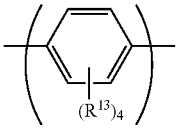

,

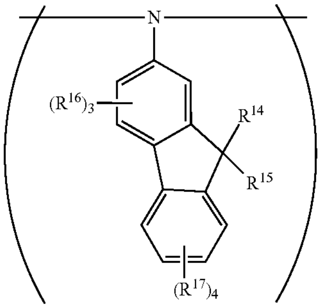

, or

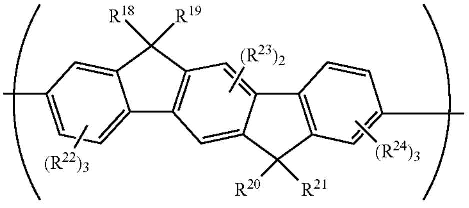

;

$R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$, and $R^8$ are independently hydrogen,

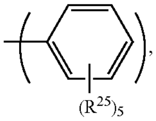

, $C_{3-10}$ alkyl group, or $C_{2-10}$ alkenyl group, and at least one of $R^6$, $R^7$ and $R^8$ is $C_{2-10}$ alkenyl group, or

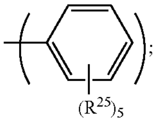

;

$R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, $C_{1-2}$ alkyl group can be methyl or ethyl. According to embodiments of the disclosure, $C_{3-10}$ alkyl group can be a linear or branched alkyl group. For example, $C_{3-10}$ alkyl group can be propyl, butyl, pentyl, hexyl, heptyl, octyl, nonyl, decyl, or isomers thereof. According to embodiments of the disclosure, halogen can be fluorine, chlorine, bromine, or iodine. According to embodiments of the disclosure, $C_{2-10}$ alkenyl group can be a linear or branched alkenyl group. For example, $C_{2-10}$ alkenyl group can be vinyl, propenyl, butenyl, pentenyl, hexenyl, heptenyl, octenyl, nonenyl, decenyl, or isomers thereof.

According to embodiments of the disclosure, $R^1$, $R^2$, $R^4$, $R^5$, $R^{11}$, $R^{12}$, $R^{16}$, $R^{17}$, $R^{22}$, $R^{23}$, and $R^{24}$ can be independently hydrogen, methyl, ethyl, or fluorine. $R^6$, $R^7$, and $R^8$ are independently hydrogen,

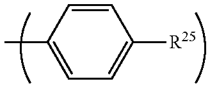

($R^{25}$ is hydrogen, $C_{3-10}$ alkyl group, or $C_{2-10}$ alkenyl group), $C_{3-10}$ alkyl group, or $C_{2-10}$ alkenyl group, and at least one of $R^6$, $R^7$, and $R^8$ is $C_{2-10}$ alkenyl group or

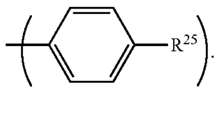

.

$R^9$, $R^{10}$, $R^{13}$, $R^{14}$, $R^{15}$, $R^{18}$, $R^{19}$, $R^{20}$ and $R^{21}$ are independently hydrogen, $C_{3-10}$ alkyl group, or $C_{2-10}$ alkenyl group, and at least one of $R^9$ and $R^{10}$ is $C_{2-10}$ alkenyl group; at least one of $R^{13}$ is $C_{2-10}$ alkenyl group; $R^{14}$ and at least one of $R^{15}$ is $C_{2-10}$ alkenyl group; and at least one of $R^{18}$, $R^{19}$, $R^{20}$, and $R^{21}$ is $C_{2-10}$ alkenyl group.

According to embodiments of the disclosure, the polymer can have at least one $C_{2-10}$ alkenyl group, so that the polymer can further crosslink with a monomer, so that the quantum dot composition of the disclosure can be used to prepare the patterned film in a lithography process.

According to embodiments of the disclosure, the first repeating unit is

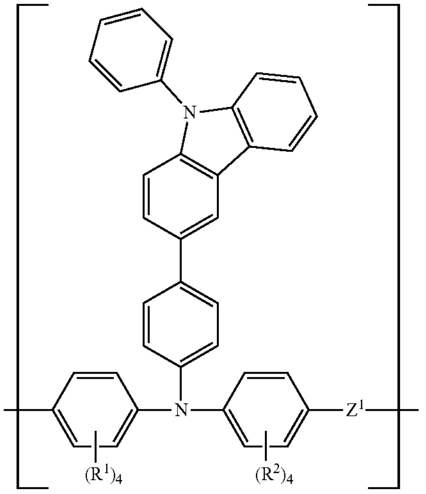

, $Z_1$ is

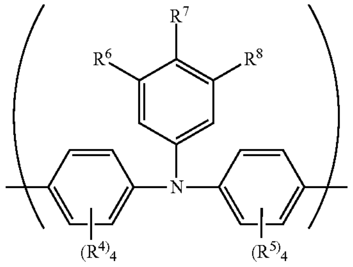

,

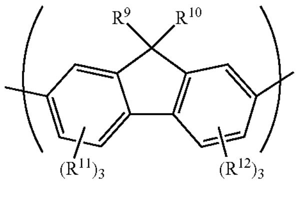

,

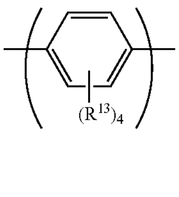

,

-continued

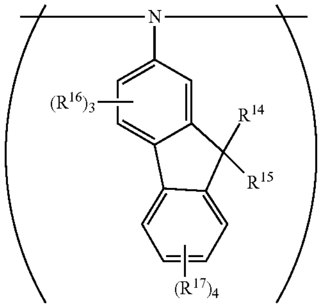

, or

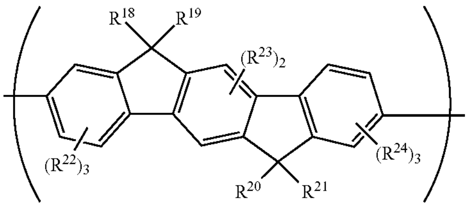

;

$R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$, and $R^{24}$ is are independently hydrogen, halogen, or $C_{1-2}$ alkyl group; $R^6$, $R^7$, and $R^8$ are independently hydrogen,

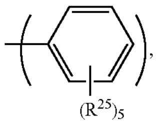

, $C_{3-10}$ alkyl group, or $C_{2-10}$ alkenyl group, and at least one of $R^6$, $R^7$ and $R^8$ is $C_{2-10}$ alkenyl group, or

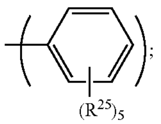

;

$R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit can be
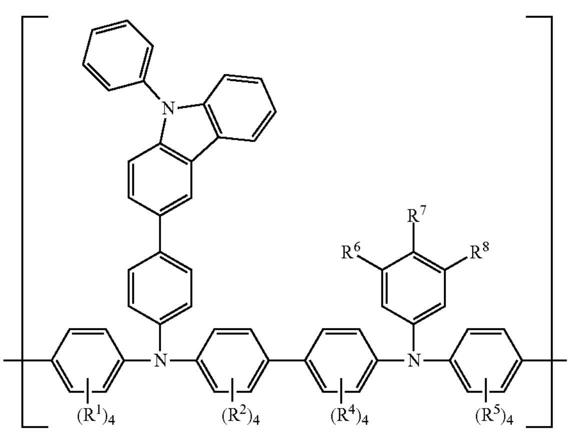
,
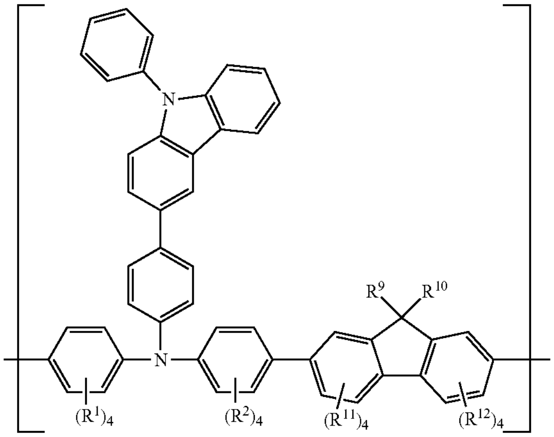
,
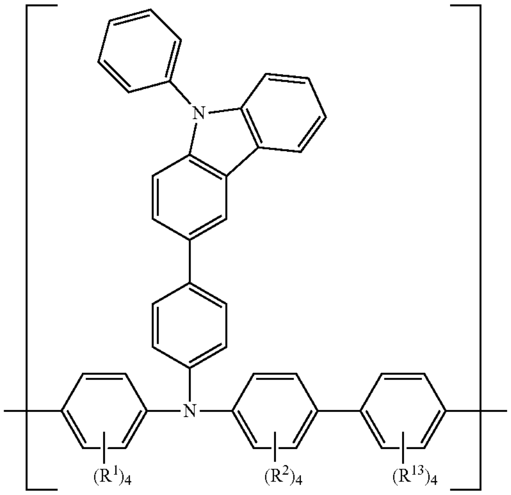
,
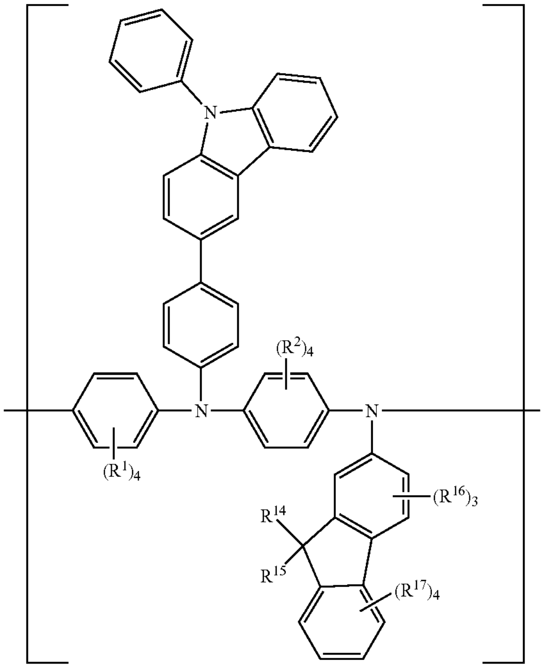
,
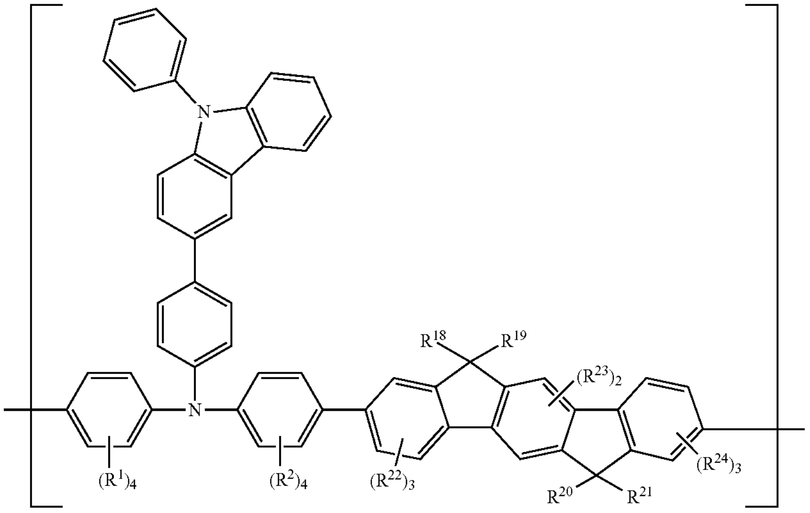
, wherein $R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$, and $R^{24}$ are independently hydrogen, halogen, or $C_{1-2}$ alkyl group;

$R^6$, $R^7$, and $R^8$ are independently hydrogen,

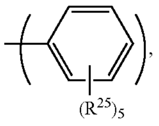

$C_{3-10}$ alkyl group, or $C_{2-10}$ alkenyl group, and at least one of $R^6$, $R^7$ and $R^8$ is $C_{2-10}$ alkenyl group; $R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit is

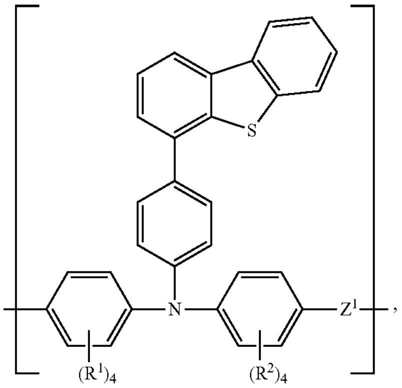

$Z^1$ is

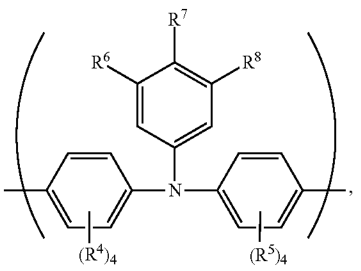

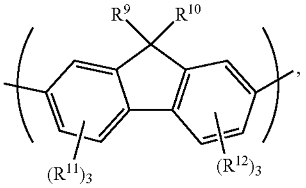

-continued

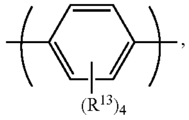

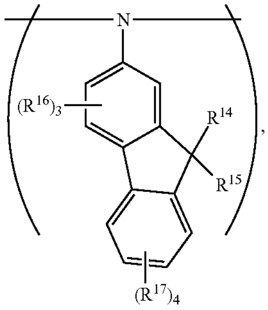

, or

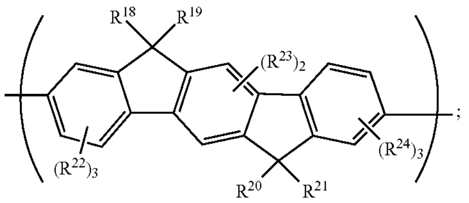

$R^4$, $R^5$, $R^{11}$, $R^{12}$, $R^{16}$, $R^{17}$, $R^{22}$, $R^{23}$, and $R^{24}$ is are independently hydrogen, halogen, or $C_{1-2}$ alkyl group; $R^6$, $R^7$, and $R^8$ are independently hydrogen,

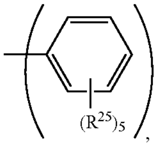

$C_{3-10}$ alkyl group, or $C_{2-10}$ alkenyl group, and at least one of $R^6$, $R^7$ and $R^8$ is $C_{2-10}$ alkenyl group, or

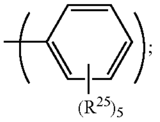

$R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit n
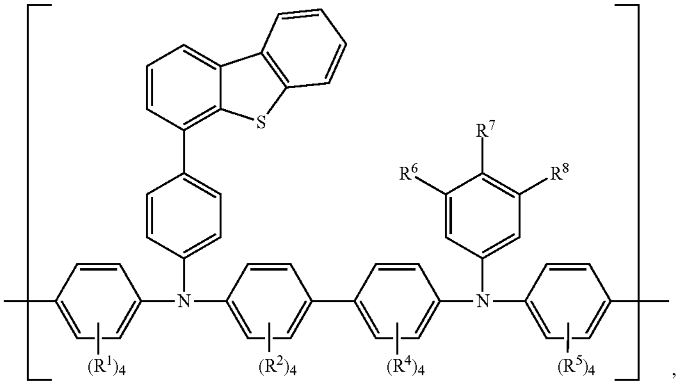
,
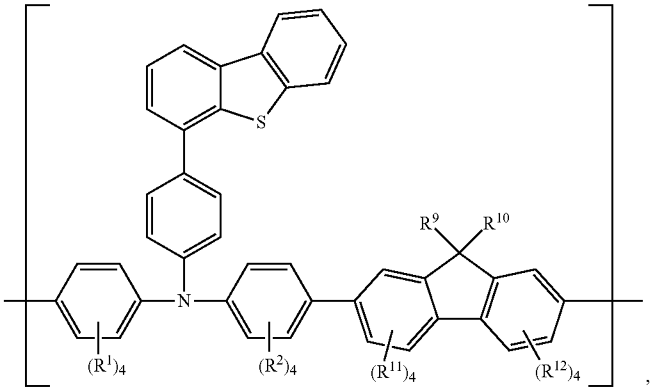
,
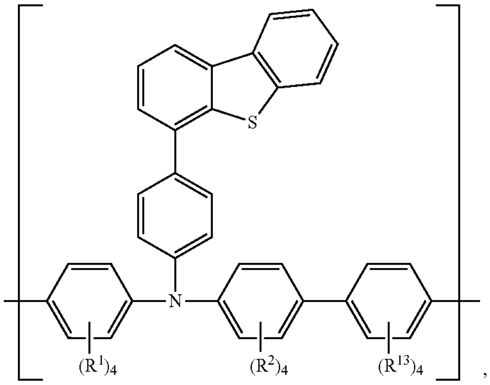
,
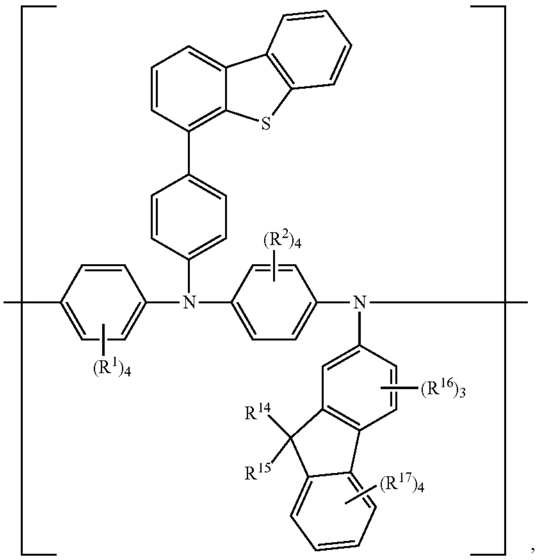
, -continued

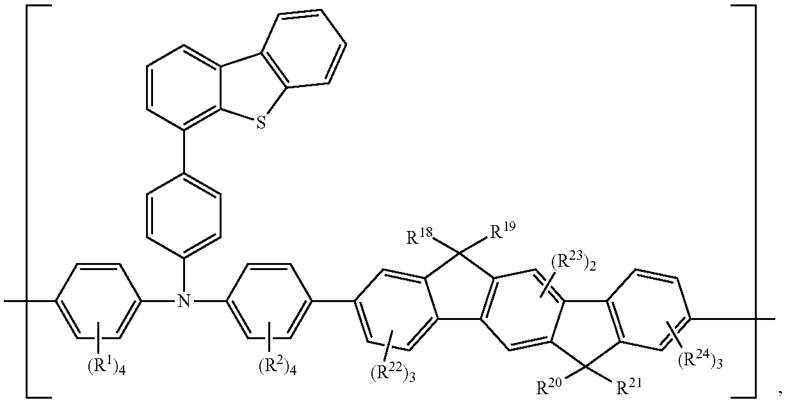

wherein $R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$, and $R^{24}$ are independently hydrogen, halogen, or $C_{1-2}$ alkyl group; $R^6$, $R^7$, and $R^8$ are independently hydrogen,

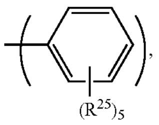

$C_{3-10}$ alkyl group, or $C_{2-10}$ alkenyl group, and at least one of $R^6$, $R^7$ and $R^8$ is $C_{2-10}$ alkenyl group; $R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit is

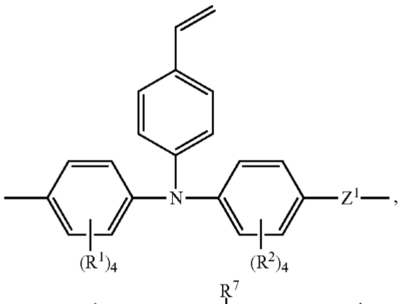

$Z^1$ is

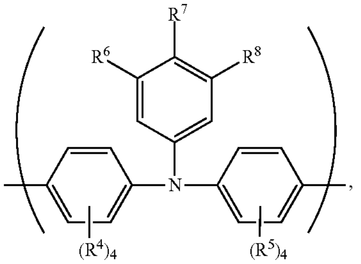

-continued

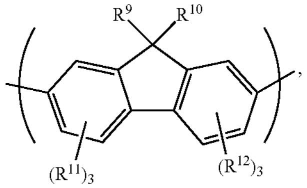

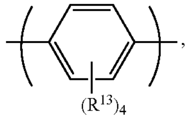

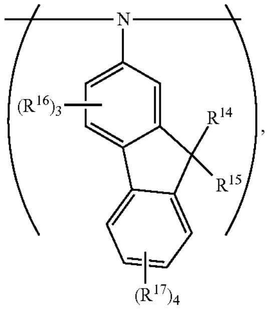

, or

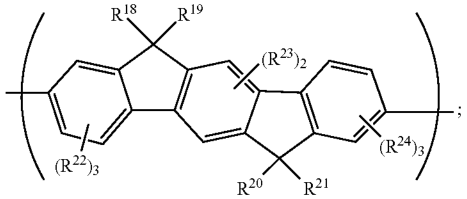

$R^4$, $R^5$, $R^{11}$, $R^{12}$, $R^{16}$, $R^{17}$, $R^{22}$, $R^{23}$, and $R^{24}$ is are independently hydrogen, halogen, or $C_{1-2}$ alkyl group; $R^6$, $R^7$, and $R^8$ are independently hydrogen,

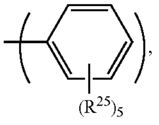

$C_{3-10}$ alkyl group, or $C_{2-10}$ alkenyl group, and at least one of $R^6$, $R^7$ and $R^8$ is $C_{2-10}$ alkenyl group, or

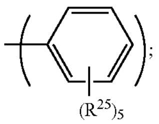

$R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit can

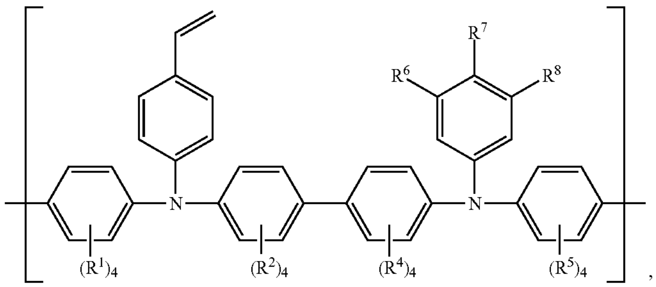

,

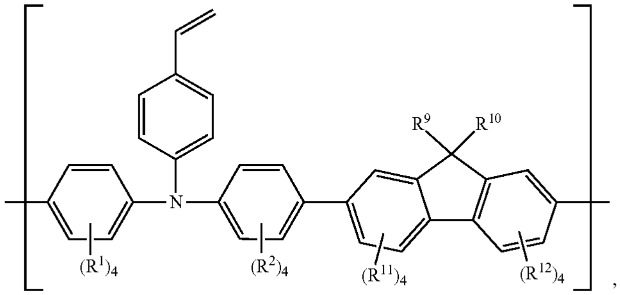

,

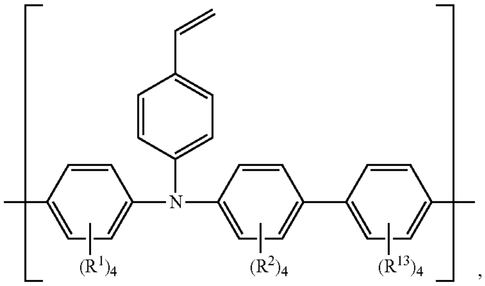

,

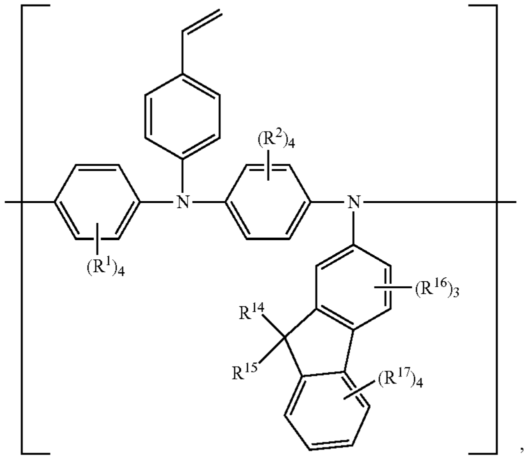

,

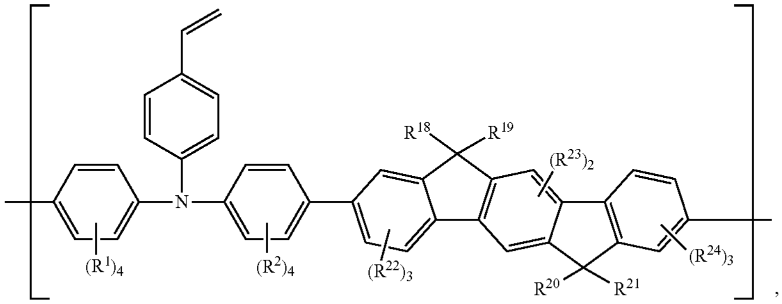

, wherein $R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$, and $R^{24}$ are independently hydrogen, halogen, or $C_{1-2}$ alkyl group; $R^6$, $R^7$, and $R^8$ are independently hydrogen,

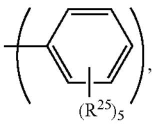, $C_{3-10}$ alkyl group, or $C_{2-10}$ alkenyl group, and at least one of $R^6$, $R^7$ and $R^8$ is $C_{2-10}$ alkenyl group; $R^9$ and $R^{10}$ are independently $C_{2-10}$ alkenyl group; $R^{13}$ are independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit is

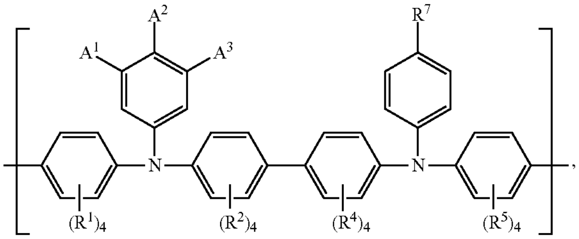, $A^1$, $A^2$, and $A^3$ are independently hydrogen, vinyl,

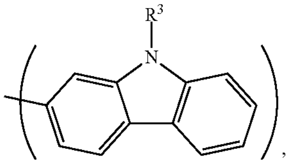, 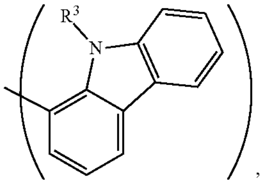, 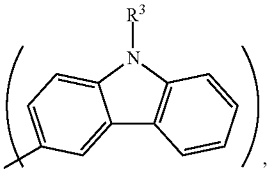, 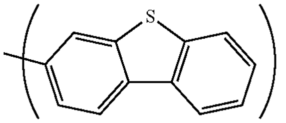 or 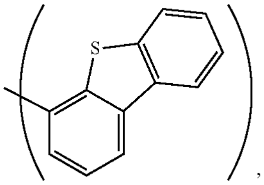, and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, or naphthyl group; $R^4$ and $R^5$ is are independently hydrogen, halogen, or $C_{1-2}$ alkyl group; $R^7$ is

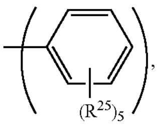, or $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit is

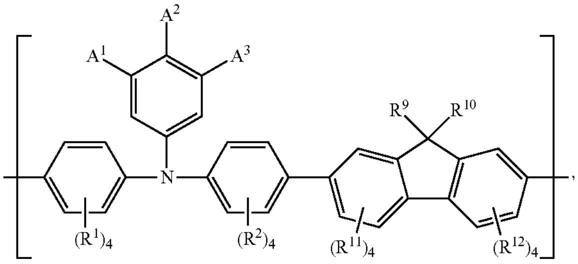, $A^1$, $A^2$, and $A^3$ are independently hydrogen, vinyl,

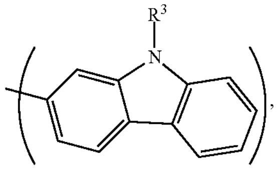, 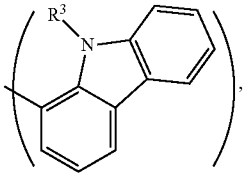, 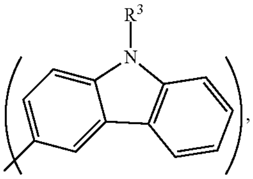, 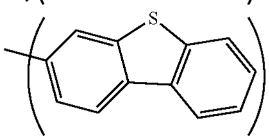 or 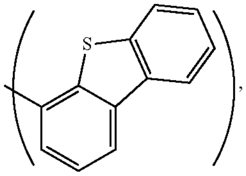, and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, or naphthyl group; $R^{11}$ and $R^{12}$ is are independently hydrogen, halogen, or $C_{1-2}$ alkyl group; and $R^9$ and $R^{10}$ are independently $C_{3-10}$ alkyl group, or $C_{2-10}$ alkenyl group, wherein at least one of $R^9$ and $R^{10}$ is $C_{2-10}$ alkenyl group.

According to embodiments of the disclosure, the first repeating unit is

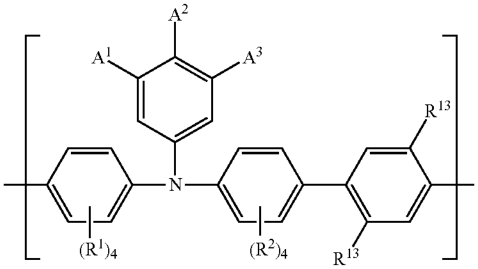

or

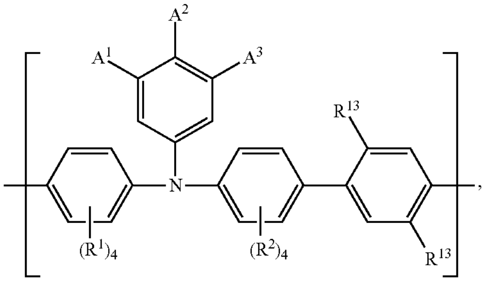

$A^1$, $A^2$, and $A^3$ are independently hydrogen, vinyl,

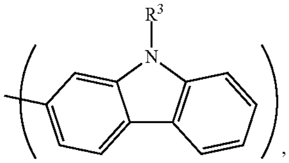

,

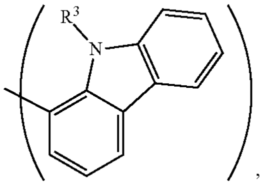

,

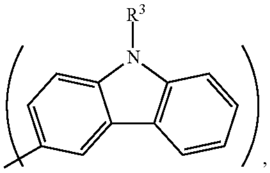

,

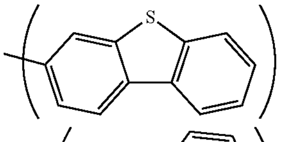

or

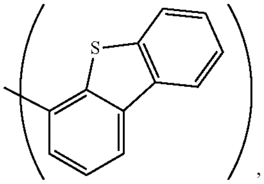

, and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, or naphthyl group; and $R^{13}$ is independently $C_{3-10}$ alkyl group, or $C_{2-10}$ alkenyl group, at least one of $R^{13}$ is $C_{2-10}$ alkenyl group.

According to embodiments of the disclosure, first repeating unit is

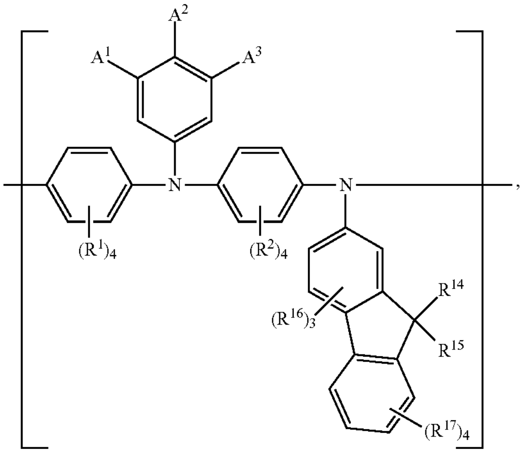

$A^1$, $A^2$, and $A^3$ are independently hydrogen, vinyl,

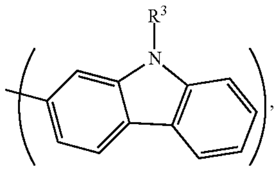

,

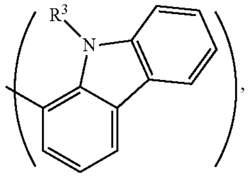

,

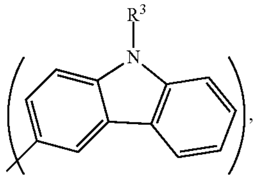

,

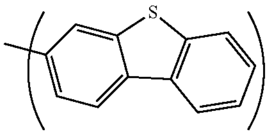

or

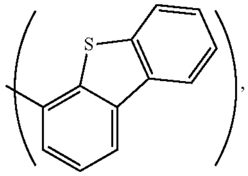

, and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, or naphthyl group; $R^{16}$ and $R^{17}$ is are independently hydrogen, halogen, or $C_{1-2}$ alkyl group; and $R^{14}$ and $R^{15}$ are independently $C_{3-10}$ alkyl group, or $C_{2-10}$ alkenyl group, and at least one of $R^{14}$ and $R^{15}$ is $C_{2-10}$ alkenyl group.

According to embodiments of the disclosure, first repeating unit is

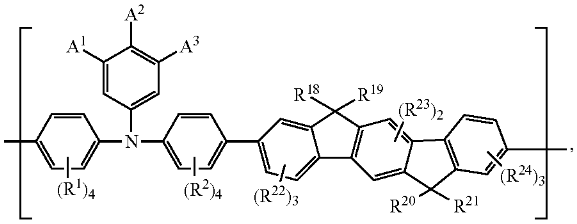

, $A^1$, $A^2$, and $A^3$ are independently hydrogen, vinyl,

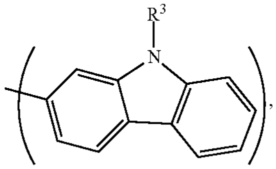

,

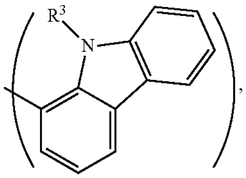

,

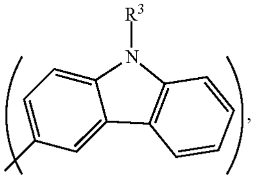

,

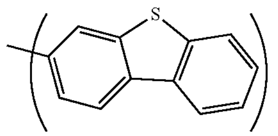

or

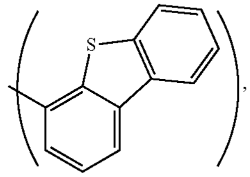

, and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, or naphthyl group; $R^{22}$, $R^{23}$, and $R^{24}$ is are independently hydrogen, halogen, or $C_{1-2}$ alkyl group; and $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group.

According to embodiments of the disclosure, in the first repeating unit has a structure represented by Formula (I), $A^1$ and $A^3$ is hydrogen; $A^2$ is vinyl,

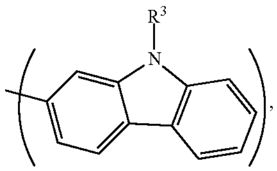

,

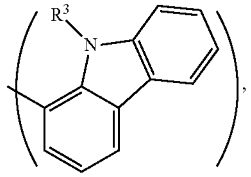

,

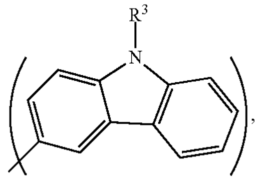

,

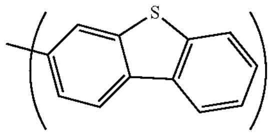

or

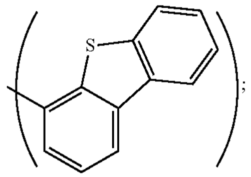

;

$R^1$ and $R^2$ are independently hydrogen, halogen, or $C_{1-2}$ alkyl group; $R^3$ is hydrogen, phenyl group, biphenyl group, or naphthyl group;

$Z^1$ is

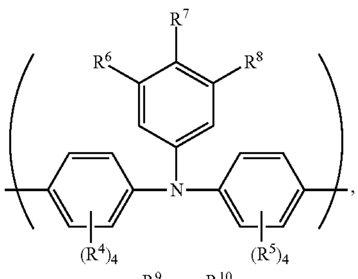

,

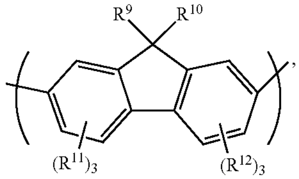

,

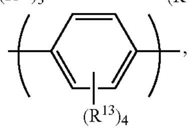

,

-continued

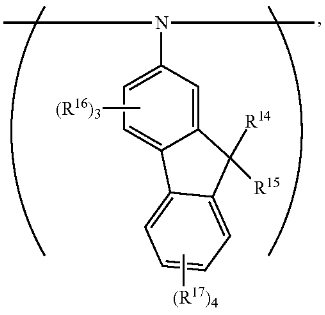

, or

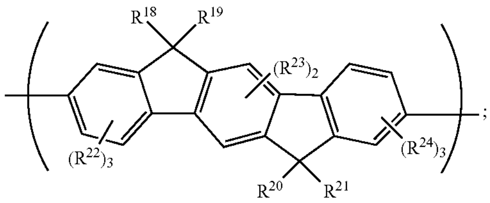

;

$R^4$, $R^5$, $R^{11}$, $R^{12}$, $R^{16}$, $R^{17}$, $R^{22}$, $R^{23}$, and $R^{24}$ are independently hydrogen, halogen, or $C_{1-2}$ alkyl group; $R^6$, $R^7$ and $R^8$ are independently hydrogen,

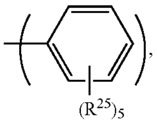

, $C_{3-10}$ alkyl group, or $C_{2-10}$ alkenyl group, and at least one of $R^6$, $R^7$ and $R^8$ is $C_{2-10}$ alkenyl group, or

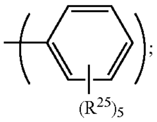

;

$R^9$ and $R^{10}$ are independently $C_{2-10}$ alkenyl group; $R^{13}$ is independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group.

According to embodiments of the disclosure, the first repeating unit is

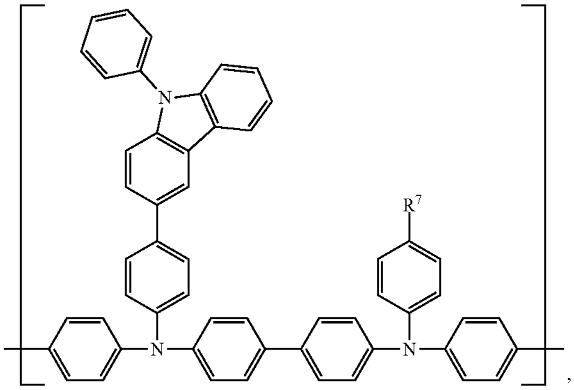

,

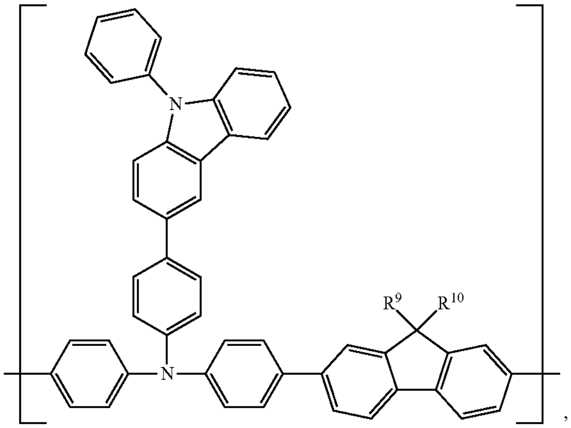

,

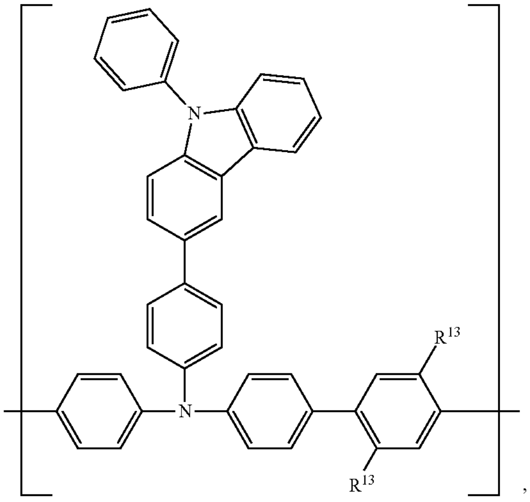

,

-continued
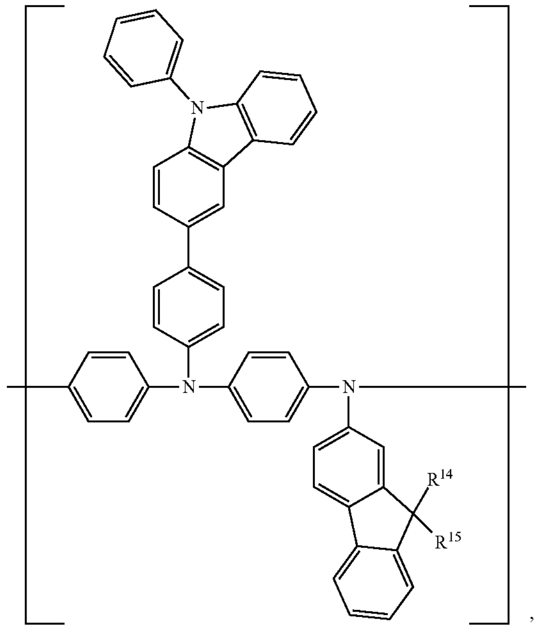
,
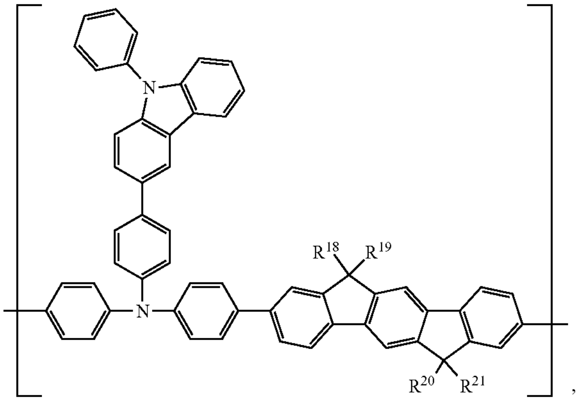
,
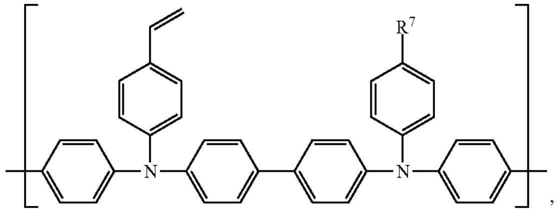
,
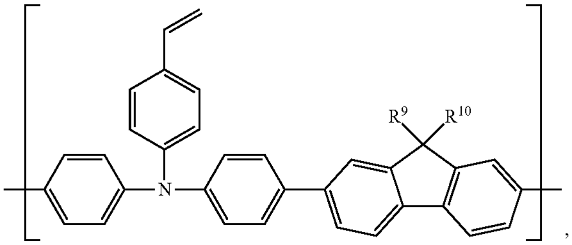
,
-continued
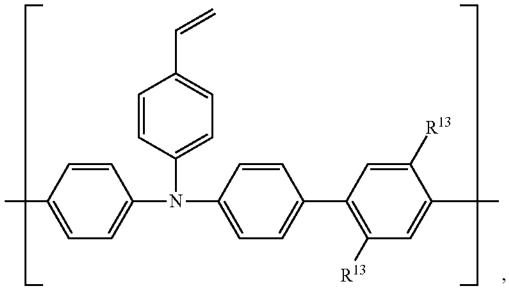
,
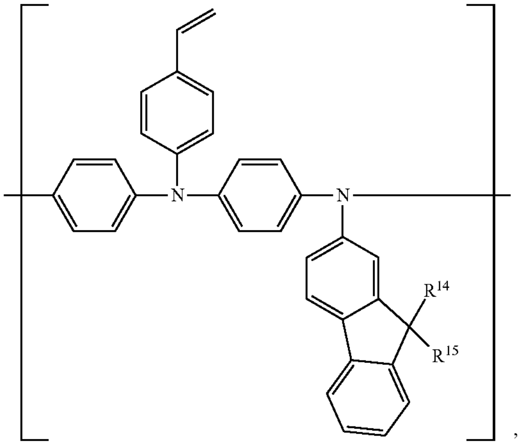
,
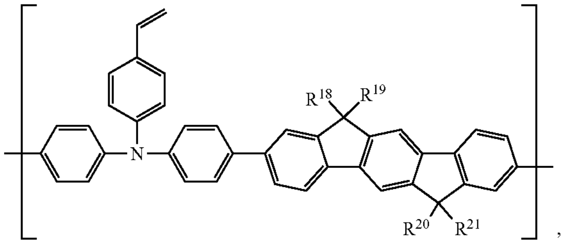
,
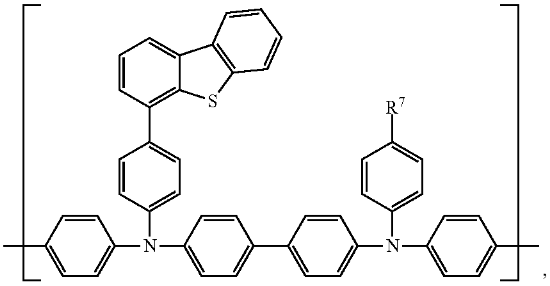
,
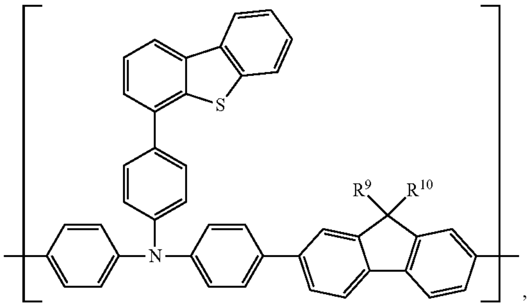
, -continued

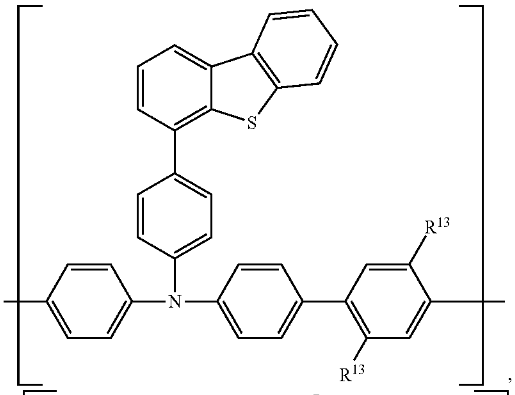

,

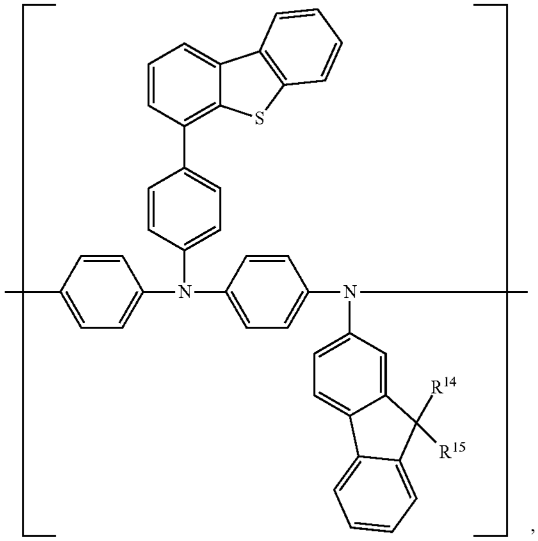

, or

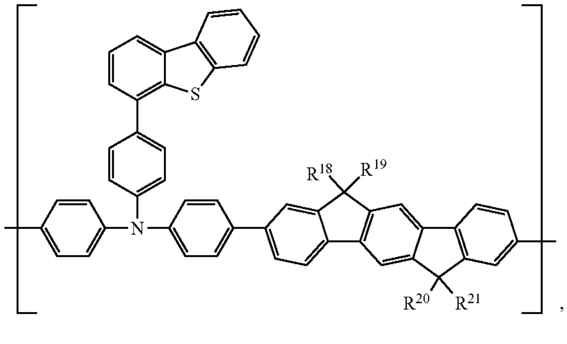

, wherein $R^7$ is

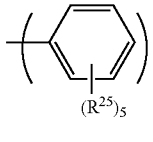

or $C_{2-10}$ alkenyl group, wherein $R^{25}$ is independently hydrogen, $C_{3-10}$ alkyl group, or $C_{2-10}$ alkenyl group, and at least one of $R^{25}$ is $C_{2-10}$ alkenyl group; $R^9$ and $R^{10}$ are independently $C_{2-10}$ alkenyl group; $R^{13}$ is independently $C_{2-10}$ alkenyl group; $R^{14}$ and $R^{15}$ are independently $C_{2-10}$ alkenyl group; and $R^{18}$, $R^{19}$, $R^{20}$ and $R^{21}$ are independently $C_{2-10}$ alkenyl group.

According to embodiments of the disclosure, there may be between 2 and 2,000 first repeating units in the polymer (that range may be 2 to 1,800, 5 to 1,500, 10 to 1,200, 20 to 1,000, 50 to 800, or 100 to 500). According to embodiments of the disclosure, the polymer can have a number average molecular weight (Mn) or a weight average molecular weight (Mw) of about 1,000 g/mol to 100,000 g/mol, such as 2,000 g/mol to 80,000 g/mol, or 3,000 g/mol to 60,000 g/mol. The number average molecular weight (Mn) or weight average molecular weight (Mw) of the oligomer or polymer of the disclosure can be determined by gel permeation chromatography (GPC) based on a polystyrene calibration curve.

According to embodiments of the disclosure, the polymer further includes second repeating unit, wherein the second repeating unit has a structure represented by Formula (II).

Formula (II)

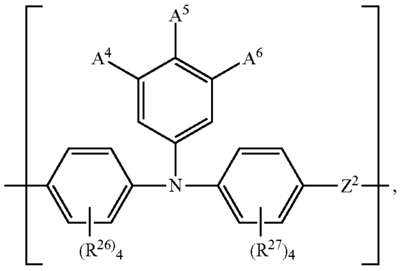

, wherein $A^4$, $A^5$, and $A^6$ can be independently hydrogen, vinyl,

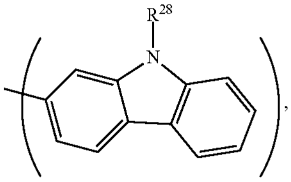

,

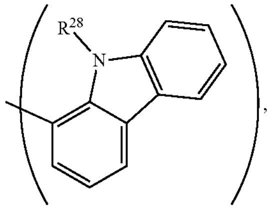

,

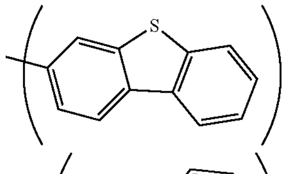

or

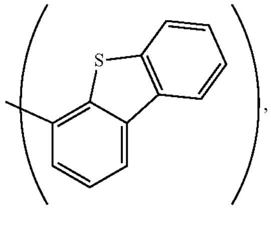

, and at least one of $A^4$, $A^5$, and $A^6$ is not hydrogen; $R^{26}$ and $R^{27}$ are independently hydrogen, halogen, or $C_{1-2}$ alkyl group; $R^{28}$ is hydrogen, phenyl group, biphenyl group, or naphthyl group;

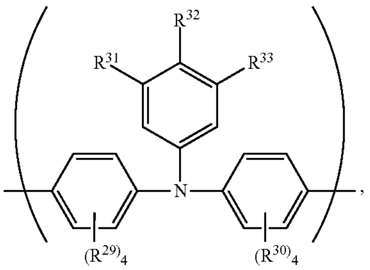

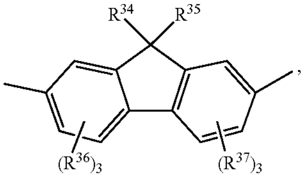

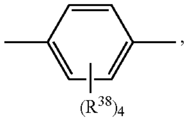

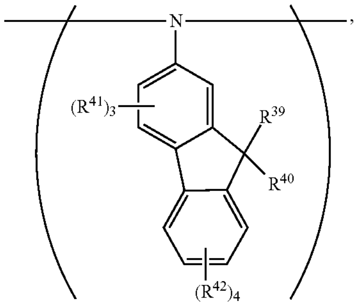

or

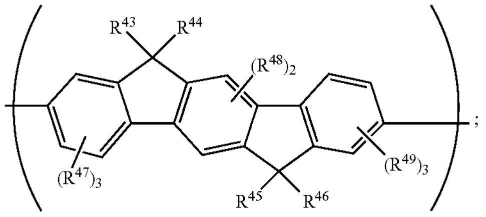

$R^{29}$, $R^{30}$, $R^{36}$, $R^{37}$, $R^{41}$, $R^{42}$, $R^{47}$, $R^{48}$, and $R^{49}$ are independently hydrogen, halogen, or $C_{1-2}$ alkyl group; $R^{31}$, $R^{32}$ and $R^{33}$ are independently hydrogen,

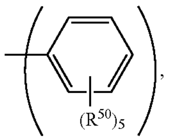

$C_{3-10}$ alkyl group, or $C_{2-10}$ alkenyl group (such as $C_{3-10}$ alkenyl group); $R^{34}$ and $R^{35}$ are independently hydrogen, $C_{3-10}$ alkyl group, or $C_{2-10}$ alkenyl group; $R^{38}$ are independently hydrogen, $C_{3-10}$ alkyl group, or $C_{2-10}$ alkenyl group; $R^{39}$ and $R^{40}$ are independently hydrogen, $C_{3-10}$ alkyl group, or $C_{2-10}$ alkenyl group; $R^{43}$, $R^{44}$, $R^{45}$, and $R^{46}$ are independently hydrogen, $C_{3-10}$ alkyl group, or $C_{2-10}$ alkenyl group; and $R^{50}$ is independently hydrogen, $C_{3-10}$ alkyl group, or $C_{2-10}$ alkenyl group, wherein the second repeating unit is different from the second repeating unit.

According to embodiments of the disclosure, the amount ratio of the first repeating unit to the second repeating unit can be 1:99 to 99:1, such as: 1:9, 1:8, 1:7, 1:6, 1:5, 1:4, 1:3, 1:2, 1:1, 2:1, 3:1, 4:1, 5:1, 6:1, 7:1, 8:1, or 9:1.

According to embodiments of the disclosure, the second repeating unit is

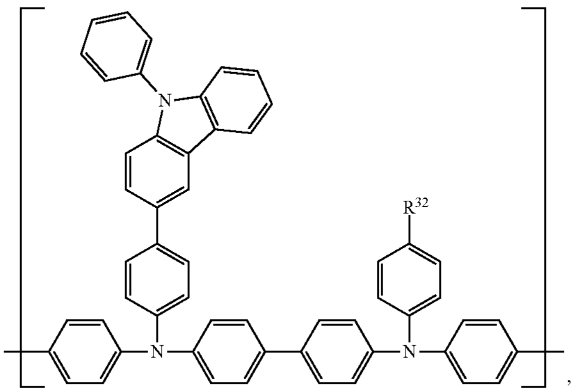

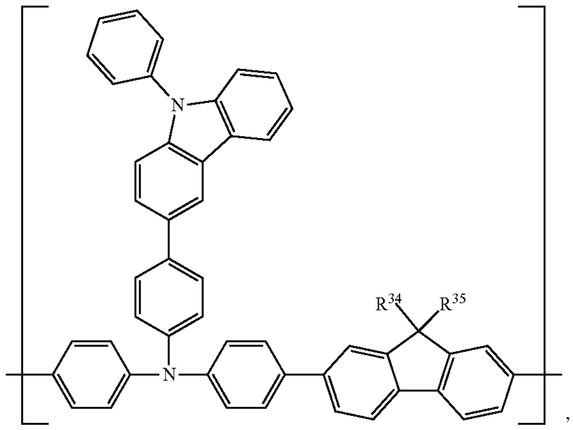

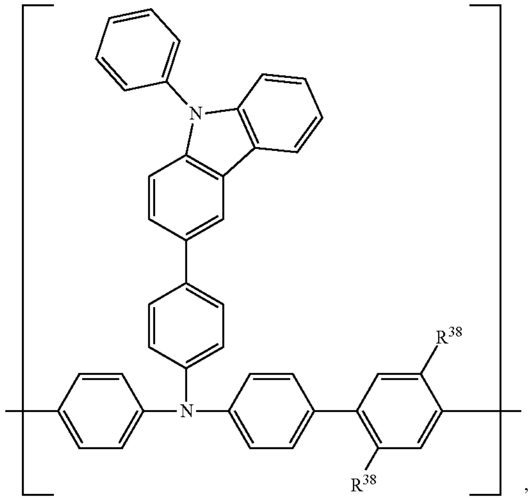

-continued

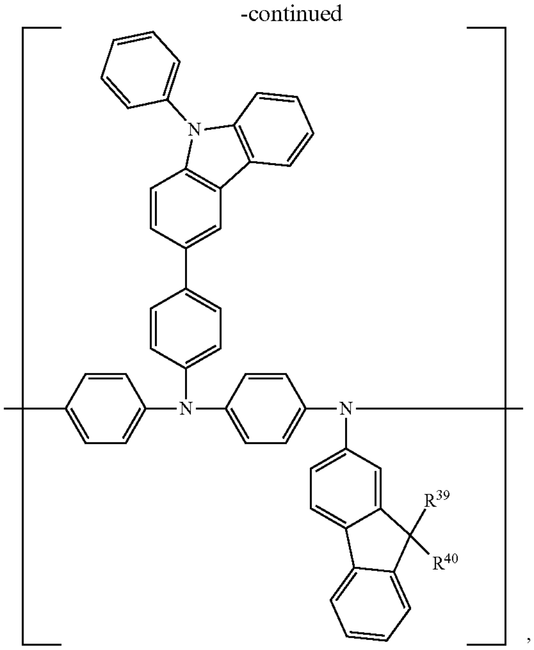

, or

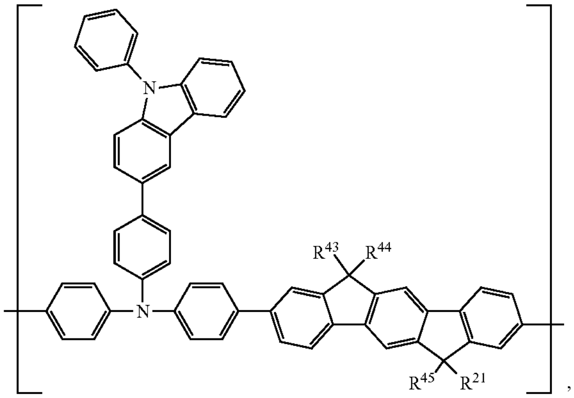

, wherein $R^{32}$ is hydrogen,

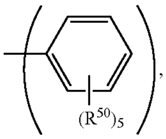

, $C_{3-10}$ alkyl group, or $C_{2-10}$ alkenyl group, wherein $R^{50}$ is independently hydrogen, $C_{3-10}$ alkyl group, or $C_{2-10}$ alkenyl group, and at least one of $R^{50}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen. In order to further improve the solubility of polymers in a solvent, $R^{32}$, $R^{34}$, $R^{35}$, $R^{38}$, $R^{39}$, $R^{4}$, $R^{43}$, $R^{44}$, $R^{45}$, and $R^{46}$ are independently $C_{3-10}$ alkyl group.

According to embodiments of the disclosure, the second repeating unit is

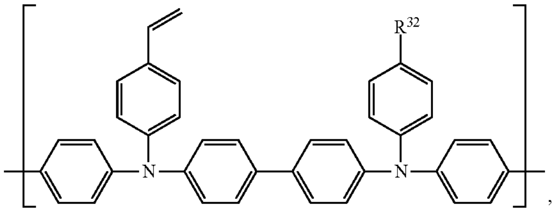

,

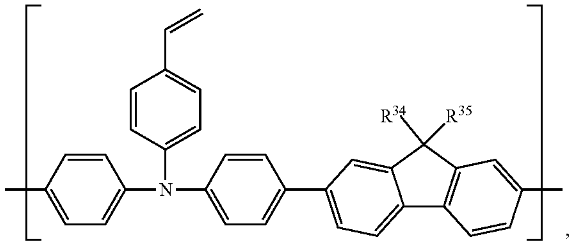

,

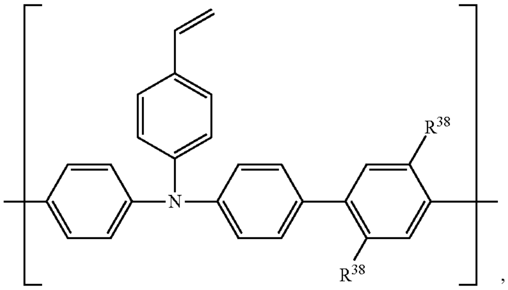

,

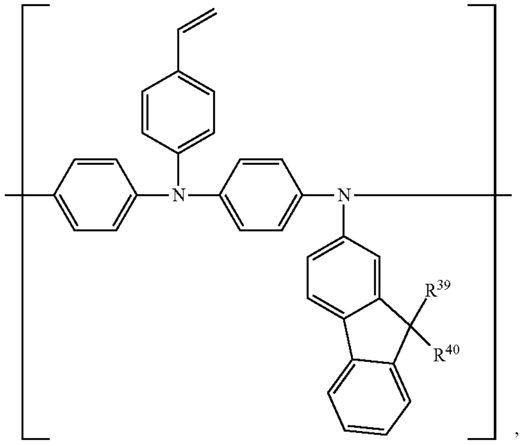

, or

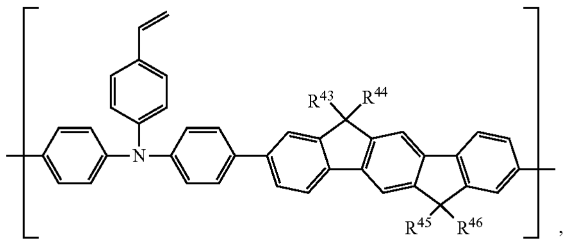

, wherein $R^{32}$ is hydrogen,

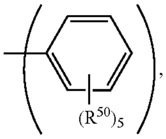, $C_{3-10}$ alkyl group, or $C_{2-10}$ alkenyl group, wherein $R^{50}$ is independently hydrogen, $C_{3-10}$ alkyl group, or $C_{2-10}$ alkenyl group, and at least one of $R^{50}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen. In order to further improve the solubility of polymers in a solvent, $R^{32}$, $R^{34}$, $R^{35}$, $R^{38}$, $R^{39}$, $R^{40}$, $R^{43}$, $R^{44}$, $R^{45}$, and $R^{46}$ are independently $C_{3-10}$ alkyl group.

According to embodiments of the disclosure, the second repeating unit is

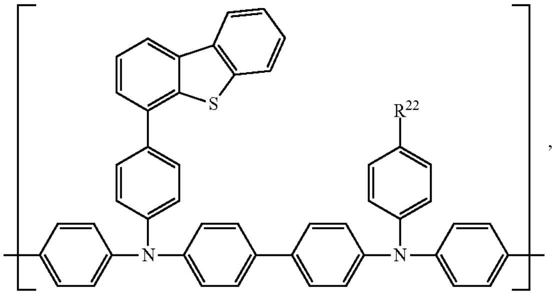,

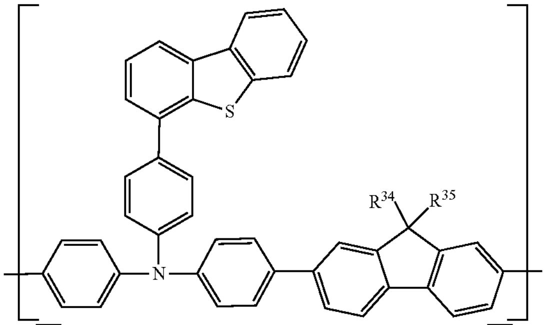,

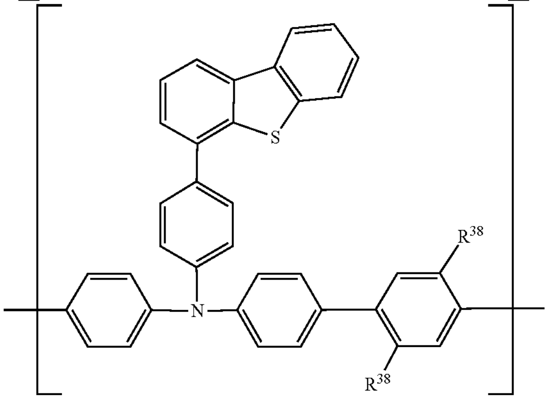,

-continued

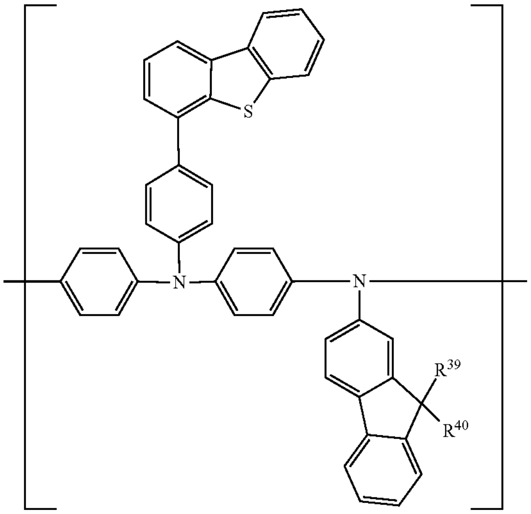, or

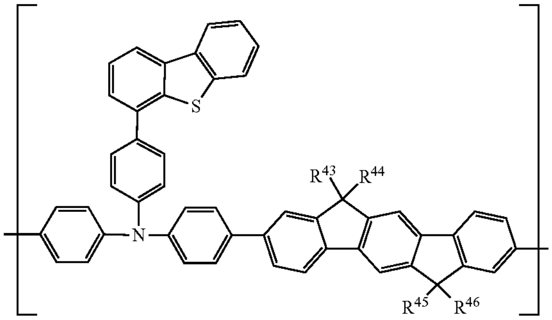, wherein $R^{32}$ is hydrogen,

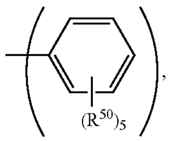, $C_{3-10}$ alkyl group, or $C_{2-10}$ alkenyl group, wherein $R^{50}$ is independently hydrogen, $C_{3-10}$ alkyl group, or $C_{2-10}$ alkenyl group, and at least one of $R^{50}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen. In order to further improve the solubility of polymers in a solvent, $R^{32}$, $R^{34}$, $R^{35}$, $R^{38}$, $R^{39}$, $R^{4}$, $R^{43}$, $R^{44}$, $R^{45}$, and $R^{46}$ are independently $C_{3-10}$ alkyl group.

According to embodiments of the disclosure, the first repeating unit is

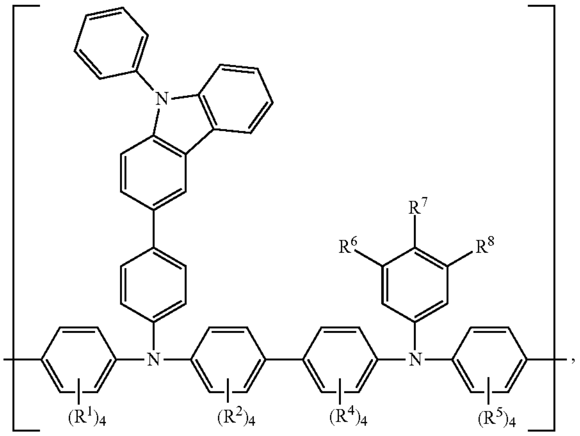

and the second repeating unit is

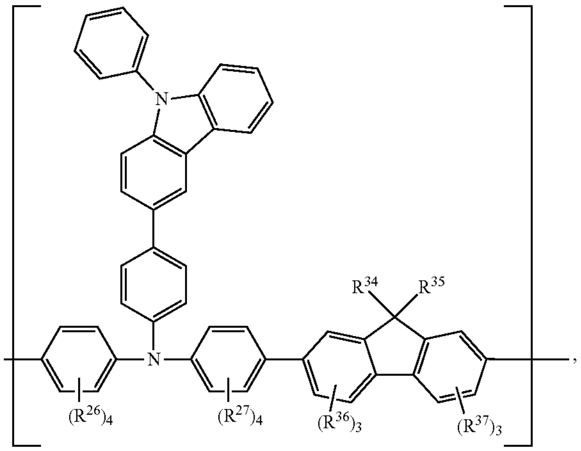

$R^1$, $R^2$, $R^4$ and $R^5$ are independently hydrogen, halogen, or $C_{1-2}$ alkyl group; $R^6$ and $R^8$ is hydrogen; $R^7$ is

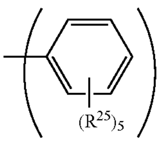

or $C_{2-10}$ alkenyl group; $R^{25}$ is independently $C_{2-10}$ alkenyl group; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

According to embodiments of the disclosure, the first repeating unit is

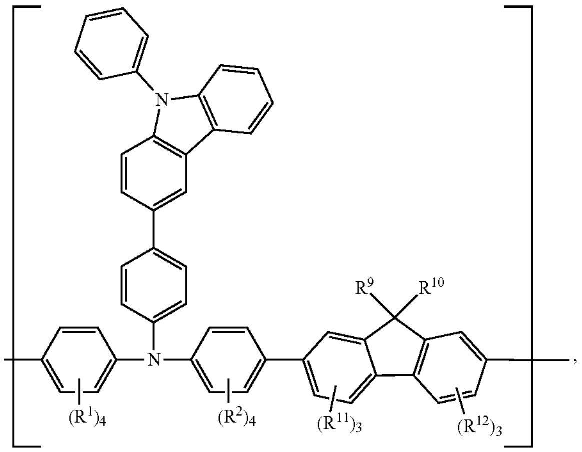

and the second repeating unit is

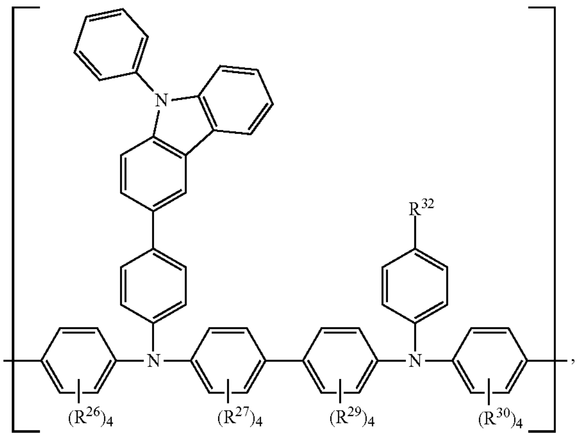

wherein $R^1$, $R^2$, $R^{11}$ and $R^{12}$ are independently hydrogen, halogen, or $C_{1-2}$ alkyl group; $R^9$ and $R^{10}$ are independently $C_{2-10}$ alkenyl group; $R^{26}$, $R^{27}$, $R^{29}$ and $R^{30}$ are independently hydrogen, halogen, or $C_{1-2}$ alkyl group; and $R^{32}$ is hydrogen, $C_{3-10}$ alkyl group, or $C_{2-10}$ alkenyl group.

According to embodiments of the disclosure, the first repeating unit is

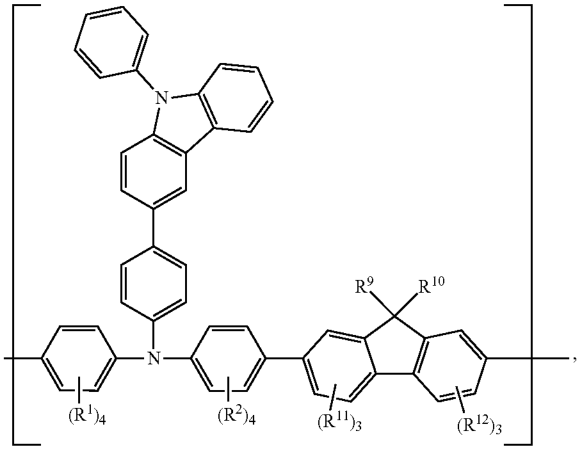

and the second repeating unit is

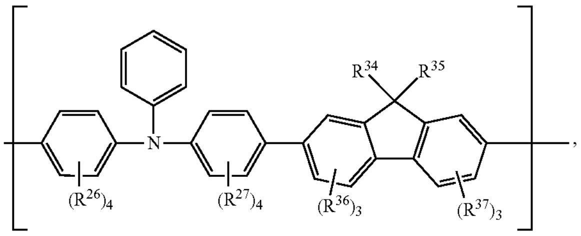

independently hydrogen, $C_{3-10}$ alkyl group, or $C_{2-10}$ alkenyl group, and at least one of $R^{34}$ and $R^{35}$ is not hydrogen.

According to embodiments of the disclosure, the first repeating unit is

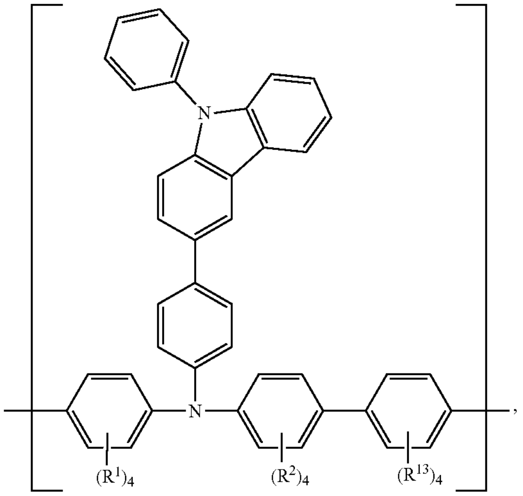

and the second repeating unit is

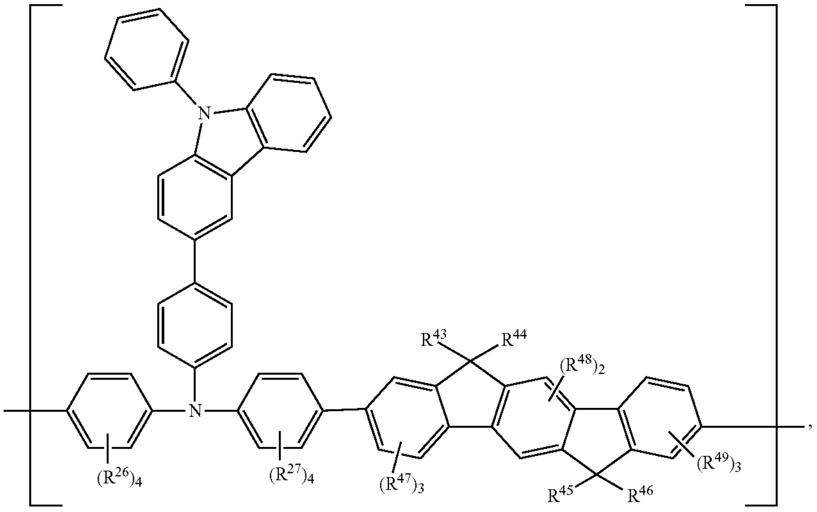

wherein $R^1$, $R^2$, $R^{11}$ and $R^{12}$ are independently hydrogen, halogen, or $C_{1-2}$ alkyl group; $R^9$ and $R^{10}$ are independently $C_{2-10}$ alkenyl group; $R^{26}$, $R^{27}$, $R^{36}$ and $R^{37}$ are independently hydrogen, halogen, or $C_{1-2}$ alkyl group; and $R^{34}$ and $R^{35}$ are wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is $C_{2-10}$ alkenyl group; $R^{26}$, $R^{27}$, $R^{47}$, $R^{48}$ and $R^{49}$ are independently hydrogen, halogen, or $C_{1-2}$ alkyl group; and $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen.

According to embodiments of the disclosure, the first repeating unit is

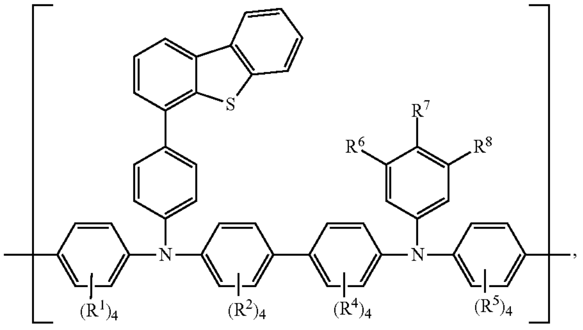

and the second repeating unit is

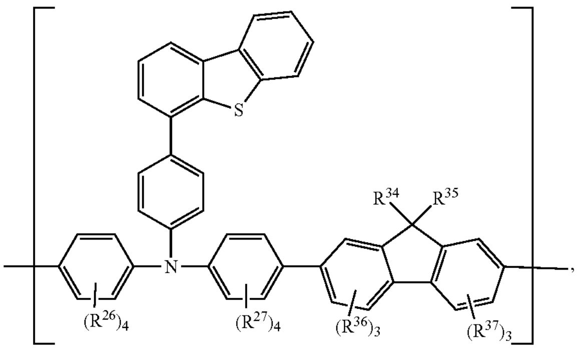

wherein $R^1$, $R^2$, $R^4$ and $R^5$ are independently hydrogen, halogen, or $C_{1-2}$ alkyl group;

$R^6$ and $R^8$ is hydrogen; $R^7$ is

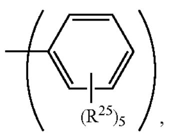

or $C_{2-10}$ alkenyl group; $R^{25}$ is independently hydrogen, $C_{3-10}$ alkyl group, or $C_{2-10}$ alkenyl group, and at least one of $R^{25}$ is $C_{2-10}$ alkenyl group; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

According to embodiments of the disclosure, the first repeating unit is

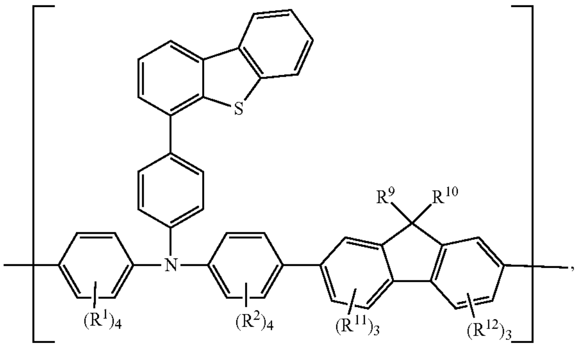

and the second repeating unit is

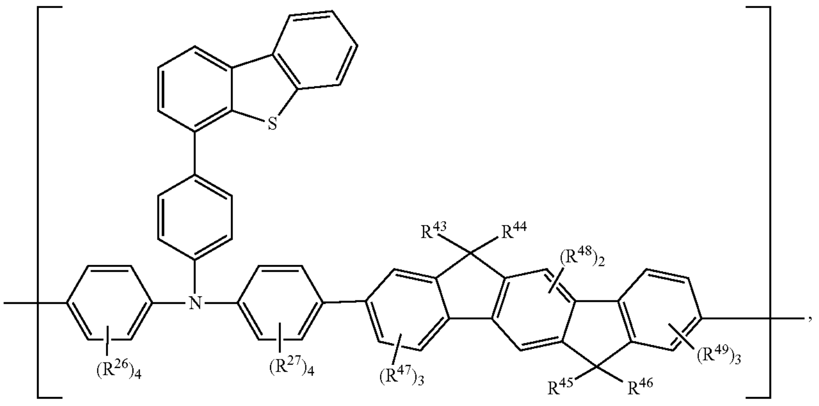

wherein $R^1$, $R^2$, $R^{11}$ and $R^{12}$ are independently hydrogen, halogen, or $C_{1-2}$ alkyl group; $R^9$ and $R^{10}$ are independently $C_{2-10}$ alkenyl group; $R^{26}$, $R^{27}$, $R^{47}$, $R^{48}$ and $R^{49}$ are independently hydrogen, halogen, or $C_{1-2}$ alkyl group; and $R^{43}$ and $R^{44}$, $R^{45}$ and $R^{46}$ are independently hydrogen, $C_{3-10}$ alkyl group, or $C_{2-10}$ alkenyl group, and $R^{43}$ and $R^{44}$, $R^{45}$ and at least one of $R^{46}$ is not hydrogen.

According to embodiments of the disclosure, the first repeating unit is

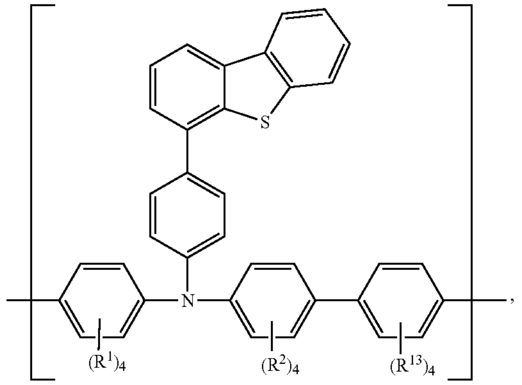

and the second repeating unit is

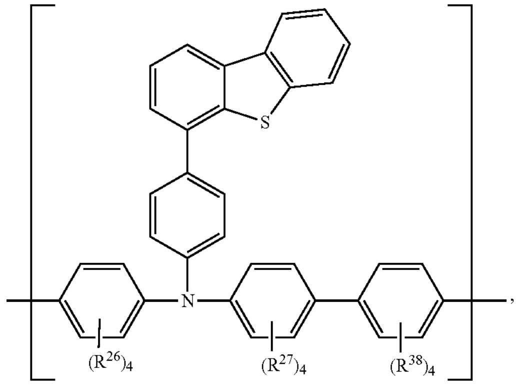

wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is $C_{2-10}$ alkenyl group; $R^{26}$ and $R^{27}$ are independently hydrogen, halogen, or $C_{1-2}$ alkyl group; and $R^{38}$ is independently hydrogen, $C_{3-10}$ alkyl group, or $C_{2-10}$ alkenyl group, and at least one of $R^{38}$ is not hydrogen.

According to embodiments of the disclosure, the first repeating unit is

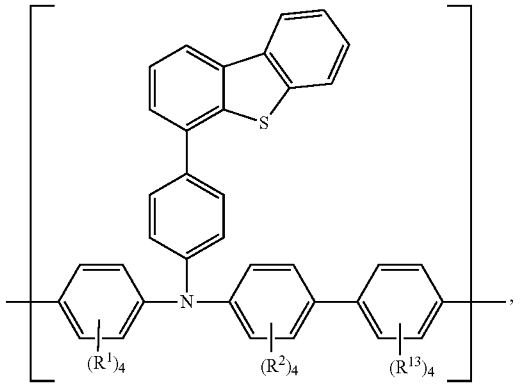

and the second repeating unit is

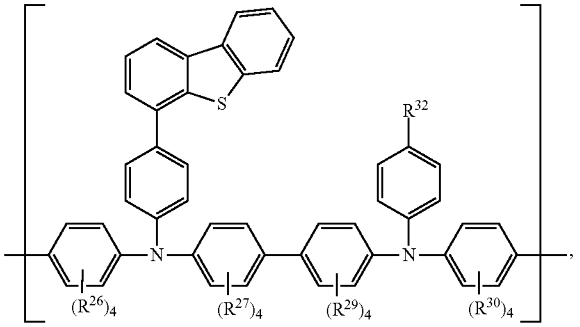

wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is $C_{2-10}$ alkenyl group; $R^{26}$, $R^{27}$, $R^{29}$ and $R^{30}$ are independently hydrogen, halogen, or $C_{1-2}$ alkyl group; and $R^{32}$ is hydrogen, $C_{3-10}$ alkyl group, or $C_{2-10}$ alkenyl group.

According to embodiments of the disclosure, there are between 2 and 2,000 second repeating units in the polymer (That range may be 2 to 1,800, 5 to 1,500, 10 to 1,200, 20 to 1,000, 50 to 800, or 100 to 500). According to embodiments of the disclosure, the first repeating unit and the second repeating unit are arranged in a random or block fashion. According to embodiments of the disclosure, the number average molecular weight (Mn) or weight average molecular weight (Mw) of the polymer may be about 1,000 g/mol to 100,000 g/mol, such as 2,000 g/mol to 80,000 g/mol, or 3,000 g/mol to 60,000 g/mol. The number average molecular weight (Mn) or weight average molecular weight (Mw) of the oligomer or polymer of the disclosure can be determined by gel permeation chromatography (GPC) based on a polystyrene calibration curve.

According to embodiments of the disclosure, the disclosure also provides a method for preparing the polymer. The method can include the following steps. First, at least one first monomer and at least one second monomer are provided. Next, the first monomer, the second monomer, and a catalyst are dispersed in a solvent to obtain a mixture. Next, the mixture is subjected to a polymerization at 80° C.-150° C. for 1 hour to 24 hours, obtaining the polymer of the disclosure. According to embodiments of the disclosure, during the polymerization, a capping agent (such as phenyl bromide) is added to control the molecular weight and the polydispersity index (PDI) of the polymer.

According to embodiments of the disclosure, the first monomer has the structure shown in formula (III)

Formula (III)

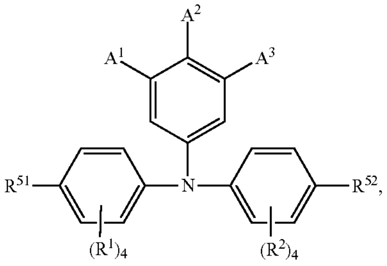

wherein $A^1$, $A^2$, and $A^3$ can be independently hydrogen,

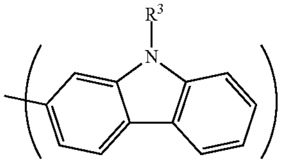

,

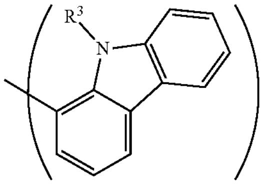

,

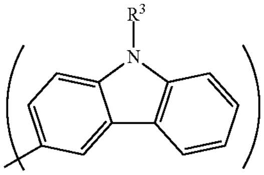

,

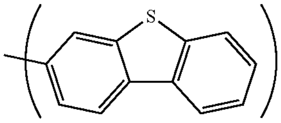

or

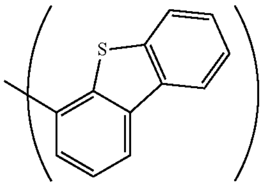

, and at least one of $A^1$, $A^2$ and $A^3$ is not hydrogen; $R^1$ and $R^2$ are independently hydrogen, halogen, or $C_{1-2}$ alkyl group; and $R^{51}$ and $R^{52}$ are independently bromide, or pinacolborane group. For example, the first monomer can be

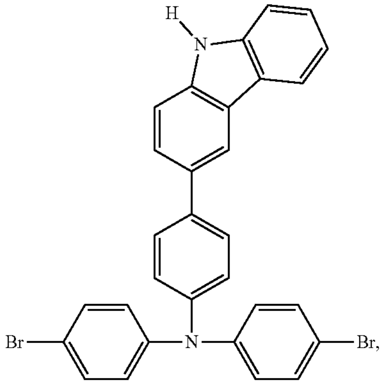

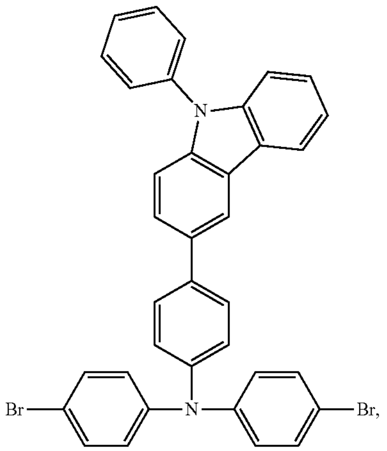

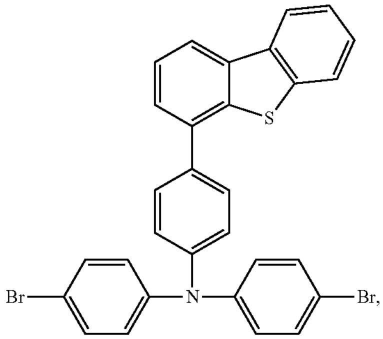

or

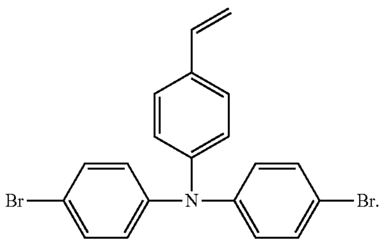

According to embodiments of the disclosure, the second monomer can have structure represented by Formula (IV), Formula (V), Formula (VI), Formula (VII), or Formula (VIII)

Formula (IV)

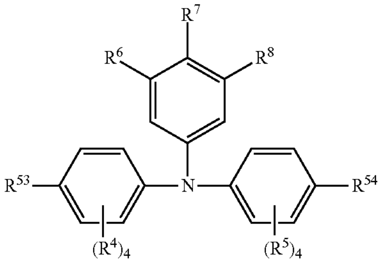

Formula (V)

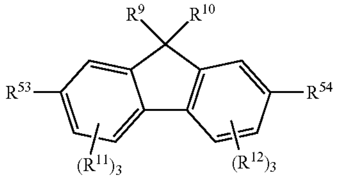

Formula (VI)

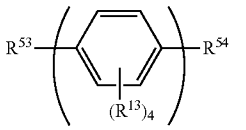

Formula (VII)

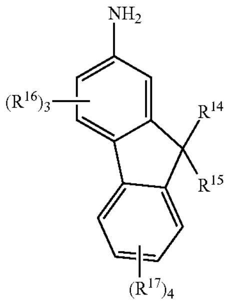

Formula (VIII)

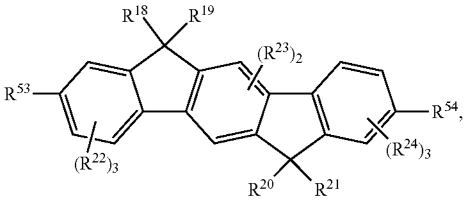

wherein $R^4$, $R^5$, $R^{11}$, $R^{12}$, $R^{16}$, $R^{17}$, $R^{22}$, $R^{23}$, and $R^{24}$ are independently hydrogen, halogen, or $C_{1-2}$ alkyl group; $R^6$, $R^7$, and $R^8$ are independently hydrogen,

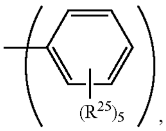

, $C_{3-10}$ alkyl group, or $C_{2-10}$ alkenyl group, and at least one of $R^6$, $R^7$ and $R^8$ is $C_{2-10}$ alkenyl group; $R^9$ and $R^{10}$ are independently hydrogen, $C_{3-10}$ alkyl, or $C_{2-10}$ alkenyl group, and at least one of $R^9$ and $R^{10}$ is $C_{2-10}$ alkenyl group; $R^{13}$ are independently hydrogen, $C_{3-10}$ alkyl, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl, or $C_{2-10}$ alkenyl group, and at least one of $R^{14}$ and $R^{15}$ is $C_{2-10}$ alkenyl group; $R^{18}$, $R^{19}$, $R^{20}$, and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is $C_{2-10}$ alkenyl group; $R^{25}$ is independently hydrogen, $C_{3-10}$ alkyl group, or $C_{2-10}$ alkenyl group, and at least one of $R^{25}$ is $C_{2-10}$ alkenyl group; and $R^{53}$ and $R^{54}$ are independently bromide or pinacolborane group. For example, the second monomer can be

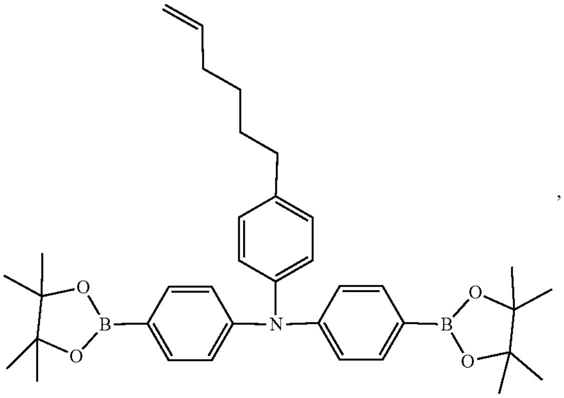

,

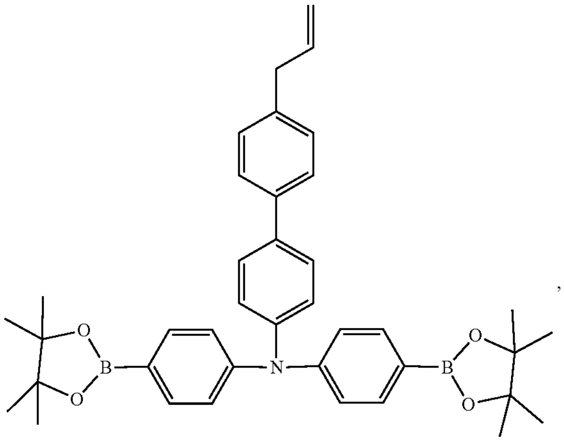

,

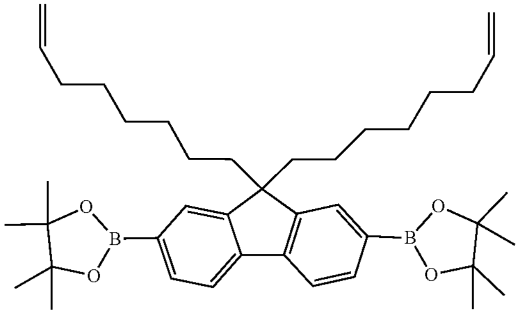

,

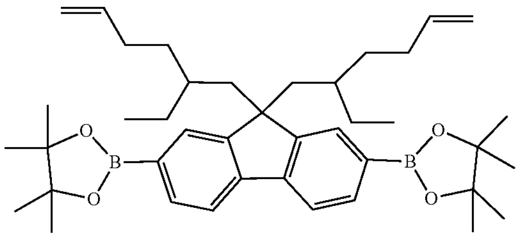

,

-continued
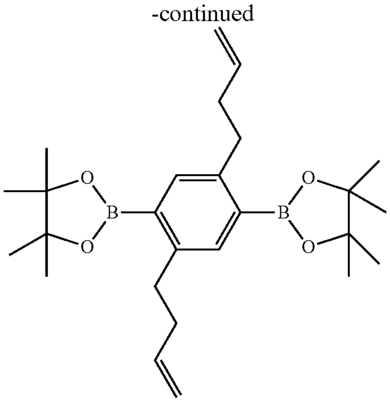
,
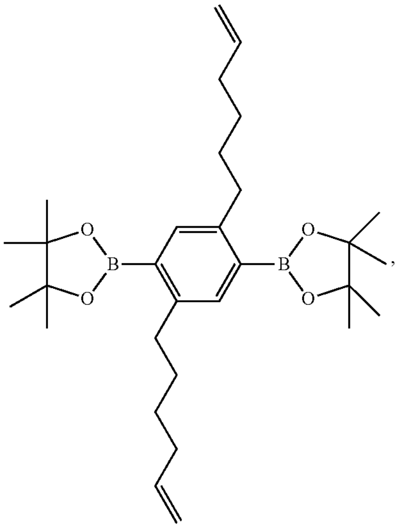
,
-continued
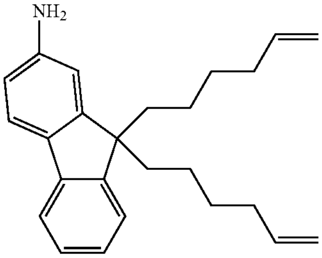
, or
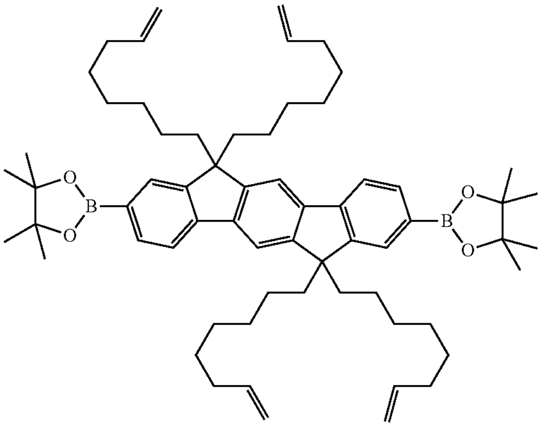
.
According to Embodiments of the disclosure, the molar ratio of the first monomer to the second monomer can be 1:99 to 99:1, such as: 1:9, 1:8, 1:7, 1:6, 1:5, 1:4, 1:3, 1:2, 1:1, 2:1, 3:1, 4:1, 5:1, 6:1, 7:1, 8:1, or 9:1.
The repeating units of polymer of Examples in the disclosure are shown in Table 1.
TABLE 1
| | first repeating unit | second repeating unit |
|---|---|---|
| 1/ Polymer (I) and Polymer (II) | 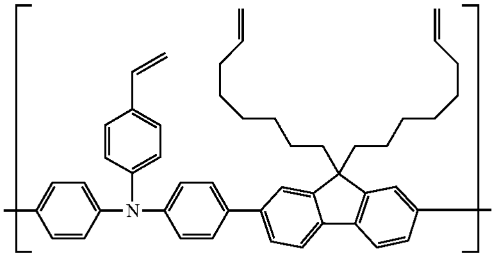 | — |
| Example 2/ Polymer (III) | 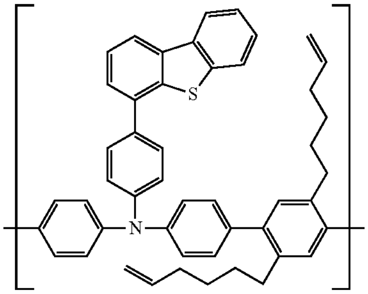 | 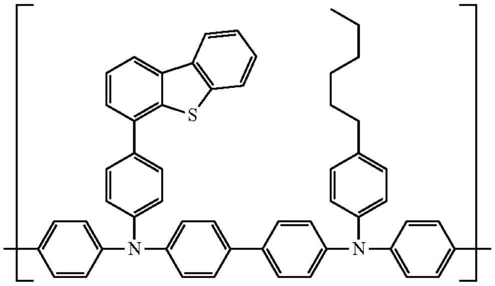 |

TABLE 1-continued
| | first repeating unit | second repeating unit |
|---|---|---|
| Example 3/ Polymer (IV) | 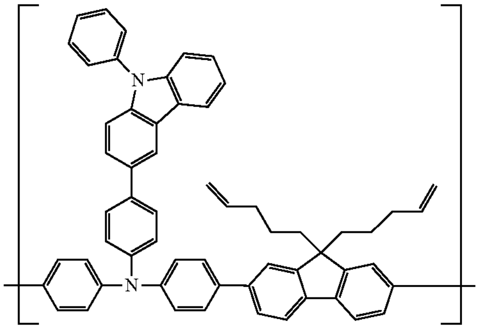 | 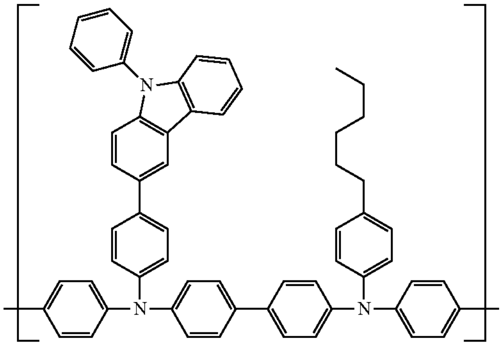 |
| Example 4/ Polymer (V) | 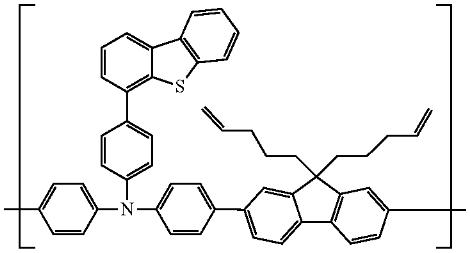 | 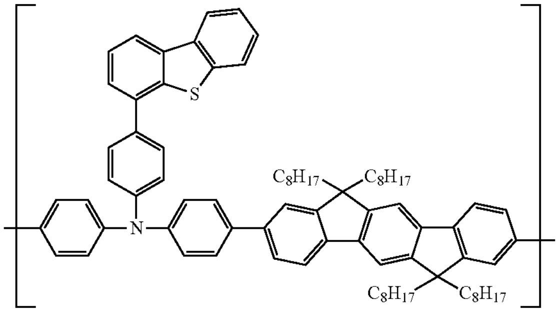 |
| Example 5/ Polymer (VI) | 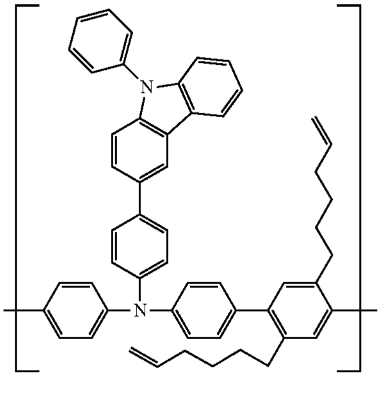 | 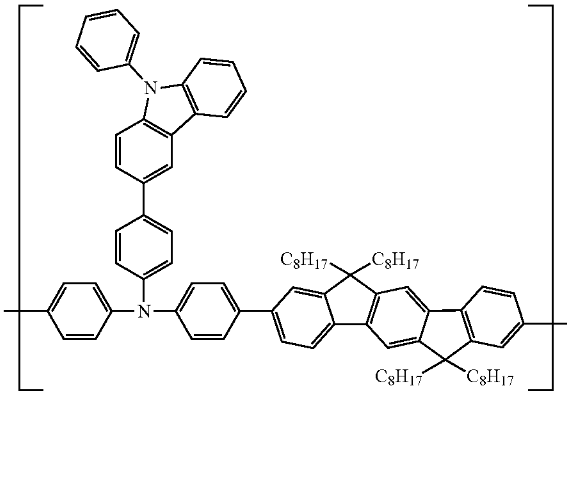 |

TABLE 1-continued

| | first repeating unit | second repeating unit |
|---|---|---|
| Example 6/ Polymer (VII) | 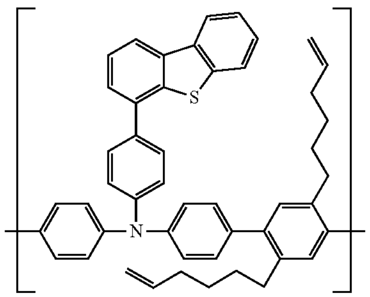 | 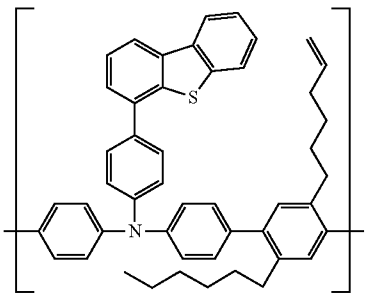 |
| Example 7/ Polymer (VIII) | 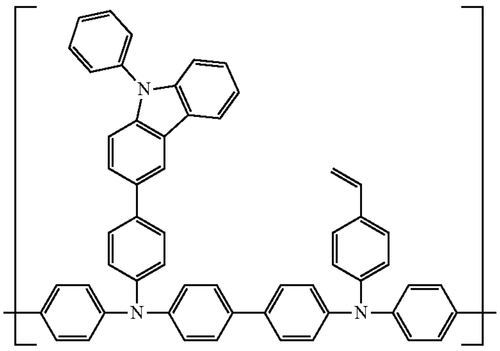 | 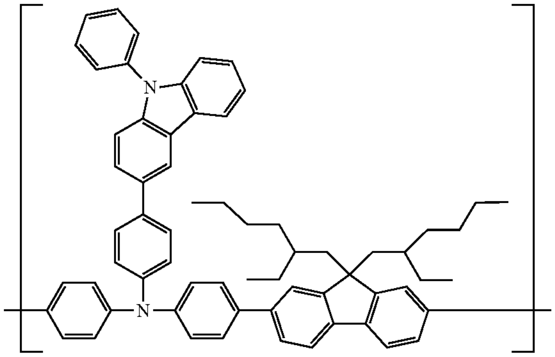 |

In addition the number average molecular weight (Mn), triplet state energy level (ET) highest occupied molecular orbital (HOMO) energy level, and lowest unoccupied molecular orbital (LUMO) energy level of the polymers are shown in Table 2.

TABLE 2

| | first repeating unit/ second repeating unit amount ratio | number average molecular weight (Mn) | triplet state energy level (eV) | highest occupied molecular orbital (HOMO) energy level (eV) | lowest unoccupied molecular orbital (LUMO) energy level (eV) |
|---|---|---|---|---|---|
| Example 1/ Polymer (1) | — | 9,045 | 2.23 | −5.69 | −2.91 |
| Example 1/ Polymer (II) | — | 14,000 | 2.22 | −5.64 | −2.89 |
| Example 2/ Polymer (III) | 3:2 | 2796 | 2.33 | −5.20 | −2.30 |
| Example 3/ Polymer (IV) | 2:3 | 8381 | 2.22 | −5.41 | −2.54 |
| Example 4/ Polymer (V) | 4:1 | 8550 | 2.42 | −5.16 | 2.27 |
| Example 5/ Polymer (VI) | 4:1 | 7839 | 2.15 | −5.47 | −2.66 |
| Example 6/ Polymer (VII) | 4:1 | 7427 | 2.4 | −5.51 | −2.39 |
| Example 7/ Polymer (VIII) | 2:3 | 6775 | 2.71 | −5.36 | −2.51 |

In order to clearly illustrate the method for preparing the polymer of the disclosure, the preparation of polymers disclosed in Examples 1, 2, 3 and 6 are described in detail below.

Preparation of Monomer (I)

Next, Compound (1)(1.70 mmol), Compound (2)(1.70 mmol), tris(dibenzylideneacetone) dipalladium ($Pd_2(dba)_3$) (0.05 mmol), tri-tert-butylphosphonium tetrafluoroborate ($P(^tBu)_3HBF_4$)(0.10 mmol), sodium tert-butoxide ($NaO^tBu$) (2.03 mmol), and toluene (8.5 mL) were mixed, obtaining a first solution. Next, the first solution was stirred at 80° C. for 16 hours, obtaining a second solution. Next, the second solution was extracted with dichloromethane (DCM) and water, and then the organic phase was collected. Next, the organic phase was dehydrated with magnesium sulfate, and then concentrated Next, the result was purified with column chromatography (with n-hexane as the extraction solvent) and subjected to a recrystallization with hexane, obtaining Compound (3). The synthesis pathway of the above reaction was as follows:

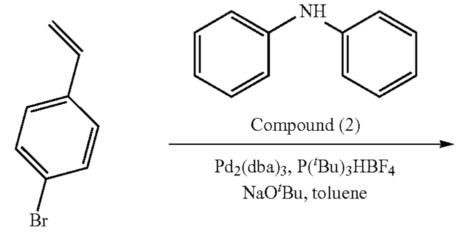

Compound (1)

-continued

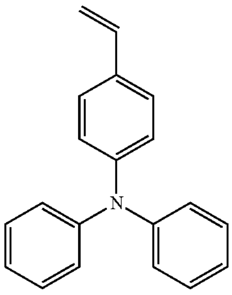

Compound (3)

Next, Compound (3)(3.58 mmol) was dissolved in dimethylformamide (DMF)(27.4 mL), obtaining a first solution. Next, N-bromosuccinimide (NBS) (7.34 mmol) was dissolved in dimethylformamide (DMF)(6.24 mL), obtaining a second solution. Next, after cooling the first solution to 0° C., the second solution was added dropwisely into the first solution. After the reaction was complete, water was added into the result to precipitate a solid. After filtering and drying, Monomer (I) was obtained. The synthesis pathway of the above reaction was as follows:

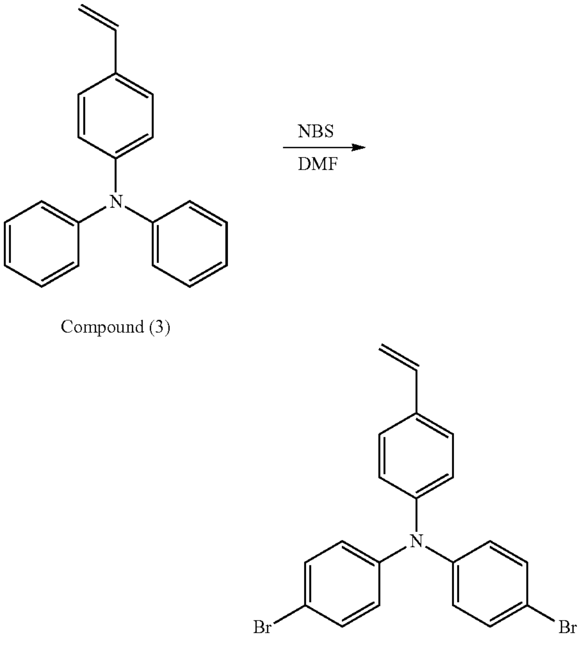

Compound (3)

Monomer (I)

Preparation of Monomer (II)

Next, Compound (4)(0.74 mmol), [1,1'-bis(diphenylphosphino)ferrocene]dichloropalladium (II)($PdCl_2$(dppf))(0.04 mmol), potassium acetate (4.36 mmol) and 1,4-dioxane (7.5 ml) were mixed, obtaining a first solution. Next, the first solution was stirred at 80° C. for 16 hours, obtaining a second solution. Next, the second solution was extracted with ethyl acetate and water, and then the organic phase was collected. Next, the organic phase was dehydrated with magnesium sulfate, concentrated and purified with column chromatography (with n-hexane/ethyl acetate as the extraction solvent), obtaining Monomer (II). The synthesis pathway of the above reaction was as follows:

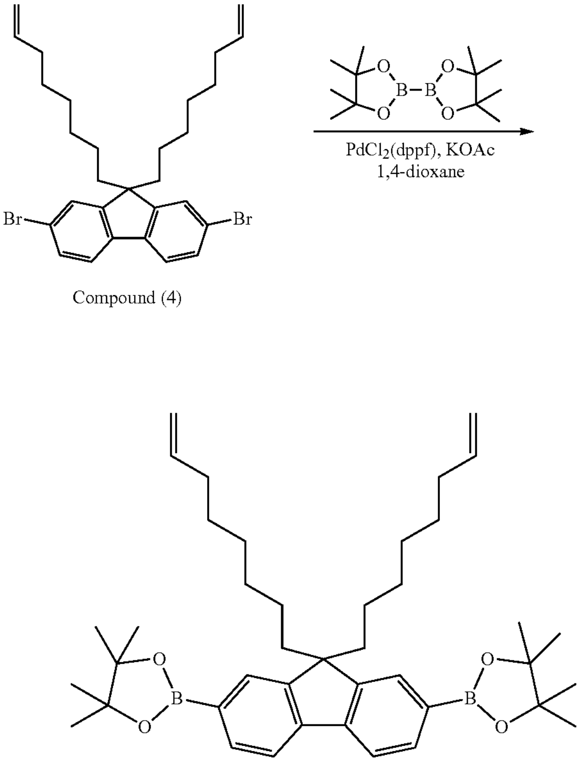

Compound (4)

Monomer (II)

Preparation of Polymer (I)/Polymer (II)

Monomer (I)(0.26 mmol), Monomer (II)(0.27 mmol), tris(dibenzylideneacetone) dipalladium ($Pd_2(dba)_3$)(0.008 mmol), tris(ortho-tolyl)phosphine (P(o-tolyl)$_3$)(0.05 mmol), potassium phosphate ($K_3PO_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, after reacting the second solution at 100° C. for 18 hours, bromobenzene was added into the second solution. The result was stirred at 100° C. for 4 hours. After cooling to room temperature, the result was extracted by toluene and water, and then the organic phase was collected. Next, the organic phase was added into methanol to perform a reprecipitation. The precipitate was washed with methanol, acetone and n-hexane. Next, the result was purified with column chromatography (with toluene as the extraction solvent), obtaining a front stage solution and a rear stage solution. After concentration and drying, Polymer (I)(with an average molecular weight (Mn) of about 9,045) was obtained from the front stage solution, and Polymer (II) was obtained from the rear stage solution (with an average molecular weight of about 14,000)(Polymer (I) and Polymer (II) had the same repeating unit). The synthesis pathway of the above reaction was as follows:

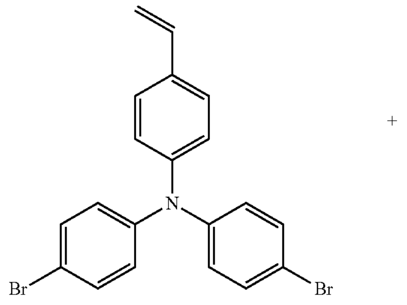

Monomer (I)

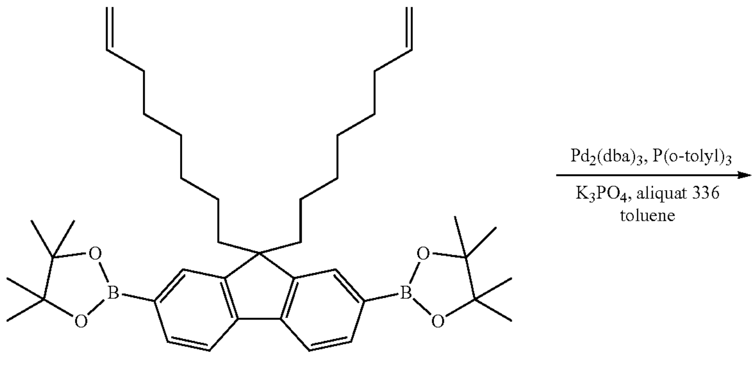

Monomer (II)

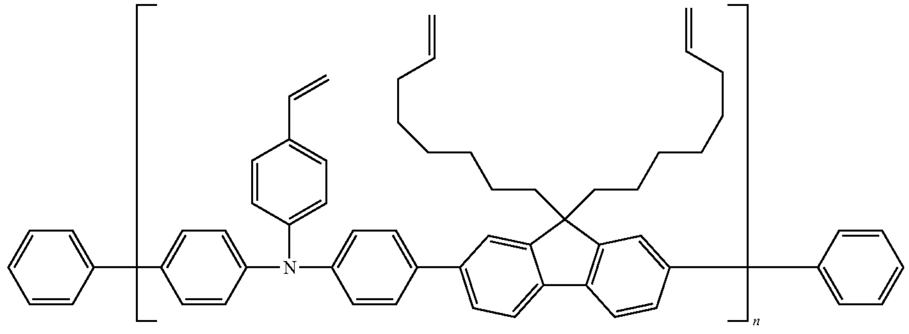

Polymer (I)/Polymer (II) (n > 1)

Preparation of Polymer (III)

Monomer (III)(0.26 mmol), Monomer (IV)(0.1 mmol), Monomer (V) (0.17 mmol), tris(dibenzylideneacetone) dipalladium ($Pd_2(dba)_3$)(0.008 mmol), tris(ortho-tolyl)phosphine (P(o-tolyl)$_3$)(0.05 mmol), potassium phosphate ($K_3PO_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, after reacting the second solution at 100° C. for 18 hours, bromobenzene was added into the second solution. The result was stirred at 100° C. for 4 hours. After cooling to room temperature, the result was extracted by toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (III). The synthesis pathway of the above reaction was as follows:

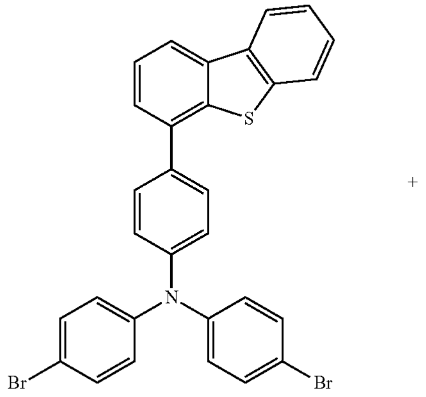

Monomer (III)

-continued

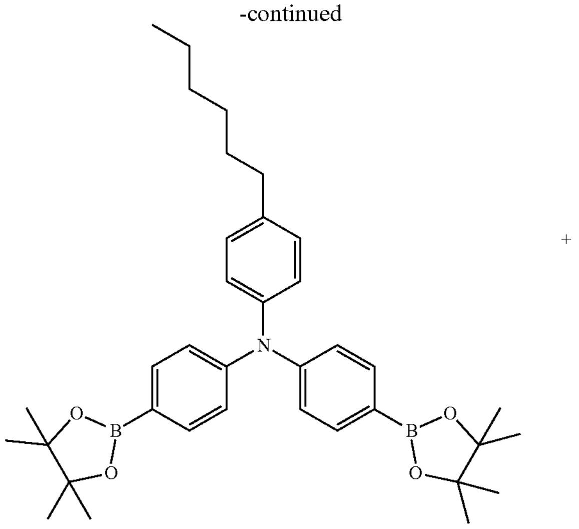

Monomer (IV)

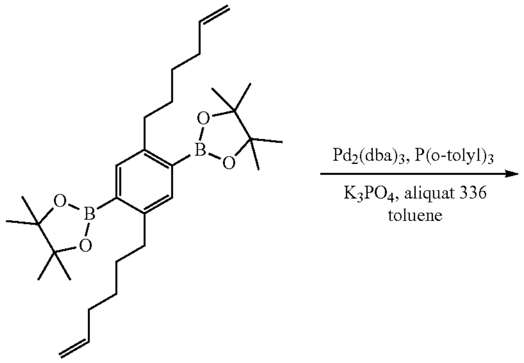

Monomer (V)

Polymer (III)

Preparation of Polymer (IV)

Monomer (VI)(0.26 mmol), Monomer (IV)(0.1 mmol), Monomer (VII) (0.17 mmol), tris(dibenzylideneacetone) dipalladium ($Pd_2(dba)_3$)(0.008 mmol), tris(ortho-tolyl)phosphine ($P(o\text{-}tolyl)_3$)(0.05 mmol), potassium phosphate ($K_3PO_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, after reacting the second solution at 100° C. for 18 hours, bromobenzene was added into the second solution. The result was stirred at 100° C. for 4 hours. After cooling to room temperature, the result was extracted by toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (IV). The synthesis pathway of the above reaction was as follows:

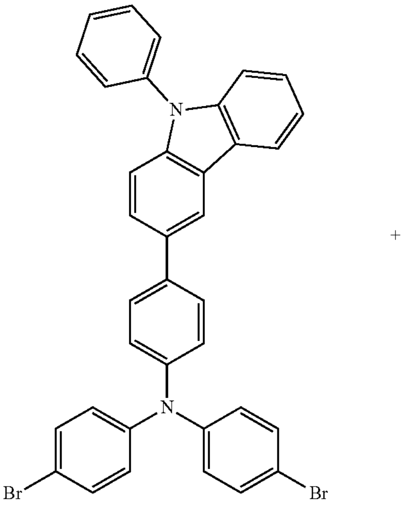

Monomer (VI)

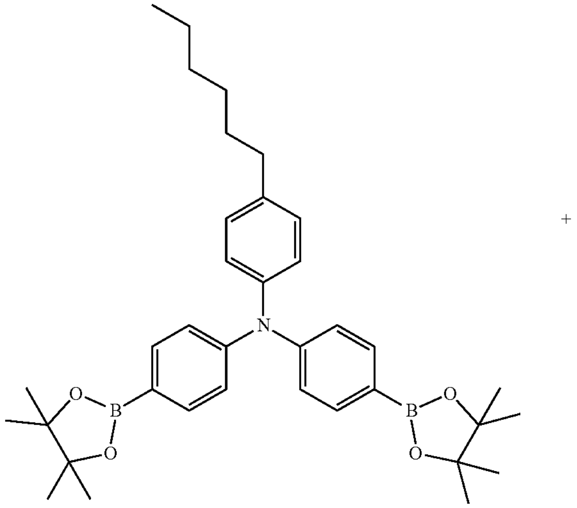

Monomer (IV)

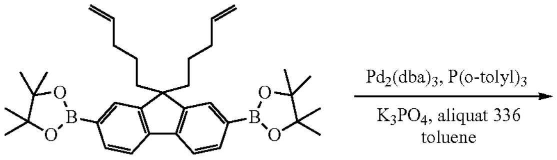

Monomer (VIII)

Polymer (IV)

Preparation of Polymer (VII)

Monomer (III)(0.26 mmol), Monomer (V)(0.1 mmol), Monomer (VIII) (0.17 mmol), tris(dibenzylideneacetone) dipalladium ($Pd_2(dba)_3$)(0.008 mmol), tris(ortho-tolyl)phosphine ($P(o\text{-}tolyl)_3$)(0.05 mmol), potassium phosphate ($K_3PO_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, after reacting the second solution at 100° C. for 18 hours, bromobenzene was added into the second solution. The result was stirred at 100° C. for 4 hours. After cooling to room temperature, the result was extracted by toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (VII). The synthesis pathway of the above reaction was as follows.

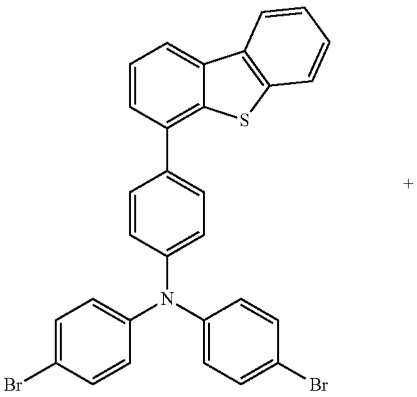

Monomer (III)

-continued

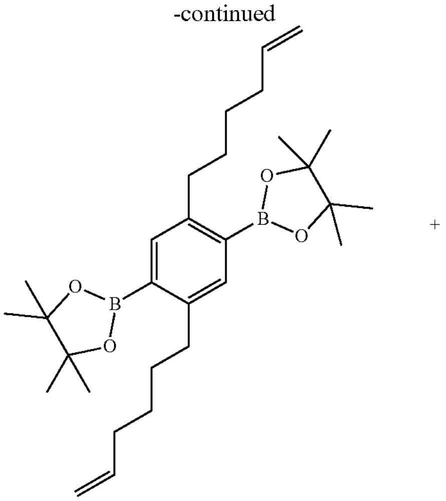

Monomer (V)

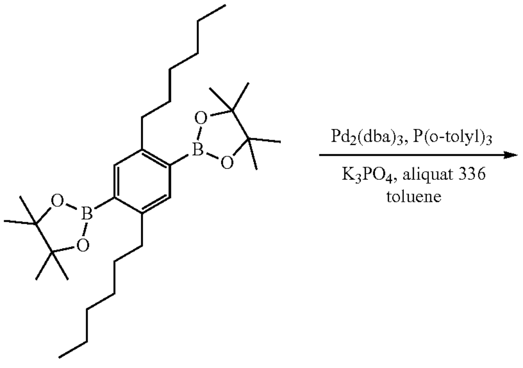

Monomer (VIII)

Polymer (VII)

Next, the measurement results of nuclear magnetic resonance spectrometry of the polymers disclosed in Examples 1-7 are shown in Table 3.

TABLE 3

| | nuclear magnetic resonance spectrum data |
|---|---|
| Polymer(I)/ Polymer (II) | $^1H$ NMR ($CDCl_3$, 500 MHz) δ 7.73-7.72 (m, 4H), 7.55 (d, 2H), 7.18 (d, 4H), 7.05 (d, 2H), 6.63 (d, 1H), 6.35 (d, 6H), 5.7 (d, 2H), 5.61 (d, 1H), 5.18 (d, 1H) 5.03-4.97 (m, 4H), 1.96 (d, 4H), 1.87 (d, 4H), 1.33-1.29 (m, 8H). |
| Polymer (III) | $^1H$ NMR ($CDCl_3$, 500 MHz) δ 7.86-7.74 (m, 3H), 7.53 (d, 1H), 7.39-7.31 (m, 3H), 7.23-7.13 (m, 12H), 6.87 (d, 2H), 6.35 (d, 12H), 5.7 (d, 2H), 5.03-4.97 (m, 4H), 2.55 (d, 6H), 1.96 (d, 4H), 1.62 (d, 6H), 1.33-1.29 (m, 10H), 0.96 (s, 9H). |
| Polymer (IV) | $^1H$ NMR ($CDCl_3$, 500 MHz) δ 7.77-7.72 (m, 5H), 7.55 (d, 3H), 7.46 (d, 1H), 7.40 (d, 1H), 7.3 (d, 6H), 7.23 (d, 2H), 7.18-7.00 (m, 10H), 6.87 (d, 2H), 6.35 (m, 12H), 5.7 (d, 2H), 5.03-4.97 (m, 4H), 2.55 (d, 2H), 1.96 (d, 4H), 1.87 (d, 4H), 1.62 (d, 2H), 1.33-1.29 (m, 14H), 0.96 (s, 3H). |
| Polymer (V) | $^1H$ NMR ($CDCl_3$, 500 MHz) δ 7.86-7.74 (m, 5H), 7.75-7.72 (m, 8H), 7.58-7.53 (m, 5H), 7.39-7.31 (m, 3H), 7.23 (d, 2H), 7.18 (d, 4H), 6.35 (d, 6H), 5.7 (d, 2H), 5.03-4.97 (m, 4H), 1.96 (d, 4H), 1.87 (d, 12H), 1.33-1.29 (d, 56H), 0.96 (s, 12H). |
| Polymer (VI) | $^1H$ NMR ($CDCl_3$, 500 MHz) δ 7.84 (d, 2H), 7.77-7.73 (m, 5H), 7.58-7.55 (m, 3H), 7.46 (d, 1H), 7.40 (d, 1H), 7.3 (d, 6H), 7.23 (d, 2H), 7.18-7.00 (m, 8H), 6.35 (m, 6H), 5.7 (d, 2H), 5.03-4.97 (m, 4H), 1.96 (d, 4H), 1.87 (d, 8H), 1.62 (d, 4H), 1.33-1.29 (d, 52H), 0.96 (s, 18H). |

TABLE 3-continued

| | nuclear magnetic resonance spectrum data |
|---|---|
| Polymer (VII) | $^1$H NMR ($CDCl_3$, 500 MHz) δ 7.86-7.74 (m, 3H), 7.53 (d, 1H), 7.39-7.31 (m, 3H), 7.23 (d, 2H), 7.18-7.13 (m, 8H), 6.35 (d, 6H), 5.7 (d, 2H), 5.03-4.97 (m, 4H), 2.55 (d, 8H), 1.96 (d, 4H), 1.62 (d, 8H), 1.33-1.29 (m, 16H), 0.96 (s, 12H). |
| Polymer (VIII) | $^1$H NMR ($CDCl_3$, 500 MHz) δ 7.77-7.73 (m, 5H), 7.55 (d, 3H), 7.46 (d, 1H), 7.40 (d, 1H), 7.3 (d, 6H), 7.23 (d, 2H), 7.18-7.00 (m, 12H), 6.63 (d, 1H), 6.35 (m, 12H), 5.61 (d, 1H), 5.18 (d, 1H), 1.83 (d, 4H), 1.47 (d, 2H), 1.29-1.25 (d, 10H), 0.96 (s, 12H). |

Quantum Dot Composition and Quantum Dot Light-Emitting Layer

According to embodiments of the disclosure, the disclosure provides a quantum dot composition for preparing a light-emitting layer of light-emitting device. The quantum dot composition of the disclosure includes quantum dot material, the aforementioned polymer, and the crosslinked-monomer, wherein the crosslinked-monomer has at least one of the function groups which can react with the polymer. Due to the addition of the polymer of the disclosure, the quantum dot composition of the disclosure can be used to prepare a patterned film via a lithography process. Furthermore, due to the addition of the polymer of the disclosure, the quantum dot material (used in the quantum dot composition of the disclosure) can be uniformly dispersed in the quantum dot composition without modification thereof. As a result, the addition amount of quantum dot material can be increased. In addition, since the quantum dot material used in the quantum dot composition of the disclosure does not need to be modified, it will not cause quantum dot quenching of the quantum dot material and can improve the luminous efficiency of the display device.

According to embodiments of the disclosure, the quantum dot composition may include 25-80 parts by weight (that number may be 30 parts by weight, 35 parts by weight, 40 parts by weight, 45 parts by weight, 50 parts by weight, 55 parts by weight, 60 parts by weight, 65 parts by weight, 70 parts by weight, or 75 parts by weight) of quantum dot material, 15-70 parts by weight (that number may be 20 parts by weight, 25 parts by weight, 30 parts by weight, 35 parts by weight, 40 parts by weight, 45 parts by weight, 50 parts by weight, 55 parts by weight, 60 parts by weight, 65 parts by weight or 66.67 parts by weight) of polymer, and 2-20 parts by weight (that number may be 3 parts by weight, 4 parts by weight, 5 parts by weight, 6 parts by weight, 7 parts by weight, 8 parts by weight, 9 parts by weight, 10 parts by weight, 11 parts by weight, 12 parts by weight, 13 parts by weight, 14 parts by weight, 15 parts by weight, 16 parts by weight, 17 parts by weight, 18 parts by weight, or 19 parts by weight) of crosslinked-monomer. The total weight of the quantum dot material, polymer, and crosslinked-monomer can be 100 parts by weight. According to embodiments of the disclosure, when the amount of quantum dot material in the quantum dot composition is too low, the obtained quantum dot light-emitting layer exhibits low luminous efficiency. When the amount of quantum dot material in the quantum dot composition is too high, the quantum dot material is easy to precipitate from the quantum dot composition due to aggregation. When the amount of the polymer in the quantum dot composition is too low, the quantum dot composition cannot be exposed and developed. When the amount of the polymer in the quantum dot composition is too high, the driving voltage of the obtained device is too high. When the amount of the crosslinked-monomer in the quantum dot composition is too low, the product prepared from the quantum dot composition is easy to be removed by solvent during development due to the insufficient photoresist crosslinking degree. When the amount of the crosslinked-monomer in the quantum dot composition is too high, the quantum dot composition is not apt to be developed completely and the voltage of the obtained device is too high.

According to embodiments of the disclosure, the quantum dot material used in the quantum dot composition of the disclosure is non-modified quantum dot material. According to embodiments of the disclosure, the quantum dot material used in the quantum dot composition of the disclosure does not be covered or modified by any ligands, i.e. the quantum dot material of the disclosure does not include a ligand layer. According to embodiments of the disclosure, the quantum dot material of the quantum dot composition of the disclosure is non-doped carbon material, doped carbon material, non-modified group II-VI compound, non-modified group III-V compound, non-modified group IV-VI compound, or a combination thereof.

According to embodiments of the disclosure, the doped carbon material is N-doped carbon material. According to embodiments of the disclosure, the carbon material can be graphite oxide, graphene, carbon nanotubes, activated carbon, carbon fiber, or carbon black.

According to embodiments of the disclosure, the non-modified group II-VI compound is cadmium sulfide, cadmium selenide, cadmium telluride, zinc sulfide, zinc selenide, zinc telluride, mercury sulfide, mercury selenide, mercury telluride), zinc oxide, cadmium oxide, mercury oxide, cadmium selenium sulfide, cadmium selenium telluride, cadmium sulfide telluride, cadmium zinc sulfide, cadmium zinc selenide, cadmium zinc telluride, cadmium mercury sulfide, cadmium mercury selenide, cadmium mercury telluride, zinc selenium sulfide, zinc selenium telluride, zinc sulfide telluride, mercury selenium sulfide, mercury selenium telluride, mercury sulfide telluride, mercury zinc sulfide, mercury zinc selenide, cadmium zinc oxide, cadmium mercury oxide, zinc mercury oxide, zinc selenium oxide, zinc tellurium oxide, zinc sulfide oxide, cadmium selenium oxide, cadmium tellurium oxide, cadmium sulfide oxide, mercury selenium oxide, mercury tellurium oxide, mercury sulfide oxide, cadmium zinc selenium sulfide, cadmium zinc selenium telluride, cadmium zinc sulfide telluride, cadmium mercury selenium sulfide, cadmium mercury selenium telluride, cadmium mercury sulfide telluride, mercury zinc selenium sulfide, mercury zinc selenium telluride, mercury zinc sulfide telluride, cadmium zinc selenium oxide, cadmium zinc tellurium oxide, cadmium zinc sulfide oxide, cadmium mercury selenium oxide, cadmium mercury tellurium oxide, cadmium mercury sulfide oxide, zinc mercury selenium oxide, zinc mercury tellurium oxide, or zinc mercury sulfide oxide.

According to embodiments of the disclosure, the non-modified group III-V compound is gallium phosphide, gallium arsenide, gallium antimonide, gallium nitride, aluminum phosphide, aluminum arsenide, aluminum antimonide, aluminum nitride, indium phosphide, indium arsenide, indium antimonide, indium nitride, gallium phosphide arsenide, gallium phosphide antimonide, gallium phosphide nitride, gallium arsenide nitride, gallium antimonide nitride, aluminum phosphide arsenide, aluminum phosphide antimonide, aluminum phosphide nitride, aluminum arsenide nitride, aluminum antimonide nitride, aluminum antimonide nitride, indium phosphide antimonide, indium phosphide nitride, indium arsenide nitride, aluminum gallium phosphide, aluminum gallium arsenide, aluminum gallium antimonide, aluminum gallium nitride, indium gallium phosphide, indium gallium arsenide, indium gallium antimonide, indium gallium nitride, indium antimonide nitride, aluminum indium phosphide, aluminum indium arsenide, aluminum indium antimonide, aluminum indium nitride, aluminum arsenide nitride, gallium aluminum phosphide arsenide, gallium aluminum phosphide antimonide, gallium indium phosphide arsenide, gallium indium aluminum arsenide, gallium aluminum phosphide nitride, gallium aluminum arsenide nitride, gallium aluminum antimonide nitride, gallium indium phosphide nitride, gallium indium arsenide nitride, gallium indium aluminum nitride, gallium antimonide phosphide nitride, gallium arsenide phosphide nitride, gallium arsenide antimonide nitride, gallium indium phosphide antimonide, gallium indium antimonide nitride, gallium phosphide antimonide nitride, indium aluminum phosphide arsenide, indium aluminum phosphide nitride, indium phosphide arsenide nitride, indium aluminum antimonide nitride, indium phosphide antimonide nitride, indium arsenide antimonide nitride, or indium aluminum phosphide antimonide.

The non-modified group IV-VI compound is compound tin oxide, tin sulfide, tin selenide, tin telluride, lead sulfide, lead selenide, lead telluride, germanium oxide, germanium sulfide, germanium selenide, germanium telluride, tin selenium sulfide, tin selenium telluride, tin sulfide telluride, lead selenium sulfide, lead selenium telluride, lead sulfide telluride, tin lead sulfide, tin lead selenide, tin lead telluride, tin oxide sulfide, tin oxide selenide, tin oxide telluride, germanium oxide sulfide, germanium oxide selenide, germanium oxide telluride, tin lead sulfide selenide, tin lead selenium telluride, or tin lead sulfide telluride.

According to embodiments of the disclosure, the cross-linked-monomer used in the quantum dot composition of the disclosure is aliphatic compound with at least one $C_{2-8}$ alkenyl group, aliphatic compound with at least one of acrylate group, aliphatic compound with at least one of methacrylate group, aromatic compound with at least one $C_{2-8}$ alkenyl group, aromatic compound with at least one of acrylate group, or aromatic compound with at least one of methacrylate group.

According to embodiments of the disclosure, the cross-linked-monomer can be diphenylfluorene compound with at least one $C_{2-8}$ alkenyl group, diphenylfluorene compound with at least one of acrylate group, or diphenylfluorene compound with at least one of methacrylate group. According to embodiments of the disclosure, the crosslinked-monomer can be 9,9-bis[4-allyloxyphenyl]fluorene, 9,9-bis[4-(3-acryloxy-2-hydroxypropyloxy)phenyl]fluorene, or 9,9-bis[4-(2-acryloyloxyethyloxy)phenyl]fluorene.

According to embodiments of the disclosure, the cross-linked-monomer can be a compound with one alkenyl group, such as styrene, methylstyrene, ethylstyrene, t-butyl styrene, dimethylstyrene, methoxystyrene, cyclohexylstyrene, vinyl vinylbiphenyl, 1-vinyl-5-hexyl naphthalene, vinyl vinylnaphthalene, vinyl vinylanthracene, 2,4-diisopropylstyrene, 5-t-butyl-2-methylstyrene, tert-butoxystyrene, 4-propyl styrene, 4-dodecylstyrene, 2-ethyl-4-benzylstyrene, N-(4-vinylbenzyl)-N,N-dimethylamine, 4-vinylbenzyl 2-(dimethylamino)ethyl ether, N,N-dimethylaminomethylstyrene, N,N-dimethylaminoethylstyrene, N,N-diethylaminomethylstyrene, N,N-diethylaminoethylstyrene, vinylxylene, vinylpyridine, 2,4,6-trimethylstyrene, α-methyl-2,6-dimethylstyrene, α-methyl-2,4-dimethylstyrene, β-methyl-2,6-dimethylstyrene, or β-methyl-2,4-dimethylstyrene.

According to embodiments of the disclosure, the cross-linked-monomer can be a compound with two or at least two alkenyl group, such as bis(vinylphenyl)ethane, bis(4-vinylphenyl) methane, 1,4-butadiene, divinylacetylene, divinylbenzene, divinyl ether, divinyl sulfide, divinyl sulfone, divinyl sulfoxide, 1,3-divinylcyclohexane, 1,3-divinylcyclopentane, 1,5-hexadiene, isoprene, and 1,2,4-trivinyl cyclohexane (TVCH), divinyl naphthalene), trivinylbenzene, butadiene, isoprene, divinyltoluene, divinylnaphtalene, trivinylnaphtalene, divinylcyclohexane, trivinylcyclohexane, triallyl cyanurate, triallylamine, 1,7-octadiene, 1,5-hexadiene, cyclopentadiene, norbornadiene, diethylene glycol divinyl ether, triethylene glycol divinyl ether, tetraethylene glycol divinyl ether, butanediol divinyl ether, ethylene glycol divinyl ether, ethylene glycol dimethacrylate, trimethylolpropane trimethacrylate, allyl methacrylate, cyclohexanedimethanol divinyl ether, hexanediol divinyl ether, or trimethylolpropane trivinyl ether.

According to embodiments of the disclosure, the cross-linked-monomer can be a compound with one acrylate group or onemethacrylate group, such as methyl methacrylate, 2-phenoxy ethyl acrylate, ethoxylated 2-phenoxy ethyl acrylate, 2-(2-ethoxyethoxy)ethyl acrylate, cyclic trimethylolpropane formal acrylate,β-carboxyethyl acrylate, lauryl acrylate, lauryl methacrylate, isooctyl acrylate, stearyl acrylate, isodecyl acrylate, stearyl methacrylate, isoborny acrylate, isoborny methacrylate, benzyl acrylate, phenoxy ethyl acrylate, ethoxylated phenoxy ethyl acrylate, trimethyl cyclohexane acrylate, 2-(2-Ethoxyethoxy)ethyl acrylate, hydroxyethyl acrylate (HEA), or 2-hydroxyethyl methacrylate (HEMA).

According to embodiments of the disclosure, the cross-linked-monomer can be a compound with two acrylate groups or methacrylate groups, such as dioxane glycol diacrylate, hydroxypivalyl hydroxypivalate diacrylate, 1,6-hexanediol diacrylate, ethoxylated 1,6-hexanediol diacrylate, dipropylene glycol diacrylate, tripropylene glycol diacrylate, tricyclodecane dimethanol diacrylate, polyethylene glycol (200) diacrylate (with a molecular weight of 200), polyethylene glycol (400) diacrylate (with a molecular weight of 400), polyethylene glycol (600) diacrylate (with a molecular weight of 600), polyethylene glycol (200) dimethacrylate (with a molecular weight of 200), polyethylene glycol (400) dimethacrylate (with a molecular weight of 400), 2-hydroxyethyl methacrylate phosphate, neopentyl glycol diacrylate, propoxylated neopentyl glycol diacrylate, ethoxylated bisphenol-A diacrylate, ethoxylated bisphenol-A dimethacrylate, 2-methyl-1,3-propanediol diacrylate, ethoxylated 2-methyl-1,3-propanediol diacrylate, 2-butyl-2-ethyl-1,3-propanediol diacrylate, ethylene glycol dimethacrylate (EGDMA), triethylene glycol dimethacrylate, diethylene glycol dimethacrylate, 1,4-butanediol diacrylate, 1,6-hexanediol dimethacrylate, allylated cyclohexyl dimethacrylate, or a combination of the aforementioned cross-linked-monomer.

According to embodiments of the disclosure, the cross-linked-monomer can be a compound with three or at least three acrylate groups or methacrylate groups, such as tris (2-hydroxy ethyl)isocyanurate triacrylate, pentaerythritol triacrylate, ethoxylated trimethylolpropane triacrylate, ethoxylated trimethylolpropane trimethacrylate, propoxylated trimethylolpropane triacrylate, trimethylolpropane trimethacrylate, trimethylolpropane triacrylate, pentaerythritol triacrylate, ethoxylated pentaerythritol triacrylate, propoxylated glycerol triacrylate, propoxylated pentaerythritol triacrylate, pentaerythritol tetraacrylate, ethoxylated pentaerythritol tetraacrylate, propoxylated pentaerythritol tetraacrylate, bis(trimethylolpropane)tetraacrylate, or dipentaerythritol hexaacrylate.

According to embodiments of the disclosure, the quantum dot composition can further include an initiator in order to form a patterned layer via a lithography process. The initiator can be photo initiator, thermal initiator, or a combination thereof. The amount of initiator may be 0.1 to 10 parts by weight (that number may be 0.5 to 9 parts by weight, or 1 to 10 parts by weight), and the total weight of the quantum dot material, polymer, and crosslinked-monomer can be 100 parts by weight.

According to embodiments of the disclosure, the photo initiator can be benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, 2,4,6-trimethylbenzoyl diphenyl phosphine oxide, N-phenylglycine, 9-phenylacridine, benzyldimethylketal, 4,4'-bis(diethylamino)benzophenone, 2,4,5-triarylimidazole dimers, or a combination thereof.

According to embodiments of the disclosure, the initiator can be a peroxide initiator, azo compound initiator, or persulfate initiator. According to embodiments of the disclosure, the peroxide initiator can be benzoyl peroxide, 1,1-bis(tert-butylperoxy)cyclohexane), 2,5-bis(tert-butylperoxy)-2,5-dimethylcyclohexane, 2,5-bis(tert-butylperoxy)-2,5-dimethyl-3-cyclohexyne, bis(1-(tert-butylpeorxy)-1-methy-ethyl)benzene, tert-butyl hydroperoxide, tert-butyl peroxide, tert-butyl peroxybenzoate, cumene hydroperoxide, cyclohexanone peroxide, dicumyl peroxid, lauroyl peroxide, or a combination thereof. According to embodiments of the disclosure, the azo compound initiator can be N,N'-azobisisobutyronitrile (AIBN), 2,2'-azobisisoheptonitrile (ABVN), 2,2'-azobis-(2-methylbutyronitrile (AMBN), 1,1'-Azobis(cyclohexane-1-carbonitrile (ACCN), 1-((cyano-1-methylethyl)azo) formamide (CABN), 2,2'-azobis(2-methylpropionamide)dihydrochloride (AIBA), dimethyl 2,2'-azobis(2-methylpropionate (AIBME), 2,2'-azobis[2-(2-imidazolin-2-yl)propane]dihydrochloride (AIBI), or a combination thereof. According to embodiments of the disclosure, the persulfate initiator can be sodium persulfate, potassium persulfate, ammonium persulfate, or a combination thereof.

According to embodiments of the disclosure, in addition to the initiator, the quantum dot composition of the disclosure may further include other components as required, such as additives known in the art, to improve the mechanical strength, electrical characteristics, chemical resistance, heat resistance, adhesion, film uniformity, and resolution of the patterned film formed by quantum dot composition after lithography process. Examples of the well-known additives include, but are not limited to, an adhesion modifier, level agent, surface treatment agent, visibility modifier, stabilizer, and antioxide. The additive can be used alone or in combination. The amount of the aforementioned additive is not particularly limited and can be adjusted depending on the need of persons with ordinary skill in the art after reading the disclosure of the subject specification. For example, the amount of the additive can be about 0.1 to 200 parts by weight, and the total weight of the quantum dot material, polymer, and crosslinked-monomer can be 100 parts by weight.

According to embodiments of the disclosure, the quantum dot composition can further include a solvent, so that all components of the quantum dot composition can be uniformly dispersed in the solvent. According to embodiments of the disclosure, the solvent can be benzene, toluene, xylene, ethylbenzene, diethylbenzen, trimethylbenzene, triethylbenzene, cyclohexane, cyclohexene, decahydronaphthalene, dipentene, pentane, hexane, heptane, octane, nonane, decane, ethyl cyclohexane, methyl cyclohexane, cyclohexane, cyclohexene, p-menthane, dipropyl ether, dibutyl ether, anisole, butyl acetate, pentyl acetate, methyl isobutyl ketone, cyclohexylbenzene, cyclohexanone, cyclopentanone (CPN), triglyme, 1,3-dimethyl-2-imidazolidinone (DMI), N-methyl-2-pyrrolidone (NMP), methyl ethyl ketone (MEK), N,N-dimethylacetamide (DMAc),γ-butyrolactone (GBL), N,N-Dimethylformamide (DMF), propylene glycol methyl ether acetate (PGMEA), or dimethyl sulfoxide (DMSO). According to embodiments of the disclosure, the amount of solvent is not particularly limited as long as the components of the quantum dot composition can be uniformly dispersed therein. According to embodiments of the disclosure, the amount of the solvent can be 200 parts by weight to 15000 parts by weight, wherein the total weight of the quantum dot material, polymer, and crosslinked-monomer can be 100 parts by weight.

According to embodiments of the disclosure, the quantum dot composition of the disclosure may consist of the quantum dot material, polymer, and crosslinked-monomer. According to embodiments of the disclosure, the quantum dot composition of the disclosure may consist of the quantum dot material, polymer, crosslinked-monomer, and solvent. According to embodiments of the disclosure, the quantum dot composition of the disclosure may consist of the quantum dot material, polymer, crosslinked-monomer, solvent, and initiator. According to embodiments of the disclosure, the quantum dot composition of the disclosure may consist of the quantum dot material, polymer, crosslinked-monomer, and initiator. According to embodiments of the disclosure, the quantum dot composition of the disclosure may consist of the quantum dot material, polymer, crosslinked-monomer, solvent, initiator, and additive, wherein the additive may consist of the adhesion modifier, leveling agent, surface treatment agent, viscosity modifier, stabilizer, and antioxidant. According to embodiments of the disclosure, the foaming composition of the disclosure may consist of a main ingredient and a minor ingredient, wherein the main ingredient may consist of the quantum dot material, polymer, and crosslinked-monomer. The minor ingredient may consist of the solvent, initiator, adhesion modifier, leveling agent, surface treatment agent, viscosity modifier, stabilizer, and antioxidant. According to embodiments of the disclosure, the quantum dot composition of the disclosure can substantially consist of the quantum dot material, polymer, and crosslinked-monomer. The other ingredient is solvent, initiator, adhesion modifier, leveling agent, surface treatment agent, viscosity modifier, stabilizer, or antioxidant. According to embodiments of the disclosure, the quantum dot composition of the disclosure includes the polymer of the disclosure. Due to the specific structure of the polymer (having a reactable alkenyl group) and the specific components and amount of the quantum dot composition, the quantum dot material used in the quantum dot composition of the disclosure shall not be modified and the amount of the quantum dot material may be not increased, thereby improving the luminous efficiency of the display device (prepared by the quantum dot composition) by having the layer prepared via the lithography process.

According to embodiments of the disclosure, the disclosure also provides a quantum dot light-emitting layer, which is prepared from the quantum dot composition of the disclosure. According to embodiments of the disclosure, the quantum dot composition of the disclosure can be used to prepare a patterned film (serving as quantum dot light-emitting layer) via a lithography process. The lithography process may include the following steps. The quantum dot composition is coated on a suitable substrate, wherein the substrate can be a silicon substrate, glass, or ITO glass. Furthermore, any desired layer can be formed on the substrate first. A suitable method for coating the quantum dot composition includes, but is not limited to, spin coating, roller coating, screen coating, curtain coating, dip coating, and spray coating. In an embodiment of the disclosure, a coating can be pre-baked at 30° C.-120° C. for a few minutes to evaporate the solvent contained therein. Next, the coating with a photo-mask is exposed to radiation. The aforementioned irradiation may, for example, be an X-ray, an electron beam, a UV ray, a visible ray, or any photo source suitable for use as an irradiation source. After exposure, the coating is subsequently developed with a developer solution, obtaining a patterned layer. The developing process can be accomplished by soaking, spraying or coating, or using another known development method. Herein, the developer solution can be the same as the solvent of the quantum dot composition. Finally, the patterned film is baked, wherein the baking temperature can be 50-150° C. Since the quantum dot composition has a specific polymer and the non-modified quantum dots of the disclosure, the film obtained by the lithography process has good luminous efficiency and carrier transport properties.

In order to clearly disclose the organic light-emitting devices of the disclosure, the following examples are intended to illustrate the disclosure more fully without limiting their scope.

Example 8

76.19 parts by weight of quantum dot material (sold and manufactured by Taiwan Nanocrystals INC. with a trade number of NCQD-R), 19.05 parts by weight of Polymer (1) prepared by Example 1, 4.76 parts by weight of crosslinked-monomer (isobornyl acrylate, IBOA), and 1.9 parts by weight of initiator (isopropylthioxanthone (ITX) and phenyl bis(2,4,6-trimethylbenzoyl)-phosphine oxide (sold and manufactured by BASF with a trade number of TPO)(the ratio of ITX to TPO was 1:1)) were dissolved in toluene (the ratio of ITX to TPO was 1:1), obtaining Quantum dot composition (1)(with a solid content of 2 wt %).

Example 9

72.73 parts by weight of quantum dot material (sold and manufactured by Unique Materials Co., Ltd with a trade number of UM-InP-G), 18.18 parts by weight of Polymer (1) prepared by Example 1, 9.09 parts by weight of Crosslinked-monomer (isobornyl acrylate, IBOA), and 1.82 parts by weight of initiator (isopropylthioxanthone (ITX) and phenyl bis(2,4,6-trimethylbenzoyl)-phosphine oxide (sold and manufactured by BASF with a trade number of TPO)(the ratio of ITX to TPO was 1:1)) were dissolved in 9776 parts by weight of toluene, obtaining Quantum dot composition (2).

Example 10

76.19 parts by weight of quantum dot material (sold and manufactured by Unique Materials Co., Ltd with a trade number of UM-InP-G), 19.05 parts by weight of Polymer (2) prepared by Example 1, 4.76 parts by weight of Crosslinked-monomer (isobornyl acrylate, IBOA), and 1.9 parts by weight of initiator (isopropylthioxanthone (ITX) and phenyl bis(2,4,6-trimethylbenzoyl)-phosphine oxide (sold and manufactured by BASF with a trade number of TPO)(the ratio of ITX to TPO was 1:1)) were dissolved in 9786 parts by weight of cyclohexylbenzene, obtaining Quantum dot composition (3).

Example 11

47.62 parts by weight of quantum dot material (sold and manufactured by Taiwan Nanocrystals INC. with a trade number of NCQD-R), 47.62 parts by weight of Polymer (1) prepared by Example 1, 4.76 parts by weight of Crosslinked-monomer (isobornyl acrylate, IBOA), and 4.76 parts by weight of initiator (phenyl bis(2,4,6-trimethylbenzoyl)-phosphine oxide (sold and manufactured by BASF with a trade number of Lucirin TPO) were dissolved in 9780 parts by weight of toluene, obtaining Quantum dot composition (4).

Example 12

47.62 parts by weight of quantum dot material (sold and manufactured by Unique Materials Co., Ltd with a trade number of UM-InPR), 47.62 parts by weight of Polymer (1) prepared by Example 1, 4.76 parts by weight of Crosslinked-monomer (isobornyl acrylate, IBOA), and 4.76 parts by weight of initiator (phenyl bis(2,4,6-trimethylbenzoyl)-phosphine oxide (sold and manufactured by BASF with a trade number of Lucirin TPO) were dissolved in 9780 parts by weight of toluene, obtaining Quantum dot composition (5).

Example 13

28.57 parts by weight of quantum dot material (sold and manufactured by Taiwan Nanocrystals INC. with a trade number of NCQD-R), 66.67 parts by weight of Polymer (1) prepared by Example 1, 4.76 parts by weight of Crosslinked-monomer (isobornyl acrylate, IBOA), and 5.24 parts by weight of initiator (sold and manufactured by S.M.S. Technology CO., Ltd with a trade number of 1201) were dissolved in 9779 parts by weight of anisole, obtaining Quantum dot composition (6).

Example 14

28.57 parts by weight of quantum dot material (sold and manufactured by Taiwan Nanocrystals INC. with a trade number of NCQD-R), 66.67 parts by weight of Polymer (7) prepared by Example 6, 4.76 parts by weight of Crosslinked-monomer (isobornyl acrylate, IBOA), and 5.24 parts by weight of initiator (sold and manufactured by S.M.S. Technology CO., Ltd with a trade number of 1201) were dissolved in 9779 parts by weight of phenylcyclohexane, obtaining Quantum dot composition (7).

Example 15

28.57 parts by weight of quantum dot material (sold and manufactured by Taiwan Nanocrystals INC. with a trade number of NCQD-G), 66.67 parts by weight of Polymer (7) prepared by Example 6, 4.76 parts by weight of Crosslinked-monomer (isobornyl acrylate, IBOA), and 5.24 parts by weight of initiator (sold and manufactured by S.M.S. Technology CO., Ltd with a trade number of 1201) were dissolved in 9779 parts by weight of phenylcyclohexane, obtaining Quantum dot composition (8).

Example 16

28.57 parts by weight of quantum dot material (sold and manufactured by Unique Materials Co., Ltd with a trade number of UM-InP-G, 66.67 parts by weight of Polymer (7) prepared by Example 6, 4.76 parts by weight of Crosslinked-monomer (isobornyl acrylate, IBOA), and 5.24 parts by weight of initiator (sold and manufactured by S.M.S. Technology CO., Ltd with a trade number of 1201) were dissolved in 9779 parts by weight of phenylcyclohexane, obtaining Quantum dot composition (9).

Example 17

28.57 parts by weight of quantum dot material (sold and manufactured by Unique Materials Co., Ltd with a trade number of UM-InP-R, 66.67 parts by weight of Polymer (7) prepared by Example 6, 4.76 parts by weight of Crosslinked-monomer (isobornyl acrylate, IBOA), and 5.24 parts by weight of initiator (sold and manufactured by S.M.S. Technology CO., Ltd with a trade number of 1201) were dissolved in 9779 parts by weight of phenylcyclohexane, obtaining Quantum dot composition (10).

Comparative Example 1

44.44 parts by weight of quantum dot material (quantum dot material of green indium phosphide zinc sulfide core-shell structure), and 55.56 parts by weight of crosslinked-monomer (sold and manufactured by Covestro Resins (Taiwan) Ltd with a trade number of STRE92-01S) were dissolved in 9928 parts by weight of propylene glycol methyl ether acetate (PGMEA), obtaining Quantum dot composition (11).

Comparative Example 2

44.44 parts by weight of quantum dot material (quantum dot material of red indium phosphide zinc sulfide core-shell structure), and 55.56 parts by weight of crosslinked-monomer (sold and manufactured by Covestro Resins (Taiwan) Ltd with a trade number of STRE92-01S) were dissolved in 9787 parts by weight of propylene glycol methyl ether acetate (PGMEA), obtaining Quantum dot composition (12).

Properties test of quantum dot composition Quantum dot compositions (1)-(12) were subjected the lithography process, and the resolution of the result was measured. The lithography process includes following steps. Quantum dot composition (1)-(12) were individually coated on an indium tin oxide (ITO)(with a thickness of 150 nm, 30 seconds) glass substrate by rotating speed of 500 rpm and then baked to obtain a film. Next, the film was irradiated with a mercury arc lamp (having a wavelength between 250-400 nm). Next, the film was developed with a developer (development time was 10 seconds-several minutes). Finally, the film was baked to obtain the quantum dot light-emitting layer at various temperature.

Next, the patternability of the obtained quantum dot light-emitting layer was determined. The test was marked with O when the film is a patterned film, and the test was marked with X when the film is not a patterned film. The results are shown in Table 4.

TABLE 4

| composition | polymer | quantum dot material | developer | Baking temperature | Patternability |
|---|---|---|---|---|---|
| Quantum dot composition (1) | Polymer (I) | NCQD-R | toluene | 100° C. | O |
| Quantum dot composition (2) | Polymer (I) | UM-InP-G | toluene | 100° C. | O |
| Quantum dot composition (3) | Polymer (I) | UM-InP-G | toluene/ octane | 100° C. | O |
| Quantum dot composition (4) | Polymer (I) | NCQD-R | toluene | 100° C. | O |
| Quantum dot composition (5) | Polymer (I) | UM-InPR | toluene | 80° C. | O |
| Quantum dot composition (6) | Polymer (I) | NCQD-R | toluene | 100° C. | O |
| Quantum dot composition (7) | Polymer (VII) | NCQD-R | phenylcyclo-hexane | 100° C. | O |
| Quantum dot composition (8) | Polymer (VII) | NCQD-G | phenylcyclo-hexane | 80° C. | O |
| Quantum dot composition (9) | Polymer (VII) | UM-InP-G | phenylcyclo-hexane | 100° C. | O |
| Quantum dot composition (8) | Polymer (VII) | NCQD-G | phenylcyclo-hexane | 100° C. | O |
| Quantum dot composition (10) | Polymer (VII) | UM-InP-R | phenylcyclo-hexane | 100° C. | O |
| Quantum dot composition (11) | — | indium phosphide zinc sulfide | PGMEA | 100° C. | X |
| Quantum dot composition (12) | — | indium phosphide zinc sulfide | PGMEA | 150° C. | X |

As shown in Table 4, when the quantum dot composition does not include the polymer described in the disclosure (i.e. the quantum dot compositions (11) and (12) of Comparative Example 1 and 2), a patterned film cannot be formed via a lithography process.

Light-Emitting Device

FIGURE shows an embodiment of a light-emitting device 10. The light-emitting device 10 includes a substrate 12, a bottom electrode 14, a light-emitting element 16, and a top electrode 18. According to another embodiment of the disclosure, the light-emitting device can be an organic light-emitting diode (OLED) display device or a quantum dot light-emitting diode (QLED) display device.

The light-emitting device can be a top-emission, bottom-emission, or dual-emission device. The substrate 12 can be a glass, plastic, or semiconductor substrate. Suitable materials for the bottom and top electrodes can be Li, Mg, Ca, Al, Ag, In, Au, W, Ni, Pt, Cu, indium tin oxide (ITO), indium zinc oxide (IZO), aluminum zinc oxide (AZO), zinc oxide (ZnO), or combination thereof, formed by thermal evaporation, sputtering or Plasma enhanced chemical vapor deposition. Furthermore, at least one of the bottom and top electrodes 14 and 18 is transparent.

According to embodiments of the disclosure, the light-emitting element 16 at least includes a layer prepared from the quantum dot composition of the disclosure. Namely, at least one layer in the light-emitting element 16 is prepared from the quantum dot composition of the disclosure. According to embodiments of the disclosure, the light-emitting element 16 at least includes a light emitting layer and a charge transport layer, wherein the charge transport layer can be a hole injection layer, a hole transport layer, an electron transport layer, an electron injection layer, or a combination thereof. According to some embodiments of the disclosure, the light-emitting element 16 at least includes a light emitting layer and an electron transport layer, wherein the light emitting layer is prepared from the quantum dot composition of the disclosure.

In order to clearly disclose the organic light-emitting devices of the disclosure, Examples of light-emitting device, which has a light-emitting layer prepared from the quantum dot composition of the aforementioned Examples, are provided.

Example 18

A glass substrate with an indium tin oxide (ITO) film (with a thickness of 150 nm) washed with a neutral cleaning agent, acetone, and isopropanol with ultrasonic agitation was provided and served as a bottom electrode. After drying with nitrogen flow, the ITO film was subjected to a UV/ozone treatment for 30 min. Next, Quantum dot composition (1) of Example 8 was coated on the bottom electrode. After illumination and baking, a light-emitting layer was obtained. Next, an electron transport layer (zinc oxide layer with a thickness of 2 nm, made of zinc oxide solution (contains zinc oxide and glycol methyl ether, solid content is 10%) was formed on the light-emitting layer by spin coating (with a rotational speed of 2000 rpm). Next, a top electrode (Al, with a thickness of 120 nm) was formed on the electron transport layer. After encapsulation, Light-emitting device (I) was obtained. Next, the electroluminous wavelength and C.I.E coordinate of Light-emitting device (I) were measured by a spectra colorimeter and a luminance meter. The results are shown in Table 5.

Example 19

Example 19 was performed in the same manner as in Example 18 except that Quantum dot composition (2) of Example 9 was substituted for Quantum dot composition (1) of Example 8, obtaining Light-emitting device (II). Next, the electroluminous wavelength and C.I.E coordinate of Light-emitting device (II) were measured by a spectra colorimeter and a luminance meter. The results are shown in Table 5.

Example 20

Example 20 was performed in the same manner as in Example 18 except that Quantum dot composition (3) of Example 10 was substituted for Quantum dot composition (1) of Example 8, obtaining Light-emitting device (III). Next, the electroluminous wavelength and C.I.E coordinate of Light-emitting device (III) were measured by a spectra colorimeter and a luminance meter. The results are shown in Table 5.

Example 21

Example 21 was performed in the same manner as in Example 18 except that Quantum dot composition (7) of Example 14 was substituted for Quantum dot composition (1) of Example 8, obtaining Light-emitting device (IV). Next, the electroluminous wavelength and C.I.E coordinate of Light-emitting device (IV) were measured by a spectra colorimeter and a luminance meter. The results are shown in Table 5.

Example 22

Example 21 was performed in the same manner as in Example 18 except that Quantum dot composition (8) of Example 15 was substituted for Quantum dot composition (1) of Example 8, obtaining Light-emitting device (V). Next, the electroluminous wavelength and C.I.E coordinate of Light-emitting device (V) were measured by a spectra colorimeter and a luminance meter. The results are shown in Table 5.

TABLE 5

| | luminous wavelength (nm) | C.I.E coordinate |
|---|---|---|
| Example 18 | 630.6 | (0.646, 0.351) |
| Example 19 | 535.1 | (0.263, 0.699) |
| Example 20 | 624.4 | (0.648, 0.351) |
| Example 21 | 628.5 | (0.645, 0.346) |
| Example 22 | 528.3 | (0.241, 0.685) |

It will be clear that various modifications and variations can be made to the disclosed methods and materials. It is intended that the specification and examples be considered as exemplary only, with the true scope of the disclosure being indicated by the following claims and their equivalents.

What is claimed is:

1. A quantum dot composition, comprising:

25-80 parts by weight of a quantum dot material;

15-70 parts by weight of a polymer, wherein the polymer has a first repeating unit, wherein the first repeating unit has a structure represented by Formula (I):

Formula (I)

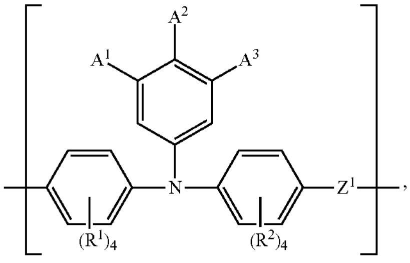

, wherein $A^1$ and $A^3$ are hydrogen $A^2$ is vinyl,

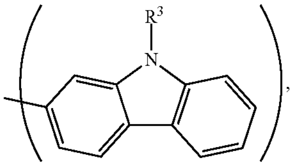

,

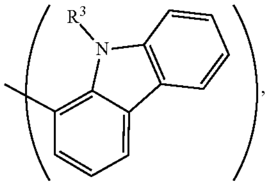

,

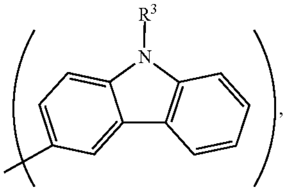

,

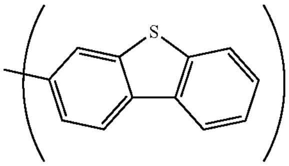

or

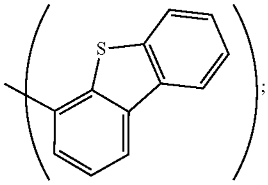

;

$R^1$ and $R^2$ are independently hydrogen, halogen, or $C_{1-2}$ alkyl group; $R^3$ is hydrogen, phenyl group, biphenyl group, or naphthyl group; $Z^1$ is

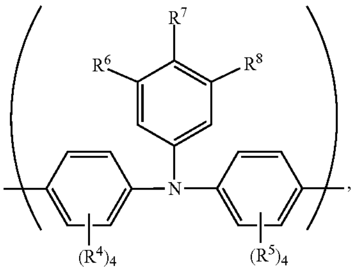

,

-continued

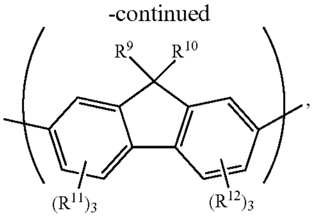

,

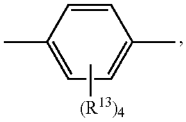

,

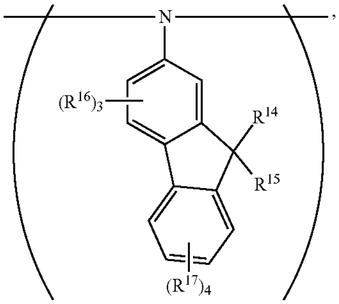

, or

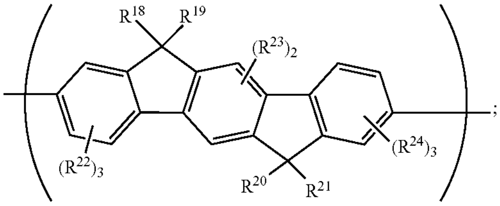

;

$R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen

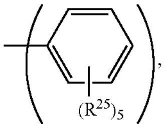

, $C_{3-10}$ alkyl group, or $C_{2-10}$ alkenyl group, and at least one of $R^6$, $R^7$ and $R^8$ is $C_{2-10}$ alkenyl group or

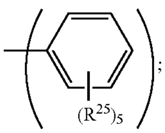

;

$R^9$ and $R^{10}$ are independently $C_{2-10}$ alkenyl group; $R^{13}$ is independently hydrogen, $C_{3-10}$ alkyl group, or $C_{2-10}$ alkenyl group, and at least one of $R^{13}$ is $C_{2-10}$ alkenyl group; $R^{14}$ and $R^{15}$ are independently hydrogen, $C_{3-10}$ alkyl group, or $C_{2-10}$ alkenyl group, and at least one of $R^{14}$ and $R^{15}$ is $C_{2-10}$ alkenyl group; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is $C_{2-10}$ alkenyl group; and $R^{25}$ is independently hydrogen, $C_{3-10}$ alkyl group, or $C_{2-10}$ alkenyl group, and at least one of $R^{25}$ is $C_{2-10}$ alkenyl group; and 2-20 parts by weight of a crosslinked-monomer, wherein the monomer has at least one $C_{2-8}$ alkenyl group, at least one acrylate group, or at least one methacrylate group.

2. The quantum dot composition as claimed in claim 1, wherein the quantum dot material is non-doped carbon material, doped carbon material, non-modified group II-VI compound, non-modified group III-V compound, non-modified group IV-VI compound, or a combination thereof.

3. The quantum dot composition as claimed in claim 2, wherein the non-modified group II-VI compound is cadmium sulfide, cadmium selenide, cadmium telluride, zinc sulfide, zinc selenide, zinc telluride, mercury sulfide, mercury selenide, mercury telluride, zinc oxide, cadmium oxide, mercury oxide, cadmium selenium sulfide, cadmium selenium telluride, cadmium sulfide telluride, cadmium zinc sulfide, cadmium zinc selenide, cadmium zinc telluride, cadmium mercury sulfide, cadmium mercury selenide, cadmium mercury telluride, zinc selenium sulfide, zinc selenium telluride, zinc sulfide telluride, mercury selenium sulfide, mercury selenium telluride, mercury sulfide telluride, mercury zinc sulfide, mercury zinc selenide, cadmium zinc oxide, cadmium mercury oxide, zinc mercury oxide, zinc selenium oxide, zinc tellurium oxide, zinc sulfide oxide, cadmium selenium oxide, cadmium tellurium oxide, cadmium sulfide oxide, mercury selenium oxide, mercury tellurium oxide, mercury sulfide oxide, cadmium zinc selenium sulfide, cadmium zinc selenium telluride, cadmium zinc sulfide telluride, cadmium mercury selenium sulfide, cadmium mercury selenium telluride, cadmium mercury sulfide telluride, mercury zinc selenium sulfide, mercury zinc selenium telluride, mercury zinc sulfide telluride, cadmium zinc selenium oxide, cadmium zinc tellurium oxide, cadmium zinc sulfide oxide, cadmium mercury selenium oxide, cadmium mercury tellurium oxide, cadmium mercury sulfide oxide, zinc mercury selenium oxide, zinc mercury tellurium oxide, or zinc mercury sulfide oxide.

4. The quantum dot composition as claimed in claim 2, wherein the non-modified group III-V compound is gallium phosphide, gallium arsenide, gallium antimonide, gallium nitride, aluminum phosphide, aluminum arsenide, aluminum antimonide, aluminum nitride, indium phosphide, indium arsenide, indium antimonide, indium nitride, gallium phosphide arsenide, gallium phosphide antimonide, gallium phosphide nitride, gallium arsenide nitride, gallium antimonide nitride, aluminum phosphide arsenide, aluminum phosphide antimonide, aluminum phosphide nitride, aluminum arsenide nitride, aluminum antimonide nitride, aluminum antimonide nitride, indium phosphide antimonide, indium phosphide nitride, indium arsenide nitride, aluminum gallium phosphide, aluminum gallium arsenide, aluminum gallium antimonide, aluminum gallium nitride, indium gallium phosphide, indium gallium arsenide, indium gallium antimonide, indium gallium nitride, indium antimonide nitride, aluminum indium phosphide, aluminum indium arsenide, aluminum indium antimonide, aluminum indium nitride, aluminum arsenide nitride, gallium aluminum phosphide arsenide, gallium aluminum phosphide antimonide, gallium indium phosphide arsenide, gallium indium aluminum arsenide, gallium aluminum phosphide nitride, gallium aluminum arsenide nitride, gallium aluminum antimonide nitride, gallium indium phosphide nitride, gallium indium arsenide nitride, gallium indium aluminum nitride, gallium antimonide phosphide nitride, gallium arsenide phosphide nitride, gallium arsenide antimonide nitride, gallium indium phosphide antimonide, gallium indium antimonide nitride, gallium phosphide antimonide nitride, indium aluminum phosphide arsenide, indium aluminum phosphide nitride, indium phosphide arsenide nitride, indium aluminum antimonide nitride, indium phosphide antimonide nitride, indium arsenide antimonide nitride, or indium aluminum phosphide antimonide.

5. The quantum dot composition as claimed in claim 2, wherein the non-modified group IV-VI compound is tin oxide, tin sulfide, tin selenide, tin telluride, lead sulfide, lead selenide, lead telluride, germanium oxide, germanium sulfide, germanium selenide, germanium telluride, tin selenium sulfide, tin selenium telluride, tin sulfide telluride, lead selenium sulfide, lead selenium telluride, lead sulfide telluride, tin lead sulfide, tin lead selenide, tin lead telluride, tin oxide sulfide, tin oxide selenide, tin oxide telluride, germanium oxide sulfide, germanium oxide selenide, germanium oxide telluride, tin lead sulfide selenide, tin lead selenium telluride, or tin lead sulfide telluride.

6. The quantum dot composition as claimed in claim 1, wherein the crosslinked-monomer is aliphatic compound with at least one $C_{2-8}$ alkenyl group, aliphatic compound with at least one of acrylate group, aliphatic compound with at least one of methacrylate group, aromatic compound with at least one $C_{2-8}$ alkenyl group, aromatic compound with at least one of acrylate group, or aromatic compound with at least one of methacrylate group.

7. The quantum dot composition as claimed in claim 1, wherein the crosslinked-monomer is diphenylfluorene compound with at least one $C_{2-8}$ alkenyl group, diphenylfluorene compound with at least one of acrylate group, or diphenylfluorene compound with at least one of methacrylate group.

8. A light-emitting device, comprising:

a pair of electrodes; and a light-emitting element, disposed between the electrodes, wherein the light-emitting element comprises a layer prepared from the quantum dot composition as claimed in claim 1.

9. The quantum dot composition as claimed in claim 1, wherein the first repeating unit is

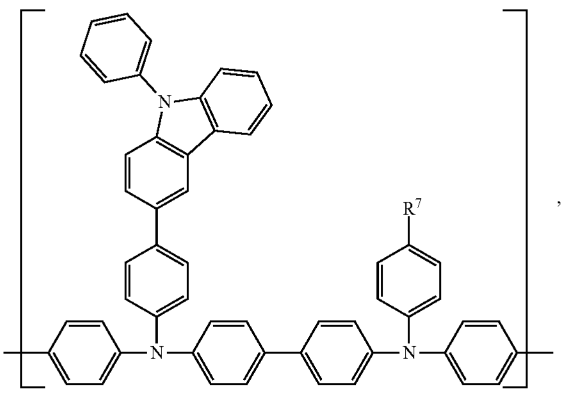

,

-continued

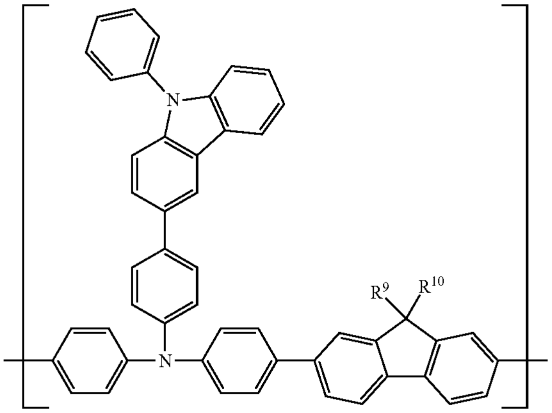

,

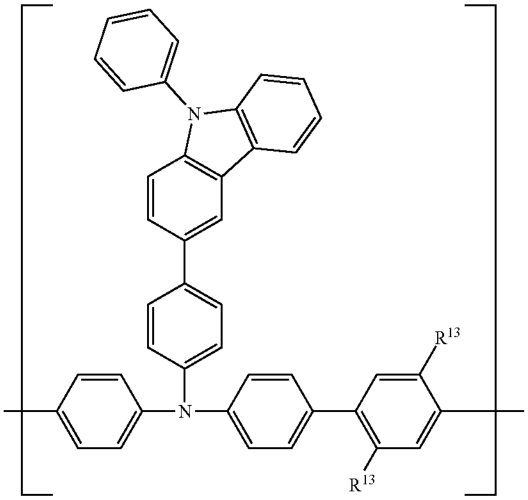

,

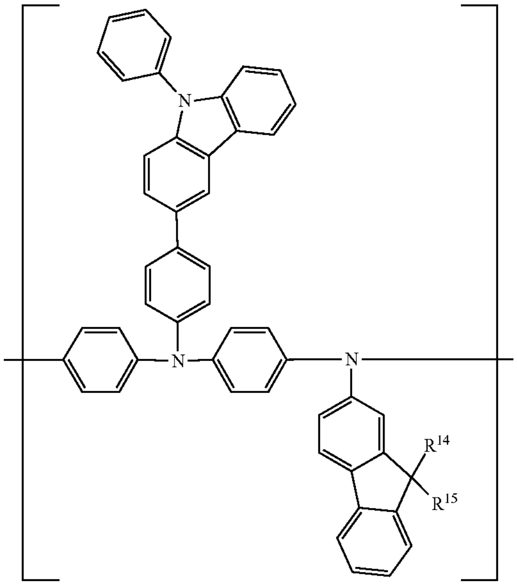

, or

-continued

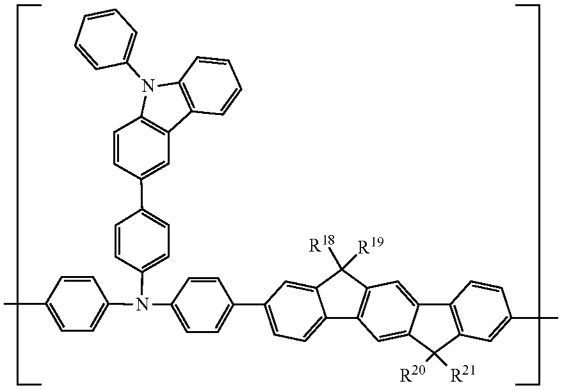

;

$R^7$ is

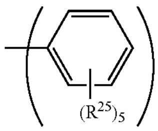

or $C_{2-10}$ alkenyl group, wherein $R^{25}$ is independently hydrogen, $C_{3-10}$ alkyl group, or $C_{2-10}$ alkenyl group, and at least one of $R^{25}$ is $C_{2-10}$ alkenyl group; $R^9$ and $R^{10}$ are independently $C_{2-10}$ alkenyl group; $R^{13}$ is independently $C_{2-10}$ alkenyl group; $R^{14}$ and $R^{15}$ are independently $C_{2-10}$ alkenyl group; and $R^{18}$, $R^{19}$, $R^{20}$ and $R^{21}$ are independently $C_{2-10}$ alkenyl group.

10. The quantum dot composition as claimed in claim 1, wherein the first repeating unit is

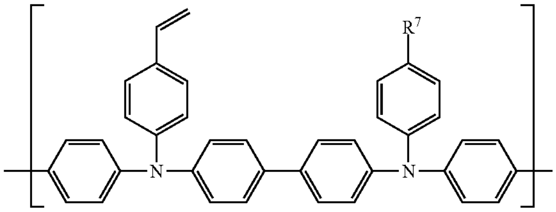

,

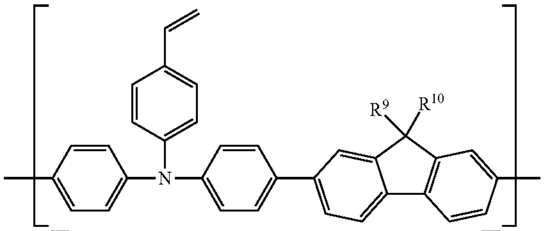

,

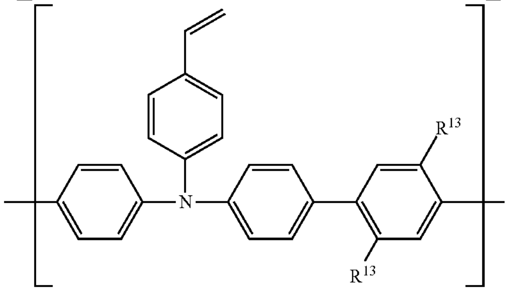

,

-continued

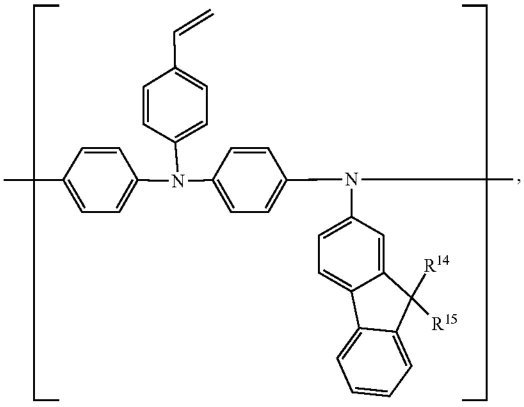

, or

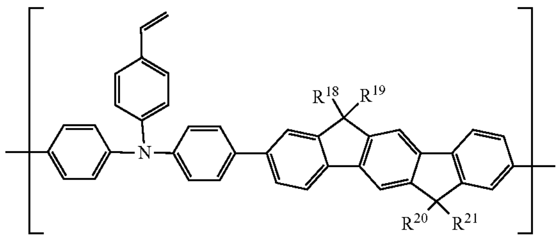

, wherein $R^7$ is

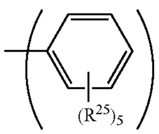

or $C_{2-10}$ alkenyl group, wherein $R^{25}$ is independently hydrogen, $C_{3-10}$ alkyl group, or $C_{2-10}$ alkenyl group, and at least one of $R^{25}$ is $C_{2-10}$ alkenyl group; $R^9$ and $R^{10}$ are independently $C_{2-10}$ alkenyl group; $R^{13}$ is independently $C_{2-10}$ alkenyl group; $R^{14}$ and $R^{15}$ are independently $C_{2-10}$ alkenyl group; and $R^{18}$, $R^{19}$, $R^{20}$ and $R^{21}$ are independently $C_{2-10}$ alkenyl group.

11. The quantum dot composition as claimed in claim 1, wherein the first repeating unit is

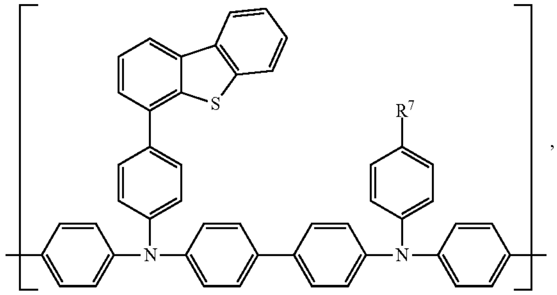

,

-continued

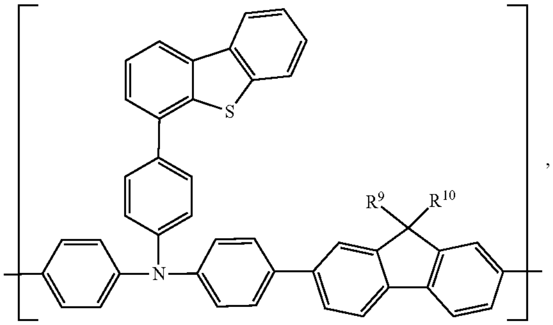

,

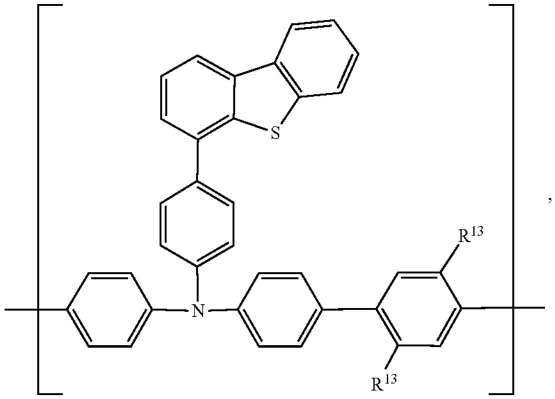

,

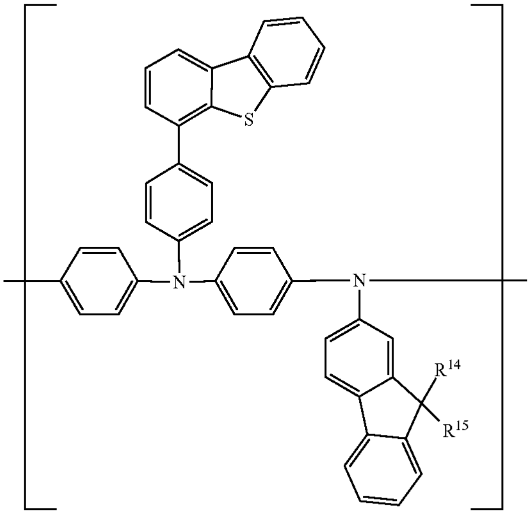

, or

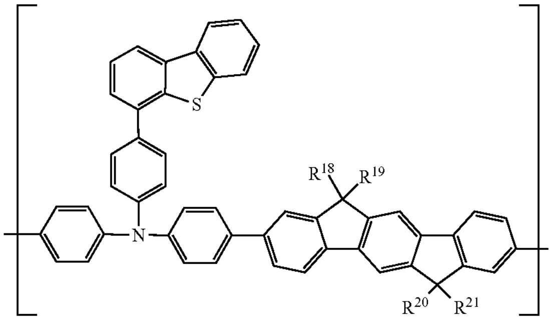

, wherein $R^7$ is

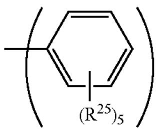

or $C_{2-10}$ alkenyl group, wherein $R^{25}$ is independently hydrogen, $C_{3-10}$ alkyl group, or $C_{2-10}$ alkenyl group, and at least one of $R^{25}$ is $C_{2-10}$ alkenyl group; $R^9$ and $R^{10}$ are independently $C_{2-10}$ alkenyl group; $R^{13}$ is independently $C_{2-10}$ alkenyl group; $R^{14}$ and $R^{15}$ are independently $C_{2-10}$ alkenyl group; and $R^{18}$, $R^{19}$, $R^{20}$ and $R^{21}$ are independently $C_{2-10}$ alkenyl group.

12. The quantum dot composition as claimed in claim 1, wherein the polymer further comprises a second repeating unit, wherein the second repeating unit has a structure represented by Formula (II):

Formula (II)

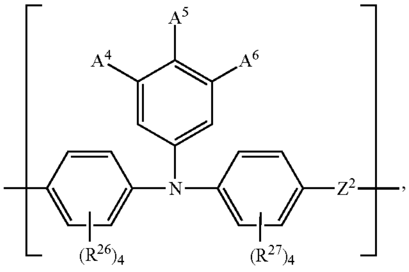

wherein $A^4$ and $A^6$ are hydrogen; $A^5$ is vinyl,

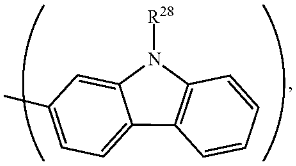

,

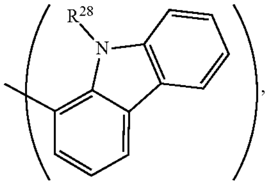

,

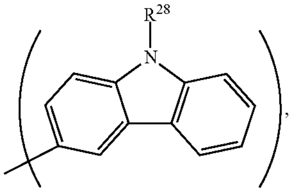

,

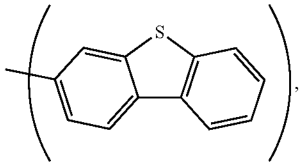

, or

-continued

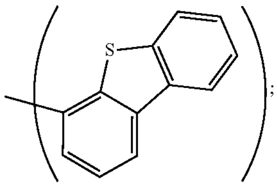

;

or; $R^{26}$ and $R^{27}$ are independently hydrogen, halogen, or $C_{1-2}$ alkyl group; $R^3$ is hydrogen, phenyl group, biphenyl group, or naphthyl group; $Z^2$ is

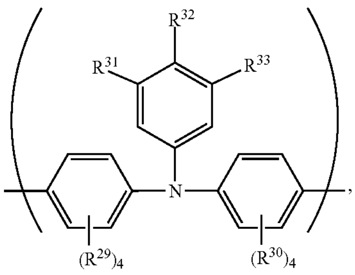

,

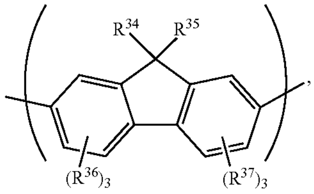

,

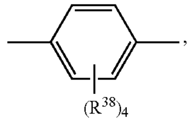

,

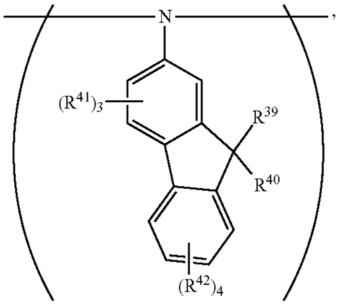

, or

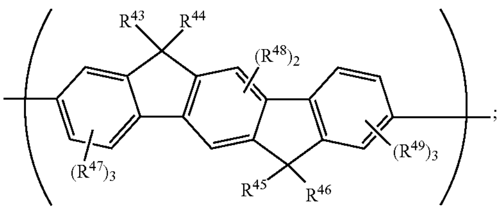

;

$R^{29}$, $R^{30}$, $R^{36}$, $R^{37}$, $R^{41}$, $R^{42}$, $R^{47}$, $R^{48}$, and $R^{49}$ are independently hydrogen, halogen, or $C_{1-2}$ alkyl group; $R^{31}$, $R^{32}$, and $R^{33}$ are independently hydrogen,

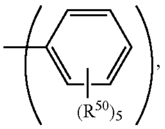
, $C_{3-10}$ alkyl group, or $C_{2-10}$ alkenyl group, and at least one of $R^{31}$, $R^{32}$, and $R^{33}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen; and $R^{50}$ is independently hydrogen, $C_{3-10}$ alkyl group, or $C_{2-10}$ alkenyl group, and at least one of $R^{50}$ is not hydrogen, wherein the first repeating unit is different from the second repeating unit.

13. The quantum dot composition as claimed in claim 12, wherein the number ratio of the first repeating unit to the second repeating unit is from 1:99 to 99:1.

14. The quantum dot composition as claimed in claim 1, wherein the second repeating unit is

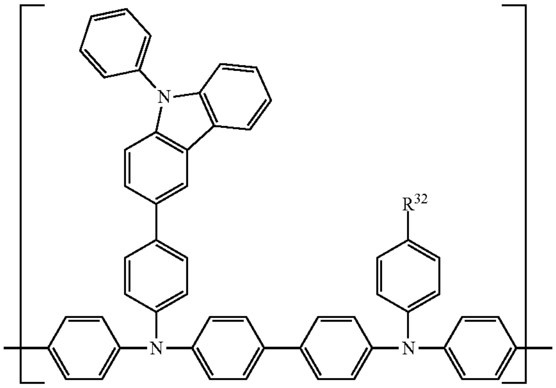
,

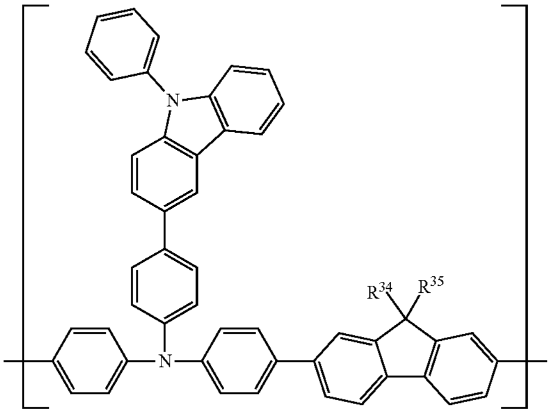
,

-continued

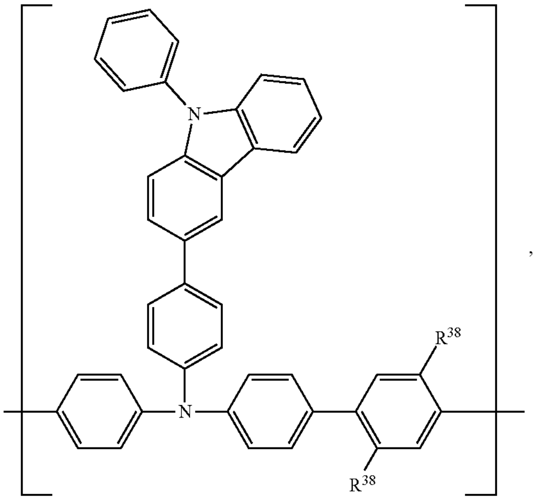
,

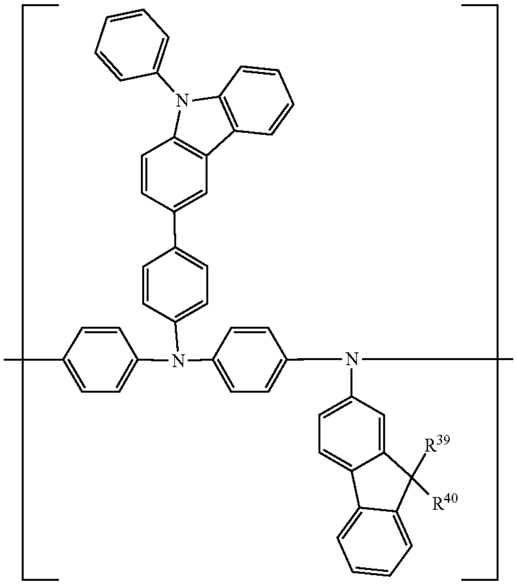
, or

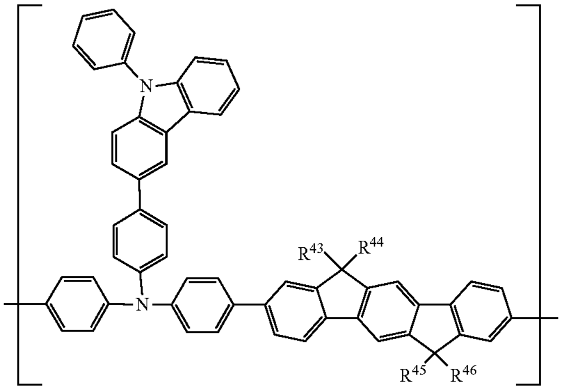
, wherein $R^{32}$ is hydrogen,

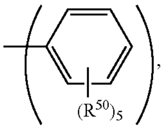

, $C_{3-10}$ alkyl group, or $C_{2-10}$ alkenyl group, wherein $R^{50}$ is independently hydrogen, $C_{3-10}$ alkyl group, or $C_{2-10}$ alkenyl group, and at least one of $R^{50}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen.

15. The quantum dot composition as claimed in claim 12, wherein the second repeating unit is

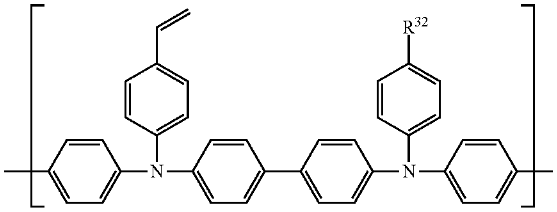

,

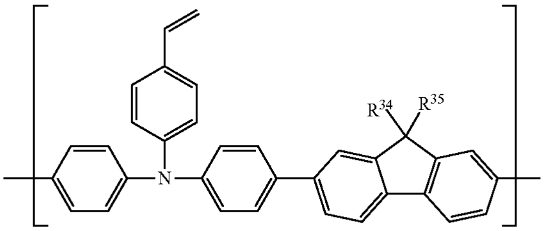

,

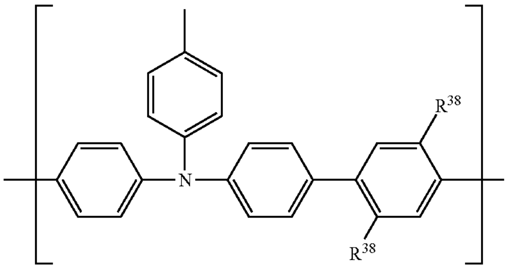

,

-continued

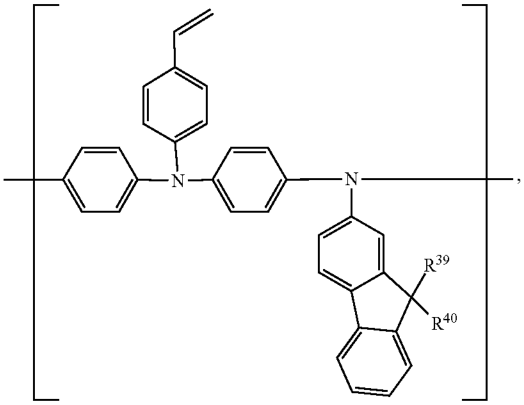

, or

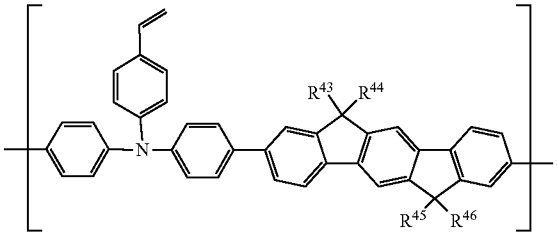

, wherein $R^{32}$ is hydrogen,

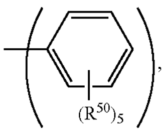

, $C_{3-10}$ alkyl group, or $C_{2-10}$ alkenyl group, wherein $R^{50}$ is independently hydrogen, $C_{3-10}$ alkyl group, or $C_{2-10}$ alkenyl group, and at least one of $R^{50}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen.

16. The quantum dot composition as claimed in claim 12, wherein the second repeating unit is,

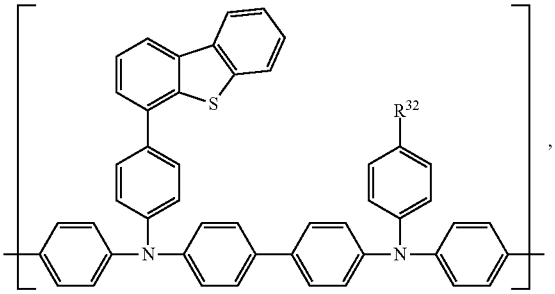

,

-continued

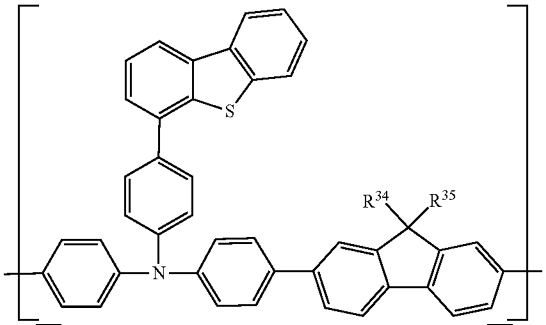

,

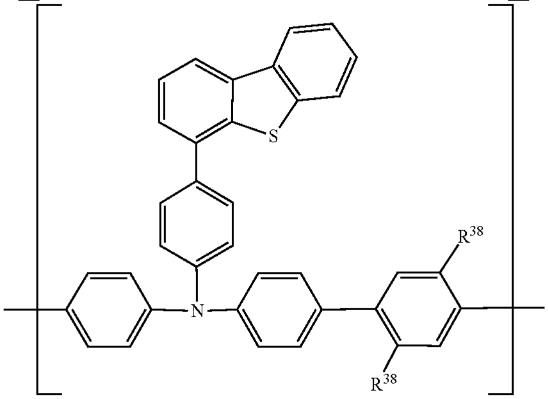

,

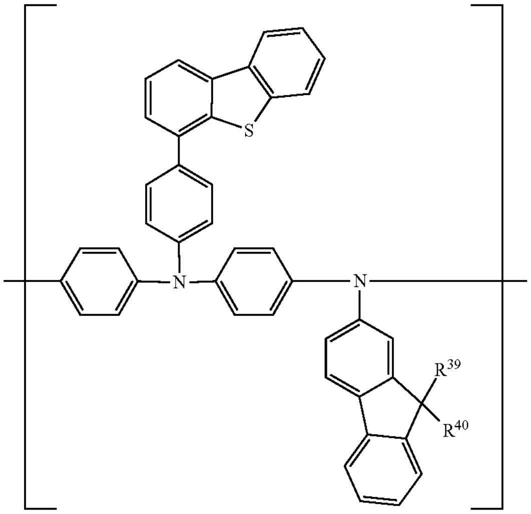

, or

-continued

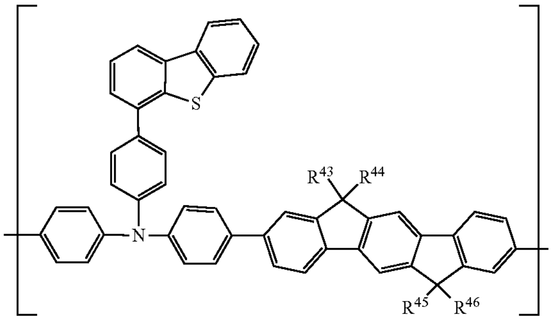

, wherein $R^{32}$ is hydrogen,

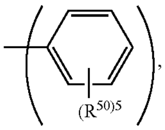

, $C_{3-10}$ alkyl group, or $C_{2-10}$ alkenyl group, wherein $R^{50}$ is independently hydrogen, $C_{3-10}$ alkyl group, or $C_{2-10}$ alkenyl group, and at least one of $R^{50}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ is independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$, and $R^{46}$ are independently hydrogen, $C_{3-10}$ alkyl group, or $C_{2-10}$ alkenyl group, and at least one of $R^{43}$, $R^{44}$, $R^{45}$, and $R^{46}$ is not hydrogen.

* * * * *